United States Patent [19]

Kato et al.

[11] Patent Number: 5,519,654

[45] Date of Patent: May 21, 1996

[54] SEMICONDUCTOR MEMORY DEVICE WITH EXTERNAL CAPACITOR TO CHARGE PUMP IN AN EEPROM CIRCUIT

[75] Inventors: Hideo Kato, Kawasaki; Masamichi Asano, Tokyo; Shinji Saito, Yokohama; Shigeru Matsuda, Ichikawa, all of Japan

[73] Assignee: Kabushiki Kaisha Toshiba, Kawasaki, Japan

[21] Appl. No.: 450,135

[22] Filed: May 25, 1995

Related U.S. Application Data

[63] Continuation of Ser. No. 30,154, Mar. 17, 1993, abandoned.

[30] Foreign Application Priority Data

Sep. 17, 1990 [JP] Japan ................................. 2-246441
Sep. 17, 1990 [JP] Japan ................................. 2-246442

[51] Int. Cl.⁶ ......................................................... G11C 16/06
[52] U.S. Cl. ................................ 365/185.23; 365/185.21; 365/185.14; 365/185.06; 365/185.11; 365/149; 365/189.05; 365/189.09; 365/194; 365/226; 365/228; 365/236; 327/532; 327/534; 327/536
[58] Field of Search .......................... 365/185, 189.09, 365/236, 194, 226, 228, 189.05, 149, 185.06, 185.11, 185.14, 185.21, 185.23; 307/296.2, 296.8; 327/532, 534, 536

[56] References Cited

U.S. PATENT DOCUMENTS

| | | | |
|---|---|---|---|
| 4,388,537 | 6/1983 | Kanuma | 307/296.2 |
| 4,404,475 | 9/1983 | Drori et al. | 307/296.2 |
| 4,572,972 | 2/1986 | Shoji | 307/296.8 |
| 4,667,312 | 5/1987 | Doung et al. | 365/185 |
| 4,794,564 | 12/1988 | Watanabe | 365/185 |
| 4,949,308 | 8/1990 | Araki et al. | 365/194 |
| 5,036,229 | 7/1991 | Tran | 307/296.2 |
| 5,119,330 | 6/1992 | Tanagawa | 365/185 |
| 5,136,541 | 8/1992 | Arakawa | 365/189.09 |
| 5,153,854 | 10/1992 | Herold | 365/185 |
| 5,189,641 | 2/1993 | Arakawa | 365/228 |

FOREIGN PATENT DOCUMENTS

| | | |
|---|---|---|
| 55-80343 | 6/1980 | Japan . |
| 58-94196 | 6/1983 | Japan . |
| 60-10497 | 1/1985 | Japan . |
| 60-27158 | 2/1985 | Japan . |
| 60-113397 | 6/1985 | Japan . |
| 63-229698 | 9/1988 | Japan . |
| 2-9090 | 1/1990 | Japan . |
| 3-105795 | 5/1991 | Japan . |

OTHER PUBLICATIONS

A. Gupta et al., "5-V-only EE-PROM-springboard for autoprogrammable systems", *Electronics*, Feb. 10, 1982.

*Primary Examiner*—Joseph E. Clawson, Jr.
*Attorney, Agent, or Firm*—Foley & Lardner

[57] ABSTRACT

A semiconductor memory device having a memory cell array with a plurality of transistors (memory cells MC) disposed in a matrix form capable of electrically altering data. In writing data to a plurality of memory cells (MC), a write voltage ($V_{pp}'$) is applied to the plurality of memory cells (MC) from a plurality of write circuits (7). The write voltage is generated by boosting an internal voltage ($V_{CC}$) by a charge pump circuit (21). In writing data, one of the following methods is used. The plurality of write circuits (7) are sequentially activated by a write control circuit (20) at intervals of delayed timings. The operating point of each memory cell (transistor)(MC) is controlled by operating point control means so as to reduce a current. A capacitor is connected to the output side of the charge pump circuit, and a boosted write voltage is supplied via the capacitor to the write circuit.

48 Claims, 35 Drawing Sheets

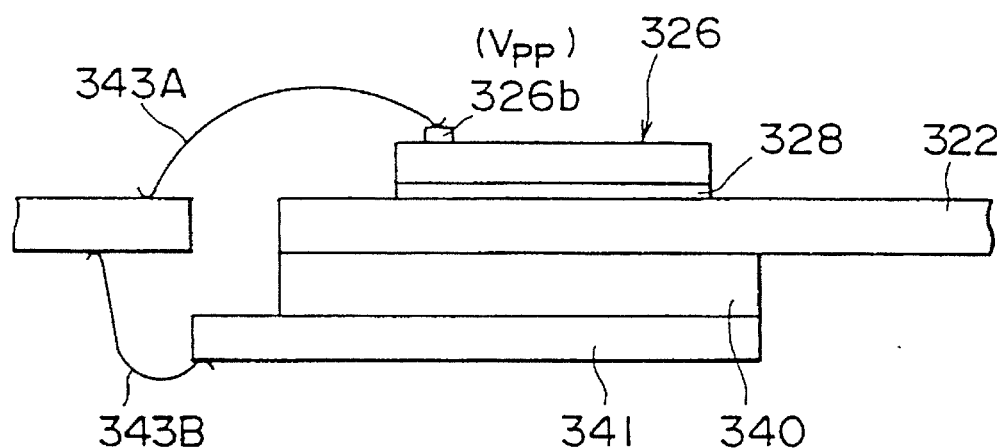
F I G. 25A
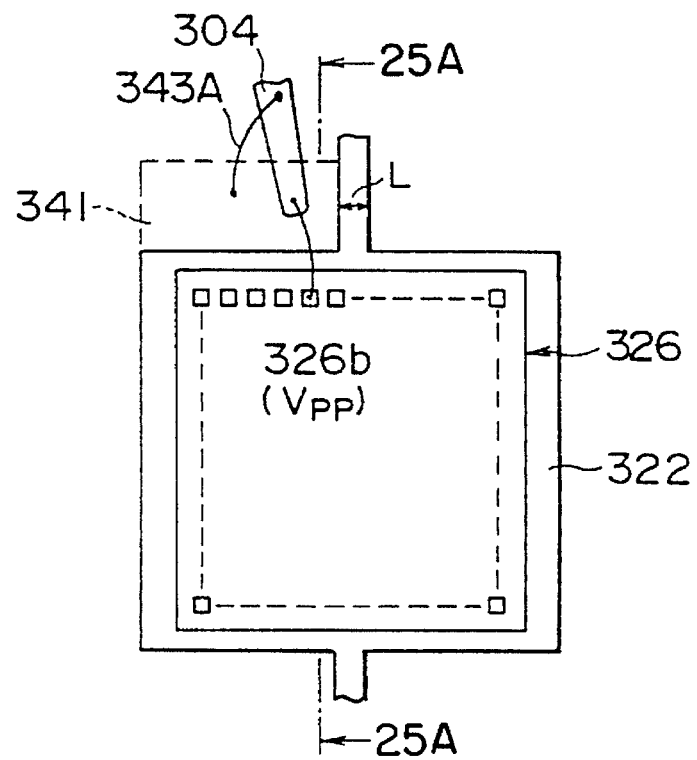
F I G. 25B

SEMICONDUCTOR MEMORY DEVICE WITH EXTERNAL CAPACITOR TO CHARGE PUMP IN AN EEPROM CIRCUIT

This application is a continuation of application Ser. No. 08/030,154, filed Mar. 17, 1993, now abandoned which is the national phase of PCT/JP91/01233, filed Sep. 17, 1991.

TECHNICAL FIELD OF THE INVENTION

The present invention relates to a semiconductor memory device using electrically erasable non-volatile transistors, and more particularly to a semiconductor memory device suitable for use as semiconductor memory devices capable of operating with a single $V_{cc}$ power source without using an external high voltage power source for data write and erase.

BACKGROUND OF THE INVENTION

A ROM whose storage contents can be electrically erased and altered is known as an electrically erasable programmable ROM (EEPROM). In erasing the storage contents of an EEPRPOM, an ultraviolet ray is not necessary, and this feature is different from an EPROM. Therefore, erasing and altering data can be electrically carried out even if an EEPROM is mounted on a board of a configured system.

From this reason and from the viewpoint of easy-to-use, demands for EEPROMs are rapidly increasing for use with various control apparatuses and memory cards.

A conventional semiconductor integrated circuit, such as an 8 bit flash type EEPROM, is constructed as shown in FIG. 45.

Referring to FIG. 45, row address signals $A_o$ to $A_i$ are inputted to a row address buffer circuit 1 and amplified and shaped by the circuit 1. The amplified and shaped row address signals are then inputted to a row decoder circuit 2. Column address signals $B_{i+1}$ to $B_j$ are inputted to a column address buffer circuit 3 and amplified and shaped by the circuit 3. The amplified and shaped column address signals are then inputted to a column decoder circuit 4. The row decoder circuit 2 selects only one word line WL of a memory cell array 5 having a plurality of memory cells MC. The column decoder circuit 4 selectively controls a gate 6A of a column select gate circuit 6 to select only one bit line BL of the memory cell array 5 for each I/O unit, totaling up to 8 bit lines BL. In this manner, one memory cell transistor MC for each I/O unit is selected from the memory cell array 5, totaling up to 8 memory cell transistors MC. Information of these eight selected memory cells MC is detected and amplified by each sense amplifier circuit 7. Eight outputs from eight sense amplifier circuits 7 are read via each output buffer circuit 8 at the same time, and outputted to an external circuit.

In the EEPROM shown in FIG. 45, the memory cell array 5 is constructed of eight memory cell array units (MCAU) 5A. For the purpose of simplicity, each unit 5A is shown as having four word lines WL, four bit lines BL, sixteen memory cells MC, and four reference memory cells RMC. In correspondence with the four bit lines BL, four gates 6A are shown in each column select gate circuit 6. One of the gates 6A is turned on by the column decoder circuit 4. The reference memory cell RMC is connected to the sense amplifier (SA) 7 via a reference bit line RBL having a reference gate RBT thereon.

In the EEPROM constructed as above, during each operation cycle, an NCE signal supplied to a write control circuit 10 becomes "O", and during a read cycle an NOE signal becomes "O".

Specifically, in writing 8-bit data in the EEPROM structured as above, each of eight data including "1" and "O" is supplied to an I/O unit for each of eight memory cells via a write data input pad (not shown) commonly used as an output buffer pad. In accordance with the supplied data, the write circuit 10 sets the potential of each bit line BL. Namely, the write circuit 10 applies a high potential for the data "O" and a low potential for the data "1" to the bit line BL selected by the input address signals. At this time, the word line WL selected by the input address signals is set to a high potential.

Namely, in writing the data "O", the selected word line WL and bit line BL are set to the high potential. As a result, hot electrons generated near at the drain D of a memory cell MC are injected to the floating gate FG of the memory cell MC, so that the threshold voltage of the memory cell MC shifts toward the positive side and the data "O" is memorized.

On the other hand, in writing the data "1", the bit line BL is set to the low potential. Therefore, hot electrons will not be injected to the floating gate FG and the threshold voltage of the memory cell MC will not shift, so that the data "1" is memorized.

In erasing data, an output from an erase control circuit 11 causes the erase gate EG to have a high voltage so that electrons injected in the floating gate FG are emitted out to the erase gate EG through the tunneling effect.

FIGS. 46 to 49 show a typical memory cell of such an EEPROM. FIG. 46 is a plan view showing the pattern of a memory cell, FIG. 47 is a cross sectional view taken along line 47–47 of FIG. 46, FIG. 48 is a cross sectional view taken along line 48–48 of FIG. 46, and FIG. 49 is an equivalent circuit. In FIGS. 46 to 49, reference numeral 31 represents a floating gate electrode of a first polysilicon layer, reference numeral 32 represents an erase gate electrode of a second polysilicon layer, and reference numeral 33 represents a control gate electrode of a third polysilicon layer, serving also as a word line. Reference numerals 34 and 35 represent a drain and source of an N-type diffusion region, respectively. Reference numeral 36 represent a bit line of an aluminum layer, reference numeral 37 represents a contact hole for connecting together the drain 34 and bit line 36, and reference numeral 38 represents a gate insulating film for a floating gate transistor area. Reference numeral 39 represents an erase gate insulating film formed between the floating gate electrode 31 and erase gate electrode 32, and reference numeral 40 represents an insulating film of an O—N—O structure (three layer structure of oxide film—nitride film—oxide film) formed between the floating gate electrode 31 and control gate electrode 33. Reference numeral 41 represents an insulating film of the O—N—O structure formed between the erase gate electrode 32 and control gate electrode 33, reference numeral 42 represents a gate insulating film of selecting transistor portion with the third polysilicon layer as the gate electrode, reference numeral 43 represents a field insulating film, and reference numeral 44 represents an interlayer insulating film.

The equivalent circuit of the memory cell having the structure described above is shown in FIG. 49. In FIG. 49, S represents a source, D represents a drain, FG represents a floating gate, CG represents a control gate, and EG represents an erase gate. The potential at nodes of the memory cell in various modes are tabulated in Table 1, showing the control gate potential $V_{CG}$, drain potential $V_D$, source potential $V_S$ erase gate potential $V_{EG}$, and the state of the floating gate.

TABLE 1

| | C.G. | E.G. | D | S | State of F.G. |
|---|---|---|---|---|---|
| Erase | 0V | High Potential | 0V | 0V | Electron Emission |
| Write "0" | High Potential | 5V | High Potential | 0V | Electron Injection |
| Write "1" | High Potential | 5V | Low Potential | 0V | Electron Injection |
| Read | 5V | 0V | 1V | 0V | |

Table 1 shows the biasing state at each node of the memory cell equivalent circuit.

As seen from Table 1, in erasing data of a memory cell MC, the control gate CG, drain D, and source S are set to 0 V, and the erase gate EC is set to a high potential (e.g., 12 V). In this state, electrons are emitted from the floating gate FG to the erase gate through the Fowler-Nordheim tunneling effect. In this case, current is hardly consumed.

In writing data to a memory cell MC, the control gate CG is set to a high potential, the erase gate EG is set to 5 V, and the source S is set to 0 V. Depending upon the data to be written to the memory cell MC, the drain D is set to a high potential or low potential.

In reading data from a memory cell MC, the control gate CG is set to 5 V, the erase gate EG is set to 0 V, the source S is set to 0 V, and the drain D is set to about 1 V. In this state, whether the memory cell MC turns on, i.e., whether current is caused to flow, is detected by the sense amplifier 7, and the data in the memory cell MC is read from the output butter 8.

In the following the read cycle which consumes current will be mainly discussed. First, the operation of writing the data "O" to a memory cell will be detailed.

FIG. 50 is a circuit diagram showing part of the write control circuit 10, and the column gate transistor 6 and memory cell MC shown in FIG. 45, to explain the write operation. FIG. 51 is a graph showing the relationship between a current $I_{pp}$ flowing through a memory cell MC and the drain voltage $V_{DD}$ during the write operation. LT used in FIG. 50 represents a write load transistor of the write circuit 10. The write load transistor LT and column select transistor 6A function as a resistor R which controls the write operating point during the write operation. Specifically, as shown in FIG. 51, the write operation runs on one of cross points OP1 and OP2 between the cell characteristic curve CC and the load characteristic curve LC of the resistor R.

For example, the total resistance of the write load transistor LT and column gate transistor 6A is set to 2.5 kilo-ohms. However, the resistance of the column gate transistor 6A is generally set to a small value in order to read data at a high speed. Therefore, the resistor R is mainly determined by the write load transistor LT.

If the gate voltages of the write load transistor LT and column gate transistor 6A are raised higher than an external write power source voltage $V_{pp}$ (=12.5 V), this voltage $V_{pp}$ is directly applied to the drain of the memory cell MC. The load characteristic curve in this state is LC1. At the operating point OP1 intersecting the cell characteristic curve CC and the load characteristic curve LC1, the write current $I_{pp}$ becomes 1.2 mA as shown in FIG. 51. If the data "O" is written in 8-bit memory cells at the same time, a write current 1.2 mA×8 bits=9.6 mA will flow. This write current is supplied from the external write power source $V_{pp}$ connected to the drain of the write load transistor LT.

Instead of raising the potential at the gates of the column gate transistor 6A and write load transistor LT higher than the write power source voltage $V_{pp}$, the potential $V_{pp}$ itself may be applied to the gates. In this case, the drain voltage of the memory cell MC drops from $V_{pp}$ by the amount corresponding to the threshold value of the write load transistor LT. The load characteristic curve in this state is LC2. At the operating point OP2, a write current of 0.5 mA will flow.

As described above, a write current during the write operation can be changed by changing the operating point during the write operation.

Demands for a memory LS1 having the above-described memory cell structure are now increasing because it is easy to use. However, the system using such a memory requires not only the power sources $V_{CC}$ and $V_{SS}$ but also the write power source $V_{pp}$, resulting in a complicated structure of the system.

Apart from the above, a system using batteries is known, and demands for an EEPROM operating with two power sources $V_{CC}$ and $V_{SS}$ are increasing.

FIG. 52 shows the structure of an EEPROM, or so-called flash type EEPROM using memory cells shown in FIGS. 46 to 49. In this example, this EEPROM has a one-byte structure outputting 8 bits. Memory cells 430 are disposed in a m-row, n-column matrix form. The sources of all memory cells are connected in common to a terminal SS. The control gates of a plurality of memory cells are connected to row lines WL1 to WLm which are in turn connected to a row decoder 431. The drains of a plurality of memory cells are connected to column lines DL1 to DLn which are in turn connected to common connection nodes N-1 to N-8 via column select transistors 433-1 to 433-n of an enhancement type whose gates are connected to column select lines CL1 to CLn connected to a column decoder 432. Connected between the common connection nodes N-1 to N-8 and an external high voltage power source terminal $V_{pp}$ to which a high voltage is applied during the write and erase operations, are write enhancement type load transistors 434-1 to 434-8 to the gates of which outputs NDin*1 to NDin*8 of write data control circuits 435-1 to 435-8 are supplied. The write data control circuits 435-1 to 435-8 are inputted with write data Din1 to Din8 from external terminals, and connected to the write power source terminals $V_{pp}$.

In order to supply a high voltage during the write operation, a high voltage from the $V_{pp}$ terminal is supplied via a high voltage switching circuit 436 to the row decoder 431 and column decoder 432. The common source SS is connected to the output side of a source voltage control circuit 437 to which a high voltage is supplied via the $V_{pp}$ terminal. Connected to the common connection nodes N-1 to N-8 are sense amplifiers 438-1 to 438-8 having read load transistors. Connected to the output sides of the sense amplifiers 438-1 to 438-8 are output circuit 439-1 to 439-8 which output memory cell data in a output terminals, The operation of the EEPROM shown in FIG. 52 will be described.

In writing data, a voltage 12 V is applied to the external high voltage power source terminal $V_{pp}$. The high voltage 12 V at $V_{pp}$ terminal is supplied to the row decoder 431 and column decoder 432 via the switching circuit 436. The column select line and row select line selected by address signals $A_C$ and $A_R$ cause to select one memory cell for each output bit. Namely, in FIG. 52, eight memory cells are selected at the same time. The selected row line (e.g., WL1) and column select line (e.g., CL1) are applied with 12 V. In this condition, if the write data Din1 to Din8 are "O", about 9 V is applied from the write data control circuits 435-1 to 435-8 as NDin*1 to NDin*8. As a result, the load transistors 434-1 to 434-8 turn on, and about 6 V is applied to the selected column lines DL1 through a path from $V_{pp}$ terminal, to load transistors 434-1 to 434-8 and to column select transistors 433-1 to 433-8. On the other hand, if the write data Din1 to Din8 are "1", O V is applied as NDin*1 to NDin*8. Therefore, the load transistors 434-1 to 434-8 turn off and the drains of the selected memory cells are not applied with a voltage. The write operation is therefore not executed.

Next, in erasing data, about 12 V is applied to the common source SS from $V_{pp}$ terminal via the source voltage control circuit 437. Therefore, all column select lines CL1 to CLn and row lines WL1 to Wlm are set to 0 V, thereby erasing data of all memory cells in a flash manner.

In reading data, the write load transistors 434-1 to 434-8 continue to turn off, the SW outputted from the high voltage switching circuit 436 is used as $V_{CC}$ voltage (5 V). Data ("1" or "O") of memory cells selected by the column decoder and row decoder are sensed and amplifiers by sense amplifiers 438-1 to 438-8 and outputted via output circuits 439-1 to 439-8 from external output terminals.

As described above, an EEPROM can use a small size memory cell, and is suitable for memories of a large capacity.

Data is written in an EEPROM through impact ionization. Therefore, the drain current of 8 bit memory cells during the write operation becomes about 5 mA. Also during the erase operation, a current 2 to 3 mA flows from the source to the substrate when a high voltage is applied to the source, because the gate insulating film is thin and a leakage current generates between bands at the junction near the source. It is necessary to provide a high voltage power source having a capability of supplying a large current, as the write and erase high voltage power source $V_{pp}$ of an EEPROM. It becomes therefore necessary to provide two power sources $V_{CC}$ (5 V) and $V_{pp}$ (12 V). As shown in FIG. 53, such an EEPROM is provided with a $V_{pp}$ terminal in addition to $V_{cc}$ terminal and $V_{SS}$ terminal, and is not easy to use in system configuration. In FIG. 53, reference numeral 401 represents a package, reference numerals 402, 402, ... represent a lead terminal, reference numerals 402a, 402a represent an exposed pin of each lead terminal 402, 402, reference numeral 403 represents a pad, reference numeral 404 represents a chip, and reference numeral 405 represents a bonding wire.

SUMMARY OF THE INVENTION

The present invention has been made under the above-described circumstances. It is an object of the present invention to provide a non-volatile semiconductor memory capable of providing stable read, write and erase operations and reducing a write current during the write operation, even with a single power source for a write power source.

According to the present invention, in writing data into memory cells, data write is not executed for all bits at the same time, but for a predetermined number of memory cells at each time. For example, data write is executed eight times, one bit at a time, for a memory having eight I/O units, or four times two bits at a time. A write current at each time period therefore becomes small, and a power supplied from an internal power source can be used for the data write. A write voltage is boosted by charge pump units of a charge pump circuit, electric charges generated by the charge pump units being stored in capacitors. The write data is latched for a predetermined period in response to a signal from a write control circuit. A write power source is switched by a switching circuit between an internal power source and external power source.

According to another invention, the operating point of a memory cell is set such that a write current becomes small. Therefore, even if 8 bit data is written at the same time in a memory having eight I/O units for example, a large current will not flow. In writing data, a memory cell, column gate transistor, and write load transistor are connected in series. In such a state, the write current can be suppressed in the following two methods. According to the first method, a voltage to be applied to the gate of a write load transistor is controlled (e.g., lowered by 3 V or more) such that the potential of the operating point of the memory cell is set between the electron injection potential of the floating gate and the breakdown potential. According to the second method, the total resistance of a write transistor and column transistor is made large, and an output of the row decoder is delayed in timing from an output of the column decoder. In writing data into a memory having eight I/O units at the same time, it is arranged to be capable of being switched between the internal power source and external power source.

According to another invention, a charge pump circuit has booster units for boosting an internal power source voltage, and a capacitor for receiving an output from the booster units. Therefore, a boosted voltage can be generated from the capacitor either as a write voltage or an erase voltage. The charge pump circuit thus supplies a write voltage or erase voltage having a sufficient current quantity, providing a stable write or erase operation.

According to the present invention, a charge pump circuit is built in a memory for generating a high voltage from a single power source $V_{CC}$. The charge pump circuit has a capacitor of a relatively high capacitance for storing electric charges outputted from the charge pump circuit. Using the stored electric charges, one of the write and erase operations is executed. It is therefore possible to write or erase data without using a program high voltage source.

BRIEF DESCRIPTION OF THE DRAWINGS

FIGS. 25A and 25B are a cross sectional view and plan view of a still further embodiment of the present invention.

DETAILED DESCRIPTION OF THE EMBODIMENTS

Embodiments of the present invention will be described with reference to the accompanying drawings.

Figure 1:
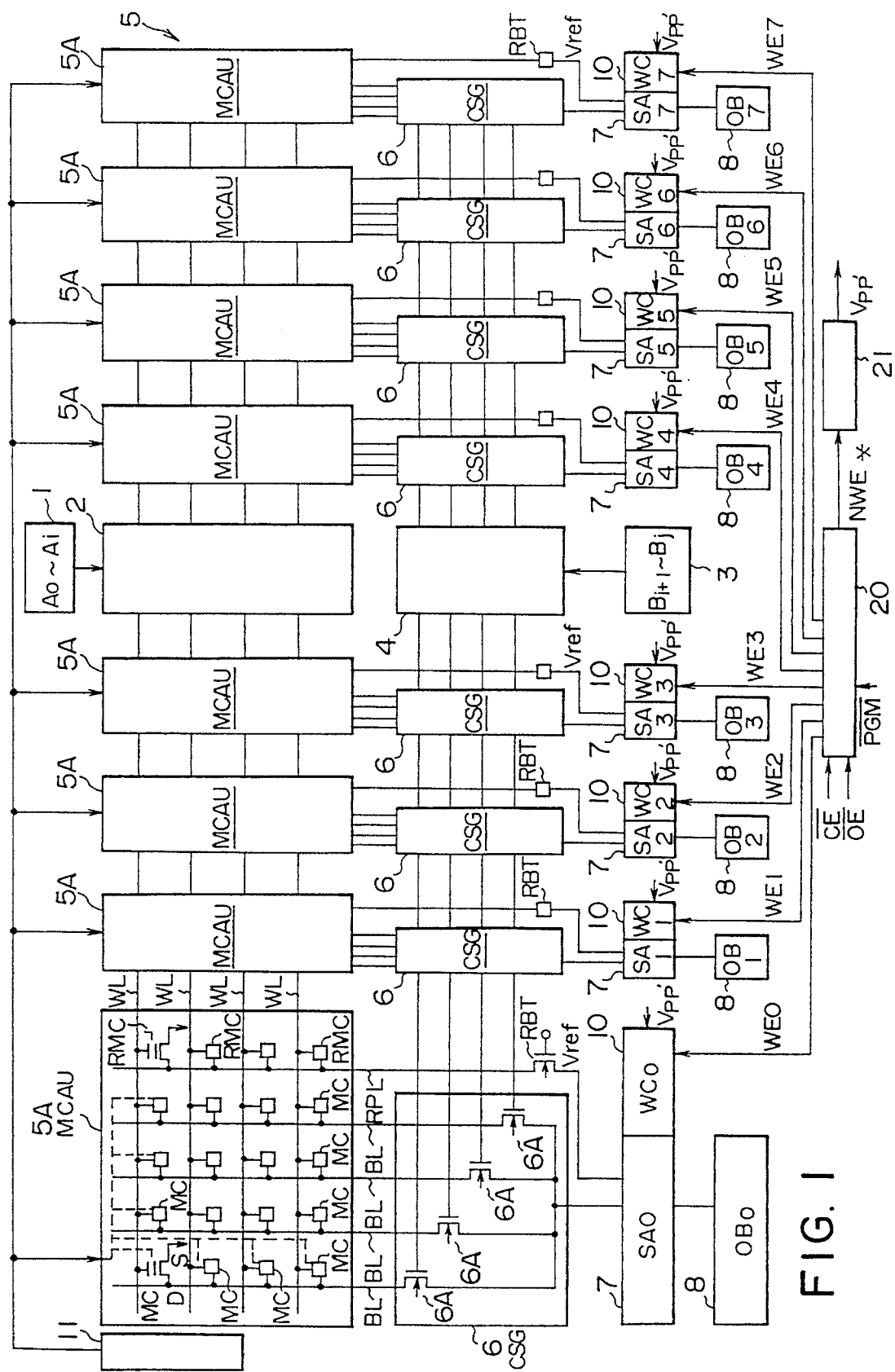
FIG. 1 is a circuit diagram showing the overall structure of an embodiment of the present invention.
Figure 45:
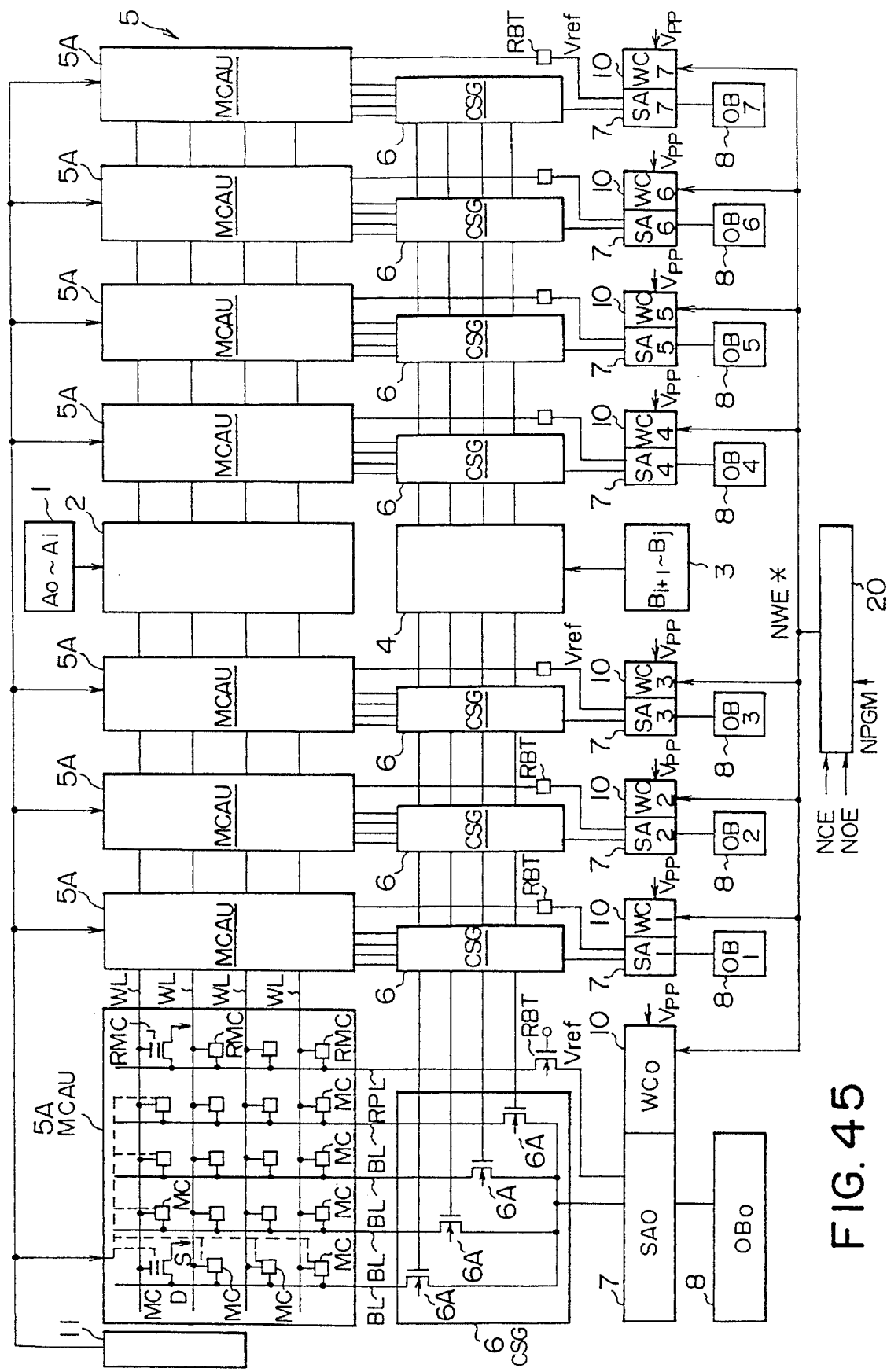
FIG. 45 is a circuit diagram showing a conventional memory.
Figure 46:
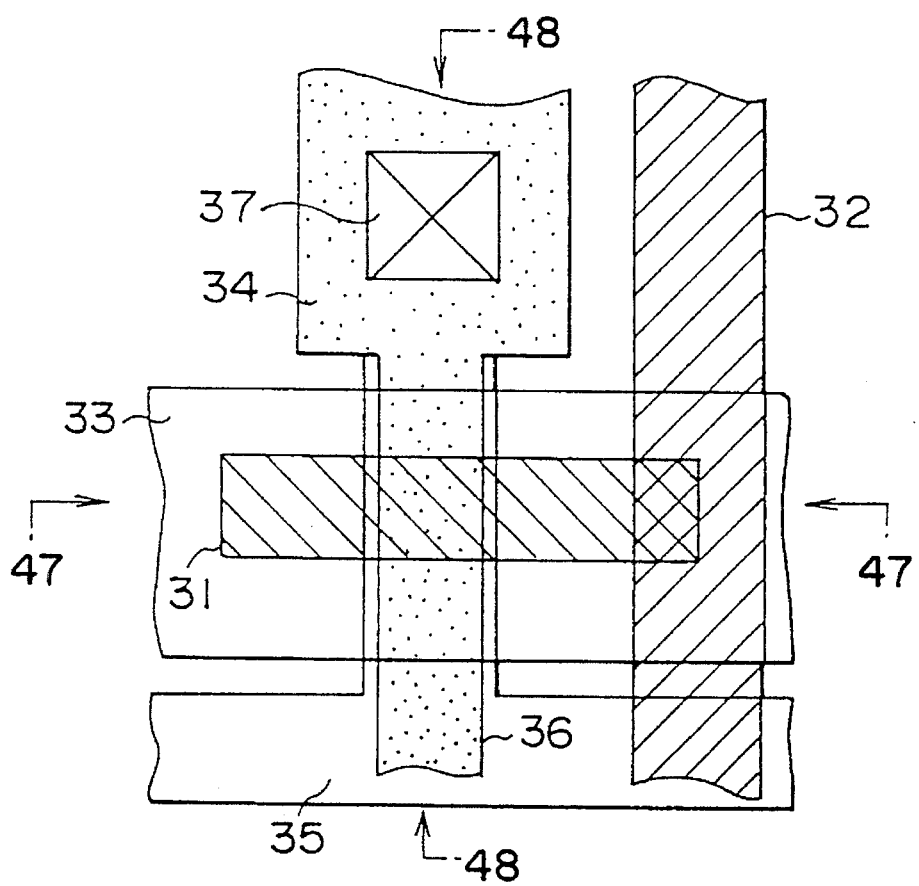
FIG. 46 is a plan view showing the pattern of a conventional memory cell.
Figure 47:
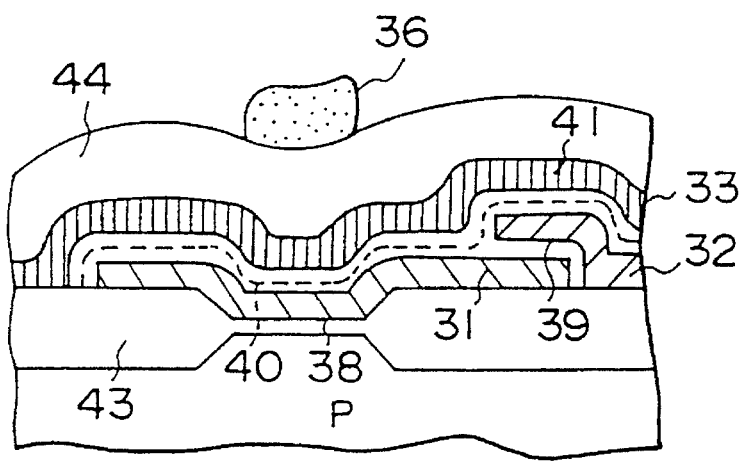
FIG. 47 is a cross sectional view of the conventional memory cell taken along line 47—47.
Figure 48:
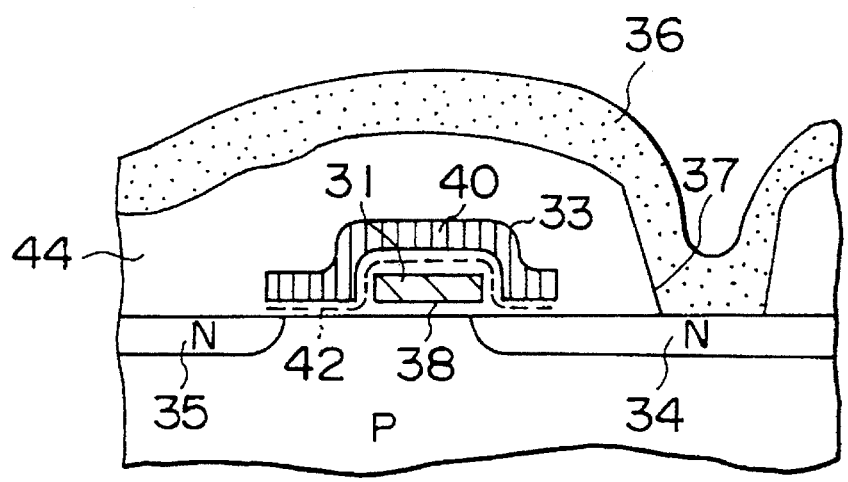
FIG. 48 is a cross sectional view of the conventional memory cell taken along line 48—48.
Figure 49:
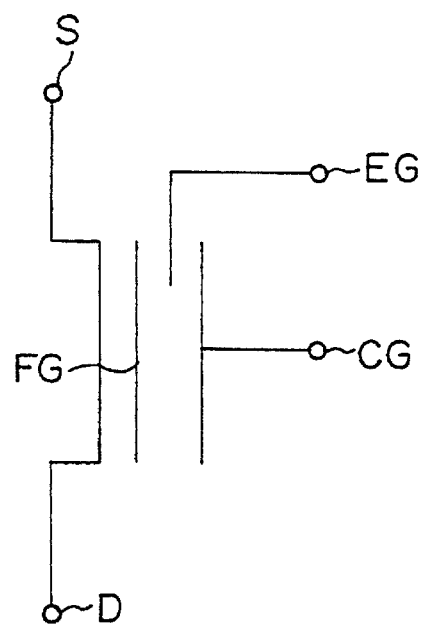
FIG. 49 is an equivalent circuit of the conventional memory cell.
Figure 50:
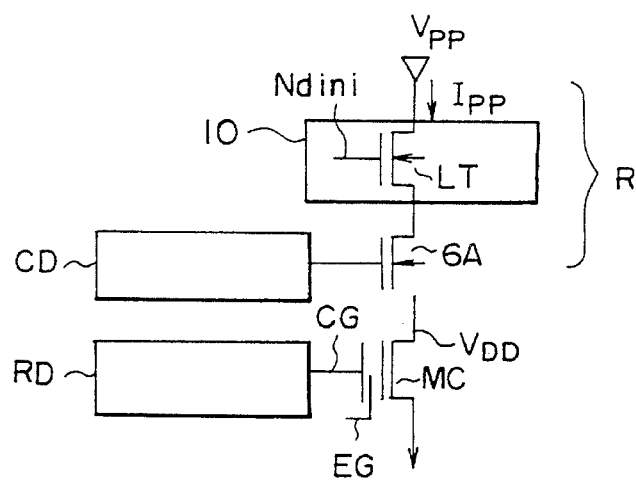
FIG. 50 is a circuit diagram showing the main part of the conventional memory cell.
Figure 51:
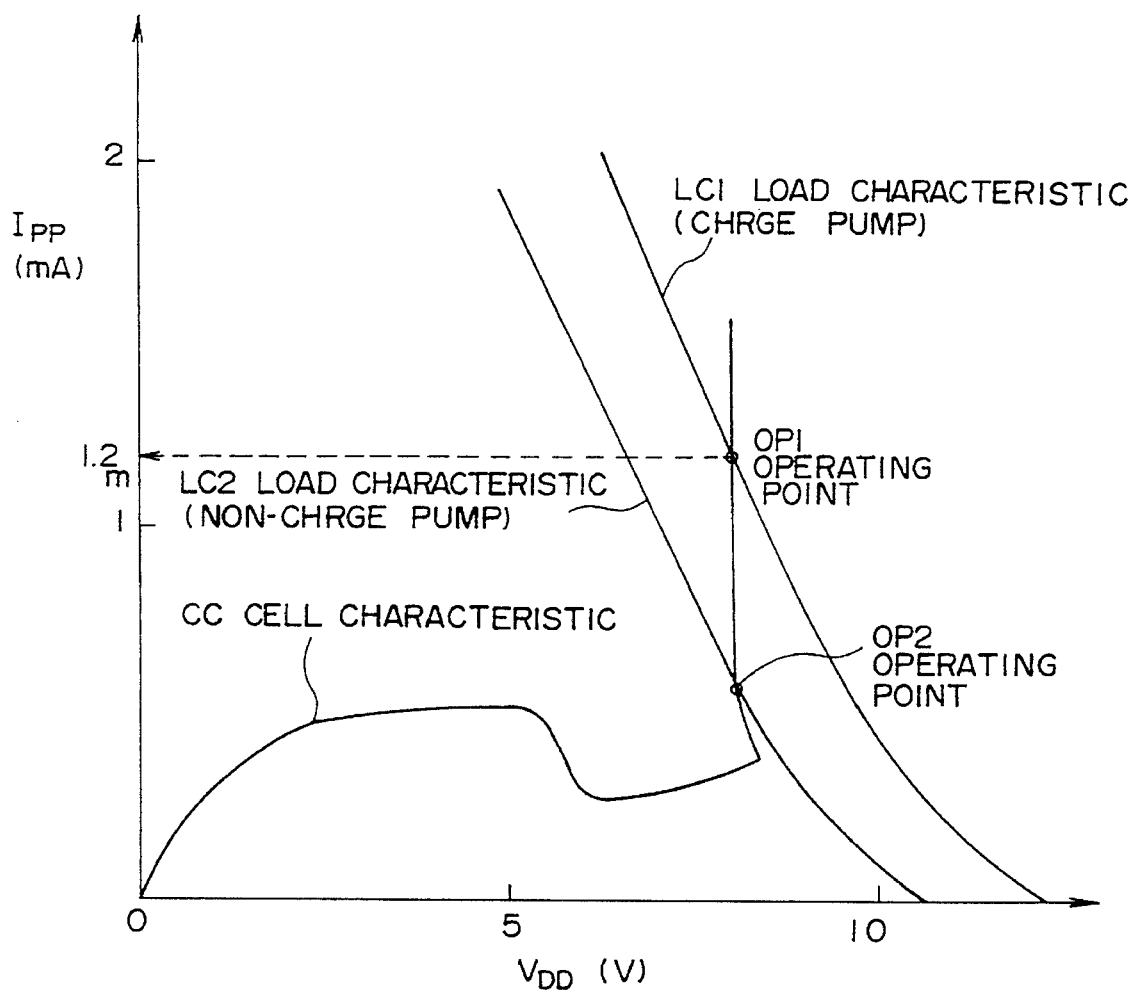
FIG. 51 is a graph showing the operation of the main part of the conventional memory cell.

FIG. 1 shows an example of a non-volatile semiconductor memory according to an embodiment of the present invention. Different points from the conventional non-volatile semiconductor integrated circuit shown in FIG. 45 are as follows. In the circuit shown in FIG. 45, a write power is directly supplied to an external power source provided externally of the chip. In contrast with this, in the circuit shown in FIG. 1, a write power to a write circuit 10 is supplied by boosting a power source voltage $V_{CC}$ by a charge pump circuit 21 formed on the chip. In the circuit shown in FIG. 45, eight bits are sequentially written one bit after another. Namely, in the circuit shown in FIG. 45, control signals WE0 to WE7 are sequentially inputted from a write control circuit 20 to the write circuits 10 in order to sequentially write eight bit data one bit after another.

The structure other than that described above is the same as that shown in FIG. 45. In FIG. 1, like elements to those shown in FIG. 45 are represented by using identical reference numerals.

In the circuit shown in FIG. 1, data is read from each memory cell in substantially the same manner as described with FIG. 45. Specifically, referring to FIG. 1, row address signals $A_o$ to $A_i$ are inputted to a row address buffer circuit 1 and amplified and shaped by the circuit 1. The amplified and shaped row address signals are then inputted to a row decoder circuit 2. Column address signals $B_{i+1}$ to $B_j$ are inputted to a column address buffer circuits 3 and amplified and shaped by the circuit 3. The amplified and shaped column address signals are then inputted to a column decoder circuit 4. The row decoder circuit 2 selects only one word line WL of a memory cell array 5 having a plurality of memory cell MC. The column decoder circuit 4 controls a column select gate circuit 6 to select only one bit line BL of the memory cell array 5 for each I/O unit, totaling up to 8 bit lines BL. In this manner, one memory cell transistor MC for each I/O unit is selected from the memory cell array 5, totaling up to 8 memory cell transistors MC. Information of these eight selected memory cells MC is detected and amplified by each sense amplifier circuit 7. Eight outputs from eight sense amplifier circuits 7 are read via each output buffer circuit 8 at the same time, and outputted to an external circuit.

Data is written in the manner described below. In writing data in a memory cell MC, the write control circuit 20 supplies write control signals WE0 to WE7 to a write circuit 10 of each I/O unit, the write control signals controlling the write circuit 10 independently for each bit. Each write circuit 10 enters a write mode in accordance with external control signals NCE, NOE, and NPGM, and generates a pulse signal in order to write data from each I/O unit one bit after another.

The write control circuit supplies a control signal NWE* to the charge pump circuit 21, to boost the power source $V_{CC}$ to a write power source $V_{pp}'$. It also generates a write end signal (poling) when the write control signal WEi (WE0 to WE7) causes to sequentially generate the pulse signal and it finally causes to generate the pulse signal for the last bit (I/O 7).

Figure 2:
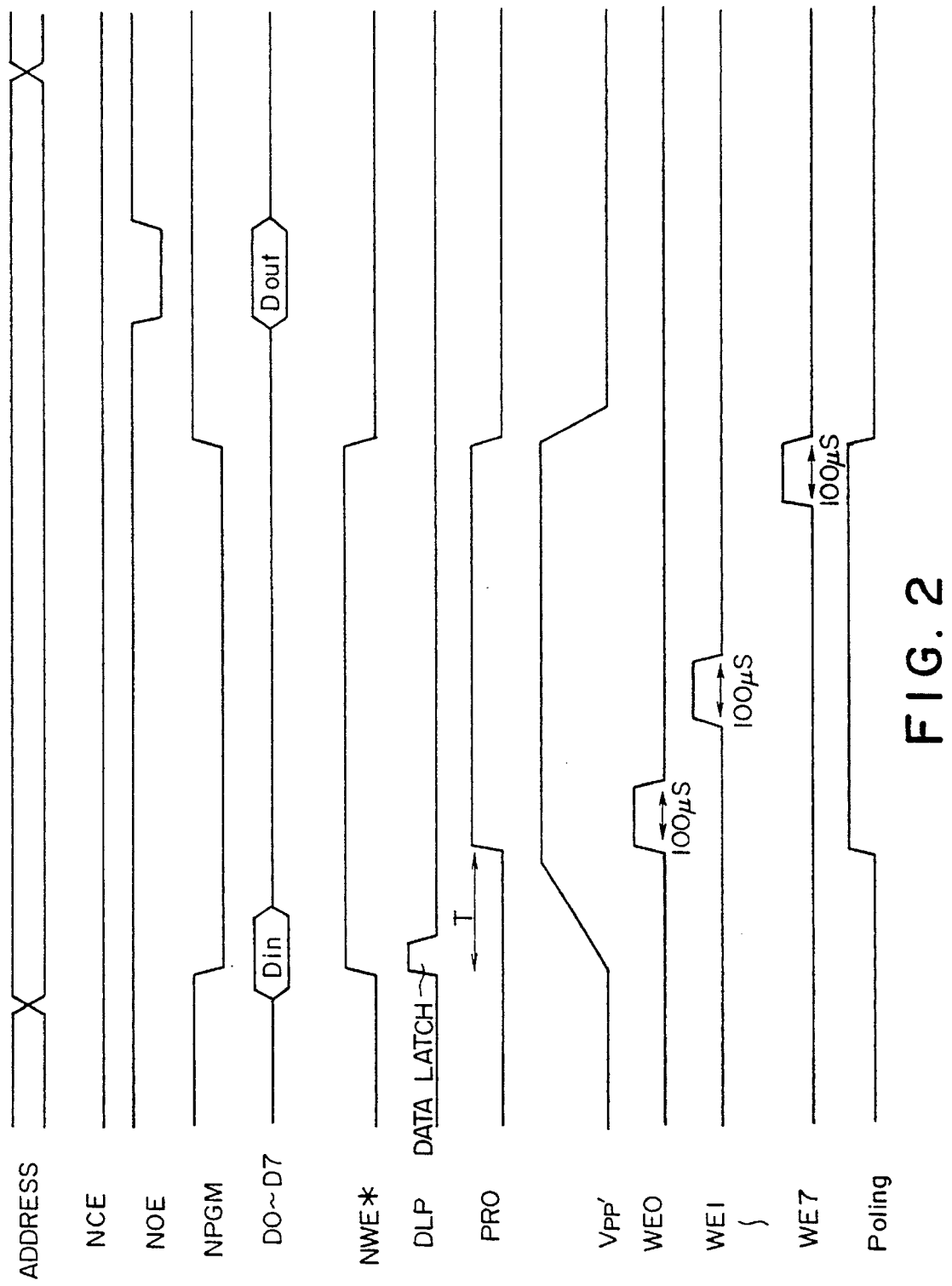
FIG. 2 is a timing chart showing the operation of the embodiment.

The operation of the memory shown in FIG. 1 will be detailed with reference to the timing chart shown in FIG. 2.

Input address signals $A_o$ to $A_i$ and $B_{i+1}$ to $B_j$ change so as to sequentially write data in memory cells at certain addresses. Memory cells are sequentially selected one after another by the row decoder 2, column decoder 4 and column select gate circuit 6, while selecting one word line of the memory cell array and sequentially selecting a bit line of each I/O unit.

When an input address changes so as to sequentially select a memory cell one bit after another, an external program control signal NPGM changes from "1" to "0". For example, assuming that a logic is implemented in the chip to enter the write mode when the chip control signal NCE is "0", output buffer control signal NOE is "1", and program control signal NPGM is "0", the write mode enters when the signal NPGM changes from "1" to "0". In response to this, the charge pump control signal NWE* changes from "0" to "1" with the internal circuitry of the chip being set to the write mode. The write potential $V_{pp}'$ is boosted to 13 V for example, so that the charge pump circuit 21 starts operating.

In addition to the above operation, when the charge pump control signal NWE* changes from "0" to "1", a data latch pulse DLP generates for several tens of nanoseconds for latching the data to be written in a memory cell in a latch circuit of each I/O unit.

After a predetermined time (T) lapse from when the charge pump control signal NWE* changes from "0" to "1", a program signal PRO changes from "0" to "1". In response to this, the write circuit control signals WEi (WE0 TO WE7) generate in this order for example to control the write circuit 10 for each I/O unit. When the write circuit control signal WEi takes a "1" level, the write circuit 10 supplies a write high or low potential to the bit line BL of the selected memory cell MC, depending upon the data latched by the data latch circuit.

In response to the transition of the program signal PRO to "1" level, a polling signal (Polling) takes a "1" level and outputted to an I/O unit 7 for example, in order to allow a CPU or the like to judge the operation mode as the write mode.

The time duration T from when the charge pump control signal NEW* changes to "1" and to when the program control signal PRO changes to "1" is required to be a sufficiently long duration, e.g., about 1 msec, in order to charge the capacitor connected to the output terminal of the charge pump circuit 21.

In this embodiment, this time duration T is set by an internal delay circuit. Alternatively, the program control signal PRO may be arranged to automatically generate when the detected voltage level of the output signal $V_{pp}'$ of the charge pump circuit 21 is boosted to a predetermined voltage (e.g., 13 V).

The advantageous effects of the memory shown in FIG. 1 will be described.

Conventionally, in a flash type EEPROM using a single power source, a high potential for the write and erase operations is boosted by the charge pump circuit 21 within the chip, and a current particularly for the write operation is stored in the capacitor connected to the output side of the charge pump circuit 21 as electric charges. Therefore, if a write current is large, the boosted write voltage cannot be held for a predetermined time period and it instantly drops.

However, in the memory shown in FIG. 1, in writing data to memory cells during the write mode, each write circuit 10 is activated for each bit under the control of the write circuit control signal WEi. Therefore, a write current only for one bit flows at a time. Electric charges stored in the capacitor connected to the output side of the charge pump circuit 21 are therefore sufficient for supplying a write current, thereby realizing a semiconductor integrated circuit having a large operating margin.

For example, consider the case where the capacitance of the capacitor connected to the output side of the charge pump circuit 21 is 0.2 μF and the potential is boosted up to 13 V as described above. In this case, a current flowing through a memory cell is 1.2 mA same as the above description, and the write time is assumed to be 100 μs. Since Q=C*V=i*t, 0.2 μF*ΔV=1.2 mA*100 μs, and so ΔV=0.6 V. Therefore, the boosted potential drops only to 13−0.6=12.4 V during each write time period of 100 μs, sufficient for the data write to a memory cell.

Different from boosting from 5 V to 13 V, boosting from the dropped write voltage of 12.4 V to 13 V is only 0.6 V, resulting in a short boosting time. It is therefore sufficient if the interval between write circuit control signals be set about 100 μs, instead of several ms at the first boosting time period.

In the above embodiment, a write operation at each I/O unit is carried out irrespective of whether the write data is "0" or "1". However, if the write data is the same as that previously stored in a memory cell, the write operation to that I/O unit may be omitted and shipped to the next I/O unit. With such an arrangement, the write time can be reduced advantageously.

Next, particular examples of the sense amplifier 7, write circuit 10 and write control circuit 20 will be briefly described.

Figure 3:
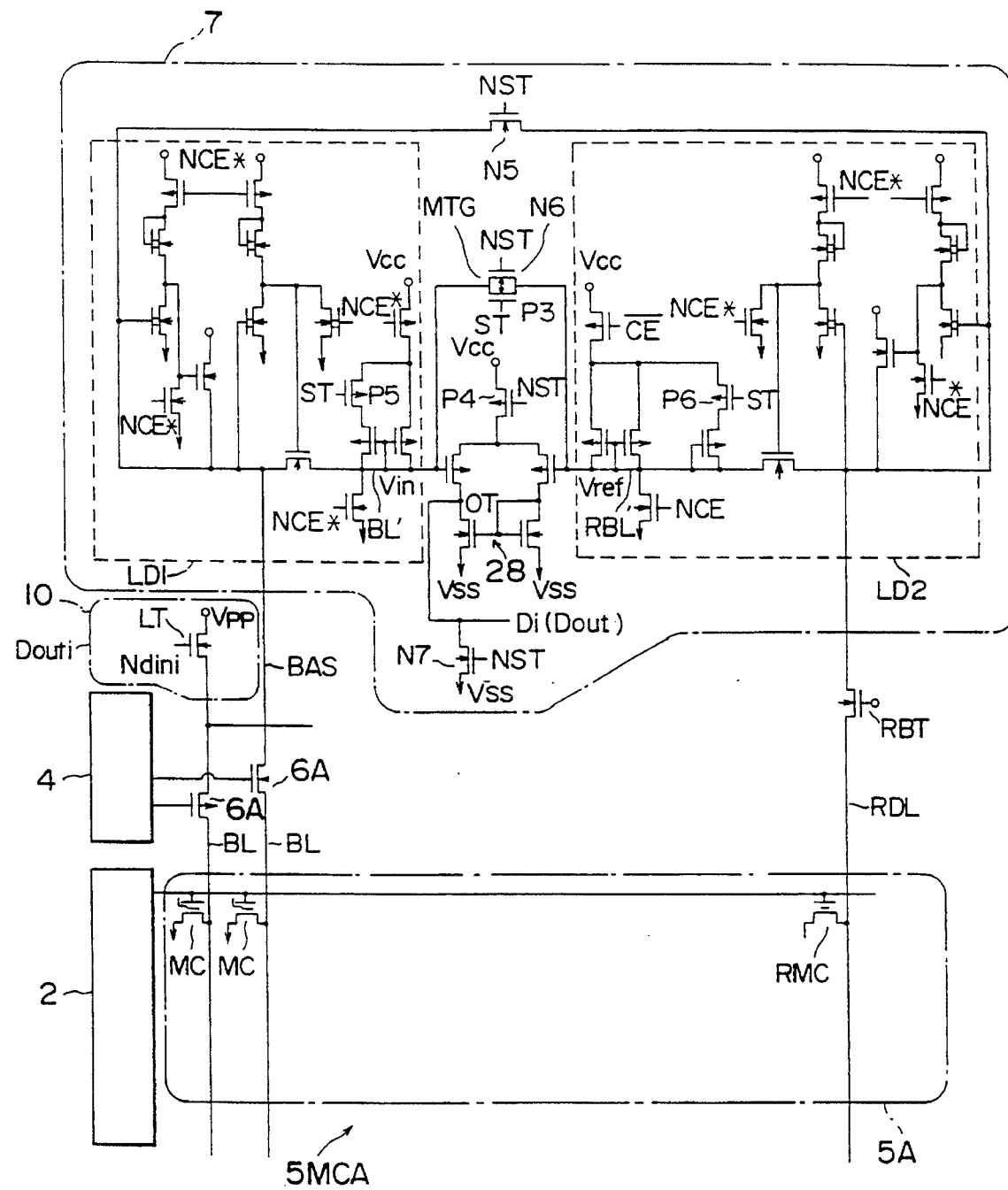
FIG. 3 is a circuit diagram showing the sense amplifier of the embodiment.

FIG. 3 shows an EEPROM using a differential amplifier as a sense amplifier, showing particularly a memory cell array unit MCAU, column select gate 6A and sense amplifier circuit (SA) 7. MC represents a memory cell of a floating gate type MOS transistor, RMC represents a reference memory cell (dummy cell) of a floating gate type MOS transistor, WL represents a word line, BL represents a bit line, RBL represents a reference bit line, reference numeral 2 represents a row decoder, reference numeral 4 represents a column decoder, B6A represents a column select gate transistor, and RTB represents a dummy bit line select transistor equivalent to one column select gate transistor 6A, this transistor being applied with $V_{CC}$ potential at its gate and connected to the reference bit line RBL intermediately thereof. BAS represents a bus line to which column select gate transistors 6A are connected in parallel, LD1 represents a first load circuit connected to the bus line BAS, and LD2 represents a second load circuit connected to the reference bit line RBL. A potential Vin at the bit line BL' at the output side of the first load circuit LD1 and a potential (reference potential) Vref at the reference bit line RBL at the output side of the second load circuit LD2 are applied to a data detector circuit 28 (e.g., constructed of a CMOS current mirror circuit) of the differential amplifier type sense amplifier circuit (SA) 7.

Connected between the first load circuit LD1 and second load circuit LD2 is an N-channel transistor N5 with an NST signal being applied to its gate. Connected between bit line BL' and the reference bit lines RBL' (between two input terminals of the data detector circuit 28) is a CMOS transfer gate MTG constructed of parallel connected P-channel transistor P3 and N-channel transistor N6, the transistor P3 being applied with a signal ST at its gate and the transistor N6 being applied with the inverted signal NST.

In the sense amplifier circuit (SA) 7, connected between the $V_{CC}$ power source and the data detector circuit 28 is an activation control P-channel transistor P4 with the inverted signal NST being applied to its gate. When the transistor P4 turns off, the data detector circuit 28 becomes inactive to reduce consumption current. Connected between the output terminal OT of the data detector circuit 28 and ground is an N-channel transistor N7 with the inverted signal NST being applied to its gate. The first load circuit LD1 has a P-channel transistor P5 to which gate the signal ST is applied. The second load circuit LD2 has a P-channel transistor P6 to which gate the signal ST is applied.

In the circuit constructed as shown in FIG. 3, the reference potential Vref at the reference bit line RBL' generated in accordance with the data in the reference memory cell RMC is compared by the sense amplifier circuit with the potential Vin at the bit line BL' generated in accordance with the data read from the selected memory cell. The comparison result is used to detect the data stored in the memory cell, and to output the stored data to the output buffer circuit 8.

As compared with a data read speed of a memory cell after an address signal changes, a data read speed of a memory cell after a chip enable signal changes is slow, because an internal chip enable signal becoming active in a chip enable buffer circuit has some time delay. The signals ST and NST are provided to solve such a problem. Namely, the signals ST and NST are used in order to read data from a memory cell at a high speed when a chip control signal changes. The signals ST and NST are also used in order to control the potential at the bit line via which data is read from a memory cell. The signal ST and its inverted signal NST are also used in order to set the potential at the bit line via which data is read from a memory cell, to an intermediate level between the data "1" and "0". The potential of the bit line is set to this intermediate level by using the signal ST and its inverted signal NST, during the period that after the chip control signal changes, the cell data is transferred to the bit line. In this case, the data read from a memory cell onto the bit line changes from the intermediate level to "1" or "O" level potential. As a result, the time required for the data on the column line to change is halved, allowing a high speed data read. While the potential at the bit line takes the intermediate level, the sense amplifier circuit SA detects the intermediate level. However, this level is not the correct data. Therefore, during this period, the signal ST takes "O" level to disable the sense amplifier circuit SA.

Figure 4:
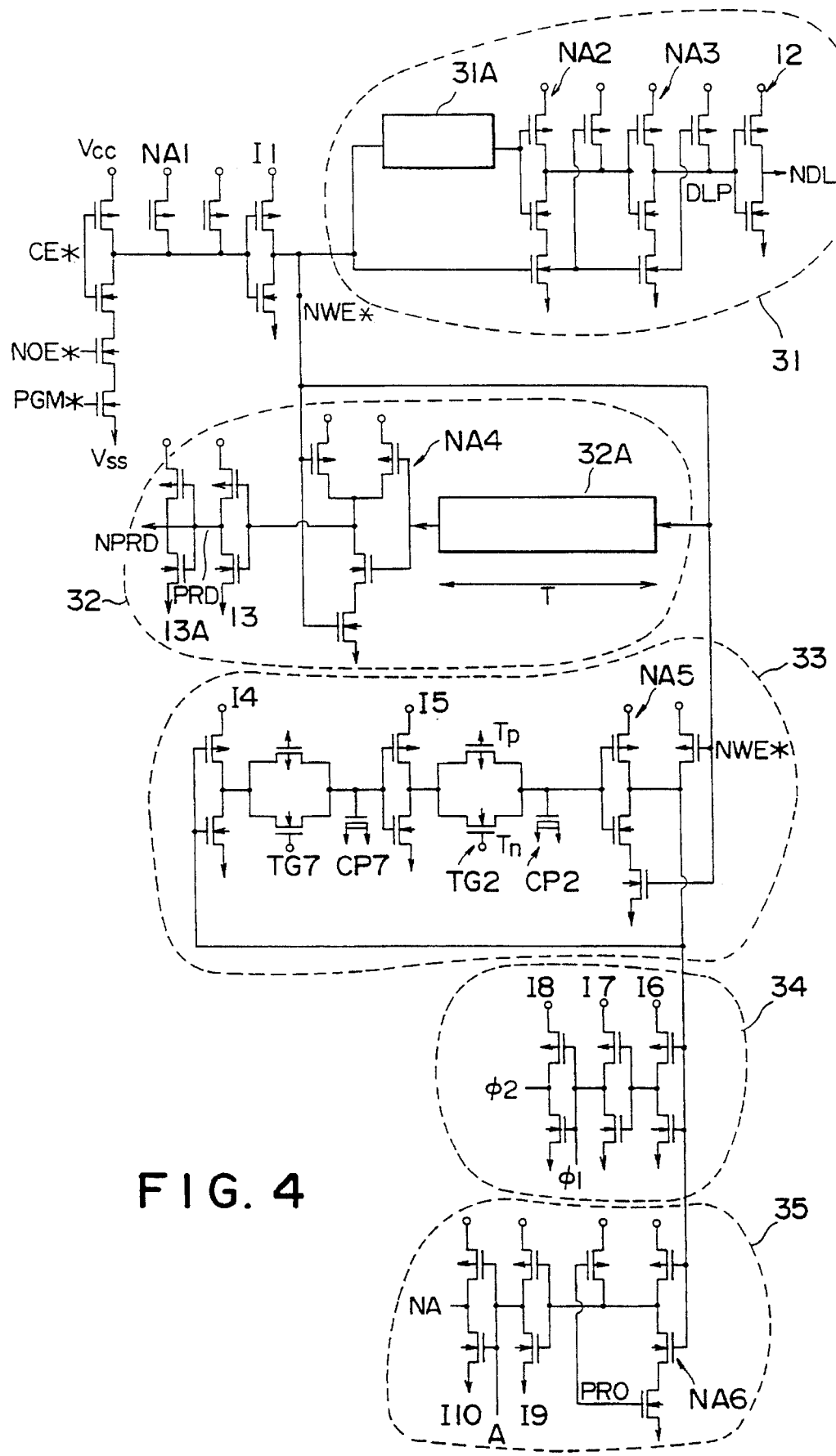
FIG. 4 is a charge pump control circuit of the charge pump circuit of the embodiment.

The write control circuit 20 is constructed of a charge pump control circuit and a write circuit controller. FIG. 4 shows a charge pump circuit, and FIGS. 5 to 8 shows a write circuit controller.

First, the charge pump control circuit shown in FIG. 4 will be described. An internal chip enable signal CE* is a signal generated by a chip enable buffer circuit (not shown) by using the external chip enable signal NCE, this signal CE* being used for activating the integrated circuit chip or making it enter a stand-by state. A signal NOE* is a signal generated by an out enable buffer (not shown) by using the external out enable control signal NOE, this signal NOE* being used for activating the output buffer circuit or making it enter a high impedance state. A signal PGM* is an internal signal generated by a PGM buffer circuit (not shown) by using the external program control signal PGM. $V_{CC}$ represents a power source potential, and $V_{SS}$ represents a ground potential.

The signals CE*, NOE* and PGM* are inputted to a three-input NAND gate NA1 whose output is supplied to an inverter 11. An output NWE* of the inverter L1 is supplied to a data latch pulse generator circuit 31, a program signal generator circuit 32 and a ring oscillator circuit 33.

In the latch pulse generator circuit 31, the signal NWE* is inputted to a first delay circuit 31A. An output (same phase with the input) of this delay circuit 31A and the signal NWE* are supplied to a two-input NAND gate NA2. An output of the NAND gate NA2 and the signal NWE* are supplied to a two-input NAND gate NA3. An output of the gate NA3 is supplied to an inverter I2. An,output DLP of the NAND gate (NOR gate) NA3 and an output NDLP (inverted signal) of the inverter I2 control the data latch circuit.

In the program signal generator circuit 32, the signal NWE* is inputted to a second delay circuit 32A. An output (same phase with the input and delayed by a predetermined time duration T) of the delay circuit 32A and the signal NWE* are supplied to two-input NAND gate NA4. An output of the this gate NA4 is supplied to inverters I3 and I4. Output signals PRO and NPRO (inverted signal) control the write circuit controller.

The ring oscillator circuit 33 has a two-input NAND gate NA5 to which an output of a transfer gate TG2 and the signal NWE* are supplied. This transfer gate TG2 is constructed of an n-channel transistor Tn and p-channel transistor Tp connected in parallel, the transistor Tn being applied with $V_{CC}$ potential at its gate and the transistor Tp being applied with Vss potential at its gate. An output of the NAND gate NA5 is applied via an inverter I4 to one end of a transfer gate TG1 having the same configuration as the transfer gate TG2. The other end of the transfer gate TG1 is connected to one end of the transfer gate TG2 via an inverter I5. The one ends of the transfer gates TG1 and TG2 are connected to n-channel transistors CP1 and CP2 with $V_{SS}$ potential applied to their drains.

An output of the ring oscillator circuit 33 is supplied to a charge ! pump clock pulse circuit 34 and a write load control circuit clock pulse circuit 35. In the charge pump clock pulse circuit 34, an output of the ring oscillator circuit 33 is supplied to an inverter I6. An output of the inverter I6 is coupled to two stage inverters I7 and I8. Output ø1 and ø2 (=Nø) of the inverters I7 and I8 are supplied to the charge pump circuit 21.

The write load control circuit clock pulse circuit 35 has a two-input NAND gate NA 6. Supplied to this gate NA6 are an output of the ring oscillator circuit 33 and an output PRO of the program signal generator circuit 32. An output of the NAND gate NA6 is connected to two state inverters I9 and I10. Outputs A and NA of the inverters I9 and I10 are supplied to the write control circuit 20.

In the charge pump control circuit shown in FIG. 4, when the signals CE*, NOE* and PGM* take "1" level, the write mode is effected and the signal NWE* takes "1" level. Thereafter, as seen also from FIG. 2, the data latch pulse pulse signal DLP takes "1" level for a predetermined time duration determined by the first delay circuit 31A, and the program signal PRO takes "1" level after the delay time T of the second delay circuit 32A. In addition to the above operations, when the signal NWE* takes "1" level, the ring oscillator circuit 33 starts oscillating at a predetermined frequency, and the clock pulse circuit 33 generates the clock pulse signals ø1 and ø2 synchronously with the frequency of the ring oscillator circuit 33. When the program signal PRO takes "1" level, the write load circuit clock pulse circuit generates the clock pulse signals A and NA synchronously with the frequency of the ring oscillator circuit 33.

Figure 5:
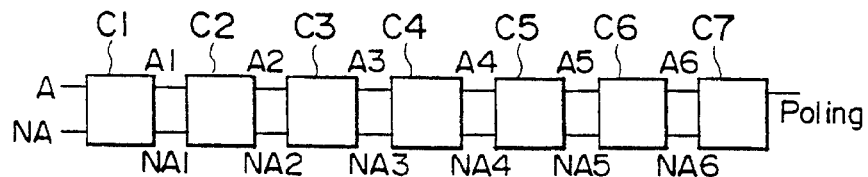
FIG. 5 shows a write circuit controller.
Figure 7:
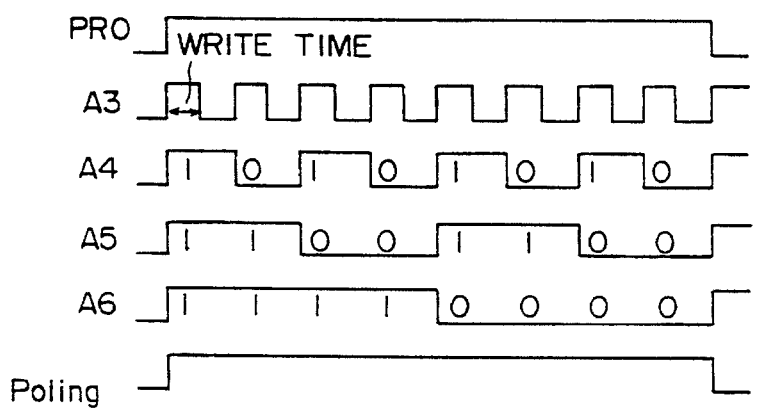
FIG. 7 is a timing chart showing the operation timing of the counter.
Figure 8:
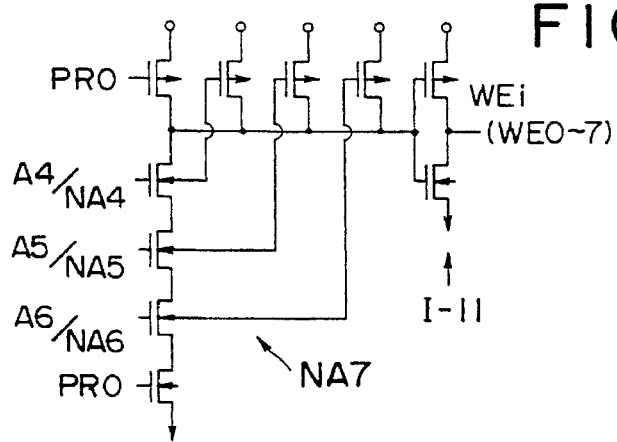
FIG. 8 shows a signal WEi output circuit.

In the write circuit controller shown in FIG. 5, counter circuits C1 to C7 are connected in series. The counter circuits C1 and C7 all have the same structure. The counter circuit C1 for example has the structure shown in FIG. 6 to be described later in detail. The outputs A and NA of the charge pump control circuit shown in FIG. 4 are inputted to the first state counter circuit C1. Outputs F1 and NF1 of the first stage counter circuit C1 are supplied to the second state counter circuit C2. The other counter circuits C3 and C7 operate in the similar manner. The seventh state counter circuit C7 outputs a poling signal Poling. The outputs of the counter circuits C3 to C7 are shown in FIG. 7. As shown in FIG. 8, the outputs A4, NA4, A5, NA5, A6, and NA6 of the fourth to sixth stage counter circuits C4, C5, and C6 and the program signal PRO are inputted to a four-input NAND gate NA7. An output of the NAND gate NA7 is supplied to an inverter I11 which outputs the write circuit control signal WEi. Namely, each state of the counter circuits generates a pulse having a period twice as long as that of the fundamental clocks A and NA. The number of counter circuits is determined so as to obtain a clock width necessary for data write (e.g., three stages). In this manner, a pulse having a predetermined write period can be set. For example, by using the outputs of the fourth to sixth counter circuits C4 to C6, the signal WEi for the sequential control of the eight I/O units can be obtained. Specifically, a signal outputted from the NAND gate NA7 is supplied to the write circuit 10, the signal including WE0 with A4, A5.and A6 all being set to "1" level, WE1 with A4 being set to "0" level, A5 and A6 being set to "1" level, and WE7 with A4, A5 and A6 all being set to "0" level.

Figure 6:
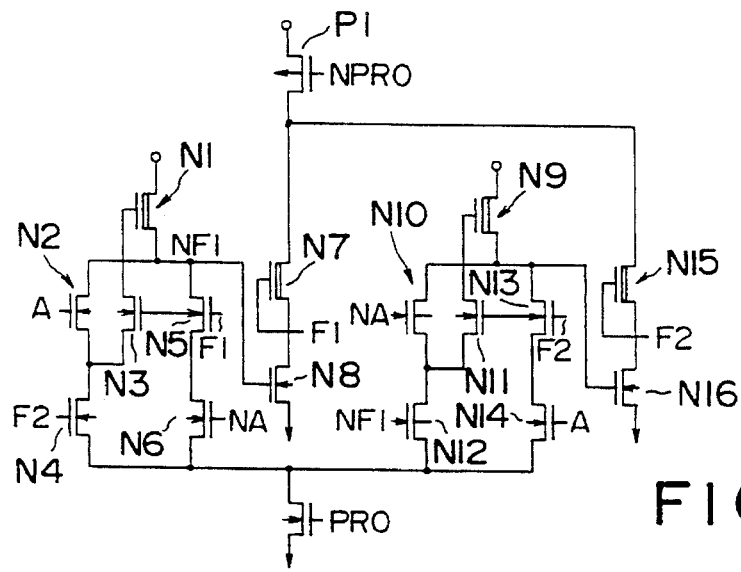
FIG. 6 is a circuit diagram showing the counter of the controller.

An example of the detailed circuit of the counter circuits C1 to C7 is shown in FIG. 6. As seen from FIG. 6, the counter circuits C1 to C7 are constructed by using a known circuit which receives A and NA and outputs F1 and NF1. In the case of the counter circuit C1, F1 and NF1 correspond to A1 and NA1.

Figure 9:
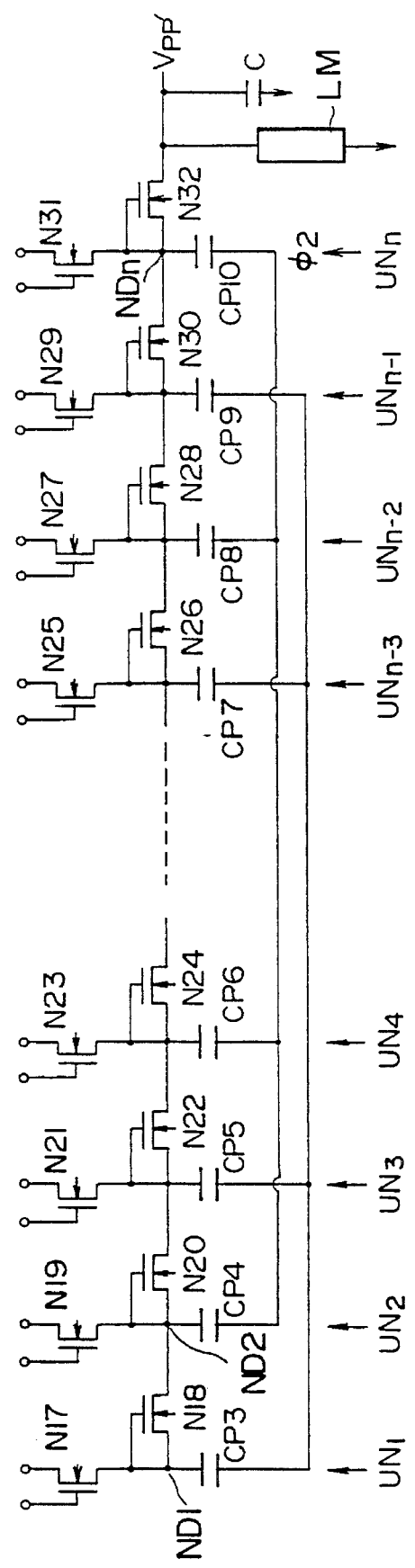
FIG. 9 shows a charge pump circuit.

FIG. 9 shows an example of the charge pump circuit 21. In this charge pump circuit, n-stage charge pump units $UN_1$ to $UN_n$ are connected in series. The unit $UN_1$ has an n-channel transistor N17 whose drain and gate are connected to the power source $V_{CC}$. The source of the transistor N17 is connected to the gate and drain of an n-channel transistor N18. A connection node (ND1) between the transistors N17 and N18 is connected to one end of a capacitor CP3 the other end of which is inputted with the signal ø1 from the charge pump control circuit shown in FIG. 4. The unit $UN_2$ has an n-channel transistor N18 whose drain and gate are connected to the power source $V_{CC}$. The source of the transistor N18 is connected to the gate and drain of an n-channel transistor N20. A connection node (ND2) between the transistors N19 and N20 is connected to one end of a capacitor CP4 the other end of which is inputted with the signal ø2 from the charge pump control circuit. The other units $UN_3$ to $UN_n$ have the same structure as above. Namely, the odd numbered units have the same structure as the unit $UN_1$, and the even numbered units have the same structure as the unit $UN_2$. An output of the last stage unit $UN_n$ is a boosted voltage $V_{pp}'$. Connected to this last output terminal are a charge storing capacitor C and a limiter circuit LM for limiting the boosted voltage to a predetermined potential.

In the charge pump circuit shown in FIG. 9, during the operation cycle other than the write cycle, the charge pump control circuit does not generate the clock signal outputs ø1 and ø2, so that the potential at each node ND1 to NDn is $V_{CC}-V_{thn}$ ($V_{thn}$ is a threshold voltage of the n-channel transistor). When the write mode enters from this condition, the clock signals ø1 and ø2 generate and oscillate between the potentials 0 V and $V_{CC}$. As a result, the potential at the first stage node ND1 oscillates between the level $V_{CC}-V_{thn}$ and level $2V_{CC}-V_{thn}$. The potential at the second stage node ND2 oscillates between the level $2V_{CC}-V_{thn}$ and level $3V_{CC}-V_{thn}$. In this manner, the potential is boosted up gradually from the power source $V_{CC}$.

Figure 10:
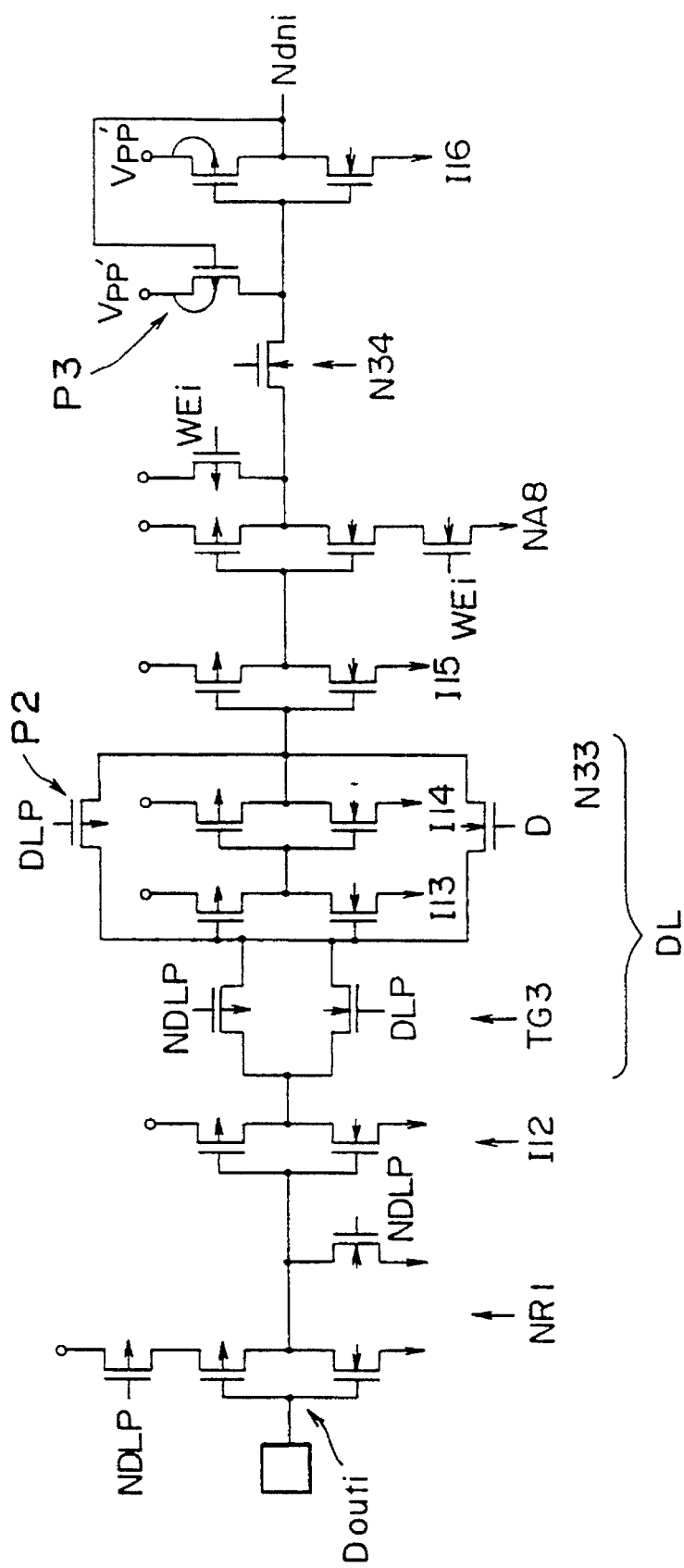
FIG. 10 shows a write circuit.

FIG. 10 shows a write load circuit. In this circuits, $D_{outi}$ is a data input to be written to a memory cell. The data input $D_{outi}$ and data latch pulse NDLP are inputted to a two-input NOR gate NR1. An inverter I12 is connected to the output side of the NOR gate NR1. A transfer gate TG3 is connected to the output side of the inverter I12. This gate TG3 is constructed of a p-channel transistor and n-channel transistor connected in parallel, the p-channel transistor being applied with the latch signal NDLP at its gate and the n-channel transistor being applied with the latch signal DLP at its gate. Three-stage inverters I13 to I15 are connected to the output side of the transfer gate TG3. Connected between the input side of the inverter I13 and the output side of an inverter I14, are a p-channel transistor p2 with the latch signal DLP being applied to its gate and an n-channel transistor N33 with the latch signal NDLP being applied to its gate. A data latch circuit DL for latching data to be written in a memory cell is constructed of the inverters I13 and I14, transfer gate TG3, p-channel transistor P2, and n-channel transistor N2. An output of the inverter I15 and the write circuit control signal WEi are inputted to a two-input NAND gate NAB. The output side of the inverter I15 is connected to an inverter I16 via an n-channel transistor N34 with the power source $V_{CC}$ being applied to its gate. Also connected to the input side of the inverter I16 are a p-channel transistor P3 with an output $V_{pp}'$ of the charge pump circuit being applied to its drain and an output of the inverter I16 being applied to its gate. An output Ndini of the inverter I16 is applied to the gate of the write load transistor.

In the write circuit 10 shown in FIG. 10, when the signal NWE* takes "1" level, the latch signal DLP takes "1" level, and the signal NDLP takes "0" level, then the NOR gate NR1 and transfer gate TG3 are activated. As a result, the write data Douti is latched by the latch circuit DL. When the latch signal DLP takes "0" level, the signal NDLP takes "1" level, and the transfer gate TGS becomes off, then the p-channel transistor p2 and n-channel transistor N33 turn on to latch the data in the latch circuit DL.

Next, consider the bit relative to which the write circuit control signal WEi takes "1" level. In accordance with the data latched by the activated latch circuit, the NAND gate NA8 causes the output Ndini to take a high potential when the input $D_{outi}$ is "O" level, and a low potential when the input $D_{outi}$ is "1" level.

As described above, with the memory system shown in FIG. 1, the write operation can be sufficiently carried out even with a signal power source. However, the write time is longer than that when data is written to all bits at the same time.

There is a case where a user prefers a shorter write time by supplying a write potential $V_{pp}$ externally, rather than a longer write time by using only a single power source $V_{CC}$ in the system configuration.

Therefore, depending upon the application of a memory system, the write voltage may be selectively obtained either from voltage boosted by a charge pump circuit within the chip or from an external power source. Examples of such an arrangement are shown in FIGS. 11 and 12.

Figure 11:
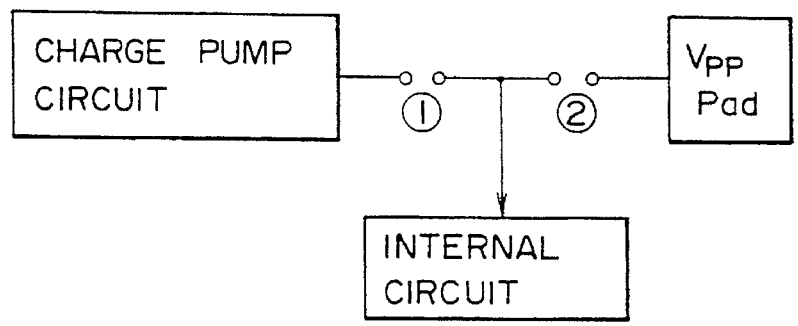
FIG. 11 shows an example of switching between power sources.

FIG. 11 schematically illustrates a method of switching a write potential supplied to the internal circuit by using an A1 mask which is used at one of the semiconductor manufacturing steps, an A1PEP process. Specifically, if an output of a charge pump circuit is used as the write voltage, an A1 mask for closing the contacts (1) is used, whereas if an external power source is used, another A1 mask closing the contacts (2) is used. This method shown in FIG. 11 has a small degree of freedom because A1 masks are required to be selectively used.

Figure 12:
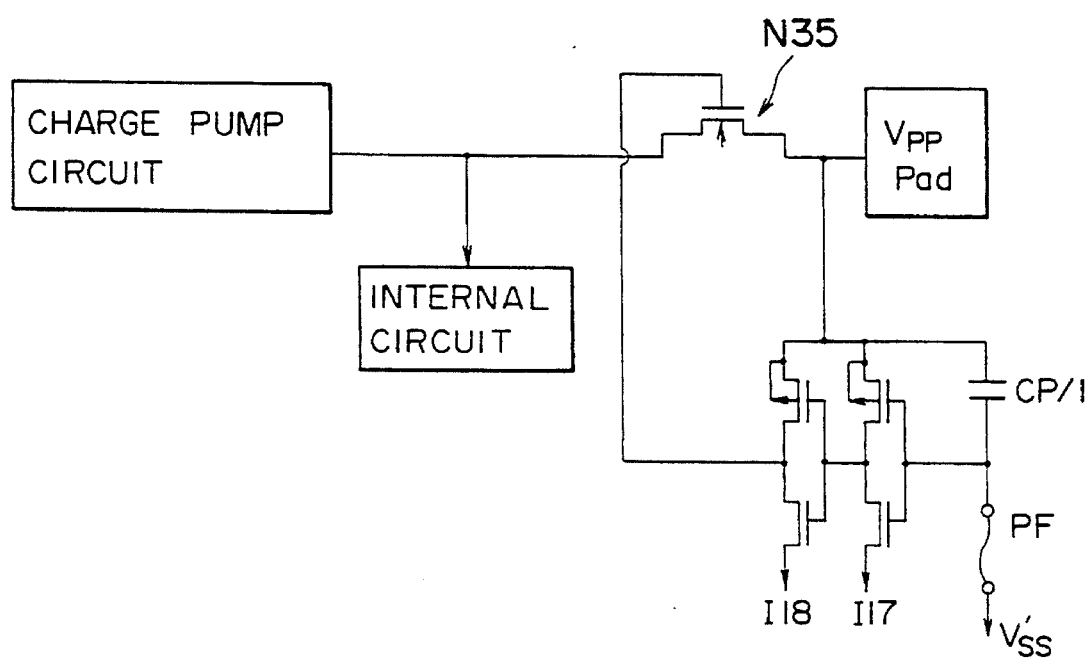
FIG. 12 shows another example of switching between power sources.

A method illustrated in FIG. 12 is an improved version of the method shown in FIG. 11. An n-channel transistor N35 is formed between a terminal from which a voltage is supplied to the internal circuit and an external power source pad. The gate of this transistor N35 is supplied with an output of an inverter I18. The input side of the inverter I18 is connected to the ground terminal $V_{SS}$ via an inverter I17 and poly-fuse PF. The external power source $V_{pp}$ is connected to one ends of the inverters I17 and I18, and the ground terminal $V_{SS}$ is connected to the other ends thereof. A capacitor CPl1 is connected between the external power source $V_{pp}$ and the poly-fused PF.

An output of the inverter I18 is supplied to the gate of the n-channel transistor N35. If the poly-fuse PF is not made blown, an output of the inverter I18 takes "O" level. Therefore, the n-channel transistor N35 is always off to disconnect the external power source PAD from the internal circuit. If the poly-fuse PF is made blown, the inverter I18 outputs the same potential as that of the external power source PAD. As a result, during the write mode providing the high potential, the n-channel transistor N35 becomes on so that the external power source PAD is used as the write power source.

Instead of the poly-fuse PF, a memory cell such as an EEPROM or EPROM may be used to make the data write state or not correspond to the on-state or off-state of the poly-fuse PF.

With the above system arrangement, it is easy to select the write voltage either from the external power source $V_{pp}$ for high speed data write or from the single power source irrespective of a longer write time.

Next, another embodiment will be described in which data can be written at the same time for all selected bits, even if the write voltage is supplied from the internal charge pump circuit using the single power source.

Figure 13:
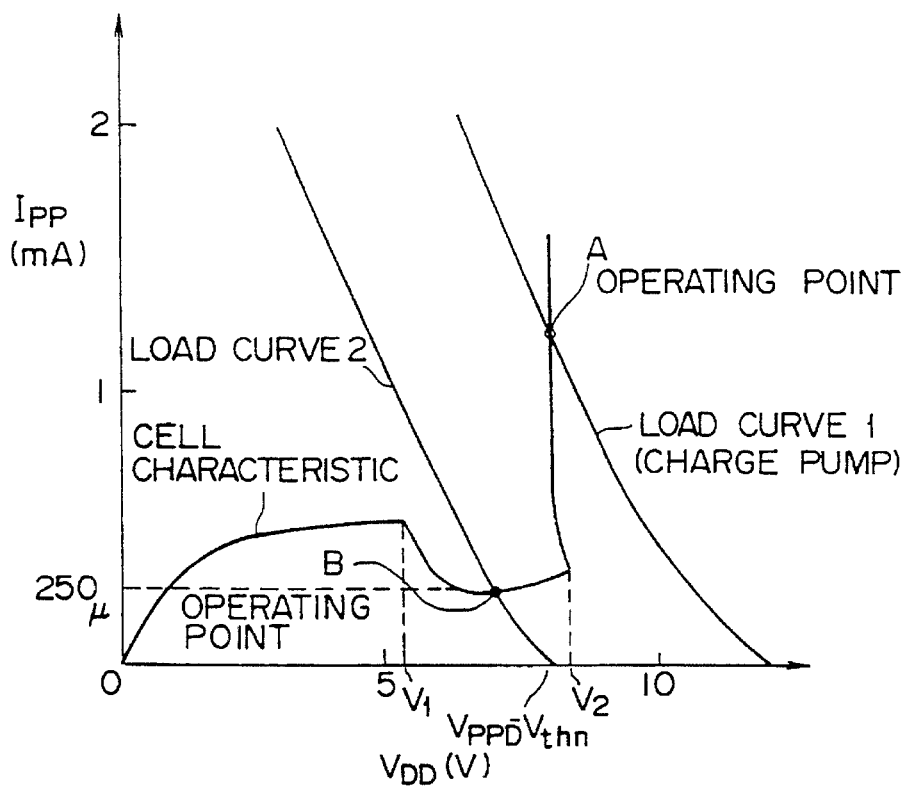
FIG. 13 is a graph showing the operation of a memory cell according to another embodiment of the present invention.
Figure 14:
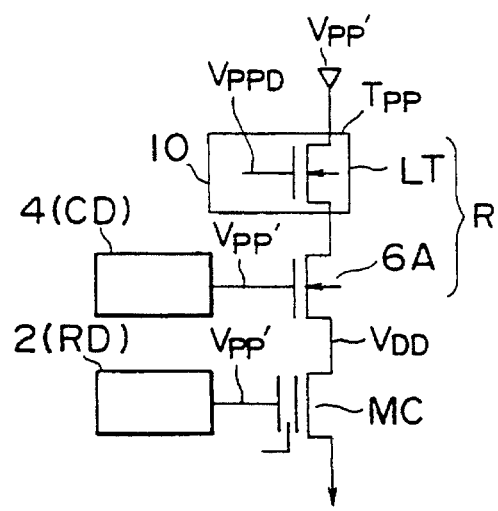
FIG. 14 is a circuit diagram of a memory cell of the embodiment.

Referring to FIGS. 13 and 14, the total resistance of a write load transistor LT and column gate transistor 6A is set to 2.5 K ohms as described with the conventional memory system. A load curve 1 in association with the write load transistor LT and column gate transistor 6A is given for the comparison sake. The drain of the write load transistor LT is supplied with a voltage output $V_{pp}$ boosted by the charge pump circuit 21 within the chip.

In FIG. 13, the high voltage potential during the write cycle to be applied to the gate of the write load transistor LT is lowered, contrary to the conventional system. The lowered potential is supplied from an unrepresented voltage divider (VD in FIG. 1A).

Representing the lowered potential by $V_{PPD}$, the bit line potential $V_{DD}$ of a memory cell while the data "O" is written becomes $V_{PPD}-V_{thn}$, when the outputs of the column decoder circuit 4 and row decoder circuit 2 are set to the potential $V_{PP}'$. This state is indicated by a load curve 2. The operating point is point B, allowing a very small current level as compared with the conventional operating point A.

In FIG. 13, $V_1$ is a voltage at which injection of electrons into the floating gate starts, and $V_2$ is a voltage at which a memory cell breaks down.

Figure 1A:
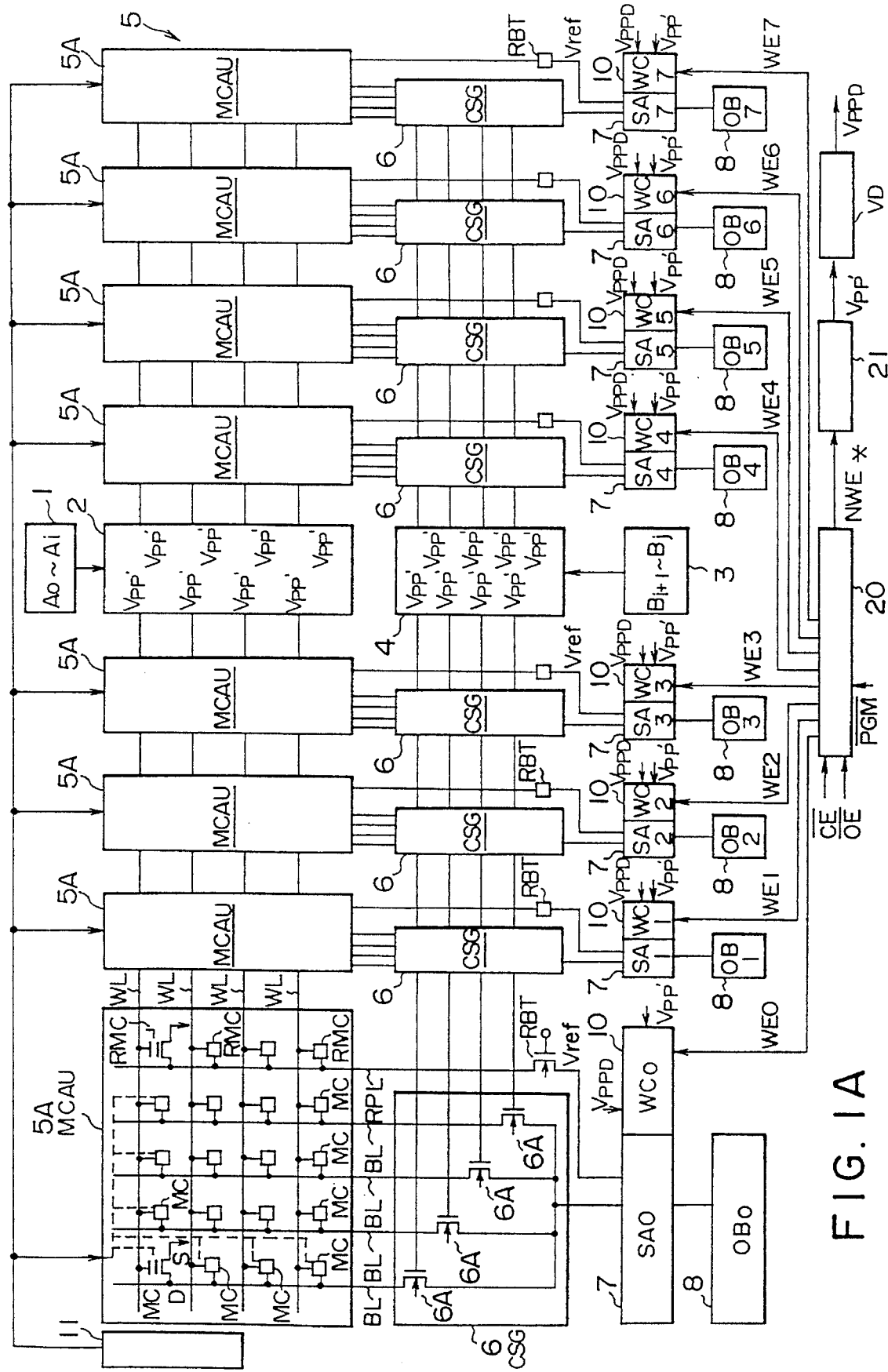
FIG. 1A is a circuit diagram showing the overall structure of another embodiment of the present invention.

For example, the threshold voltage of the n-channel transistor is set to 1 V and the lowered potential $V_{PPD}$ is set to 9 V. Under this condition, the write current is 250 µA. Consider the case where the capacitance of the charge storage capacitor is 0.2 µF and the potential is boosted up to 13 V as described above. Assuming that the write time is 100 µs, 0.2 µF* $\Delta V$=(250 µA*8 bits)*100 µS, and so $\Delta V$=−1 V. Therefore, the boosted potential drops to 13 V−1 V=12 V, maintaining the sufficient data write voltage during the necessary 100 µs period. It is important in this case that the potential at the operating point B should be set to higher than the voltage $V_1$ at which injection of electrons into the floating gate starts and lower than the voltage $V_2$ at which a memory cell breaks down. The reason for this is as follows. If the operating point B is set to $V_1$ or lower, injection of electrons to a memory cell is impossible and hence no data write occurs. If the operating point B is set to $V_2$ or higher, a large write current flows so that the internally boosted potential cannot supply sufficient current. FIG. 1A shows the overall memory system.

Figure 1B:
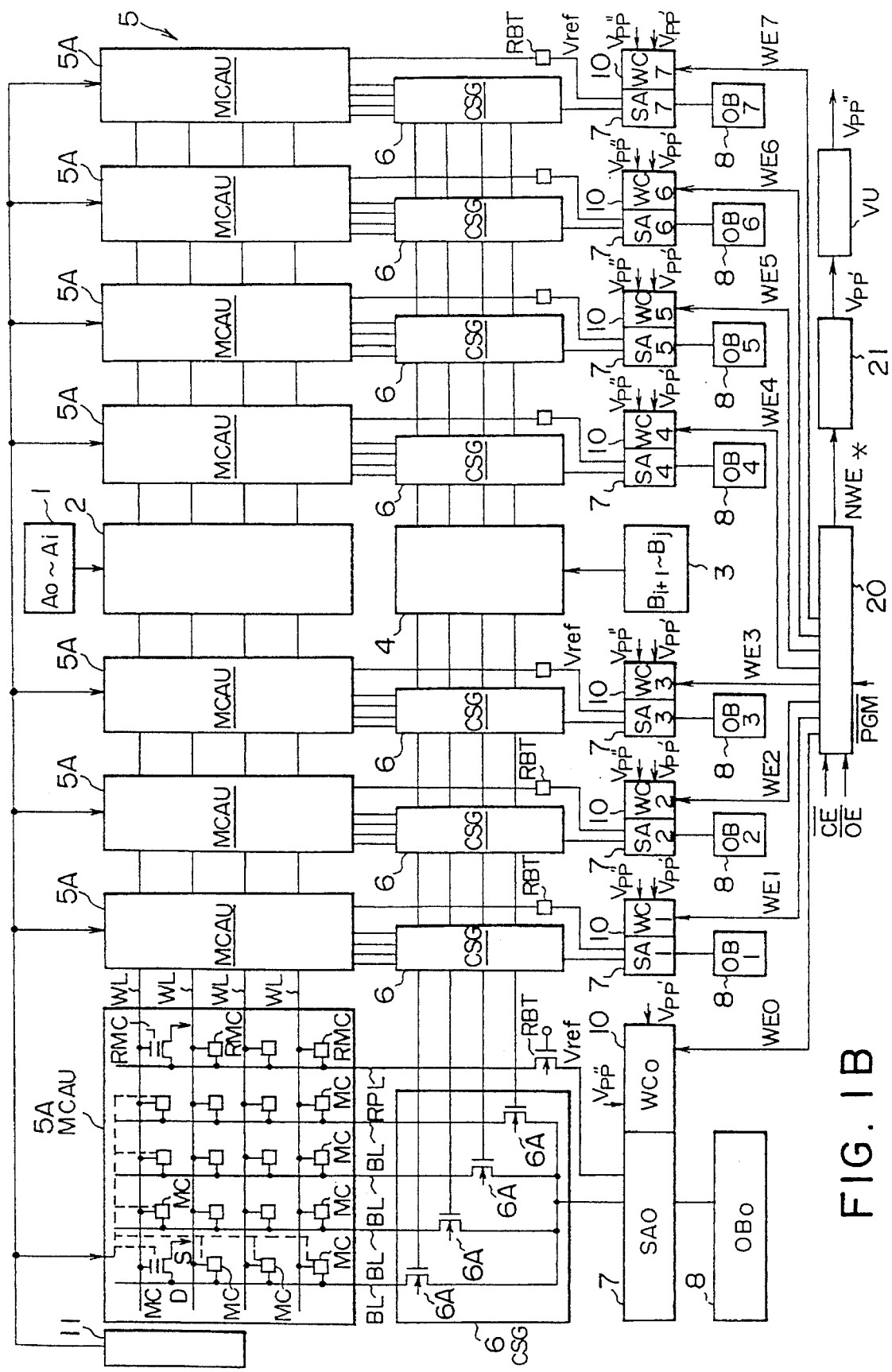
FIG. 1B is a circuit diagram showing the overall structure of another embodiment of the present invention.
Figure 15:
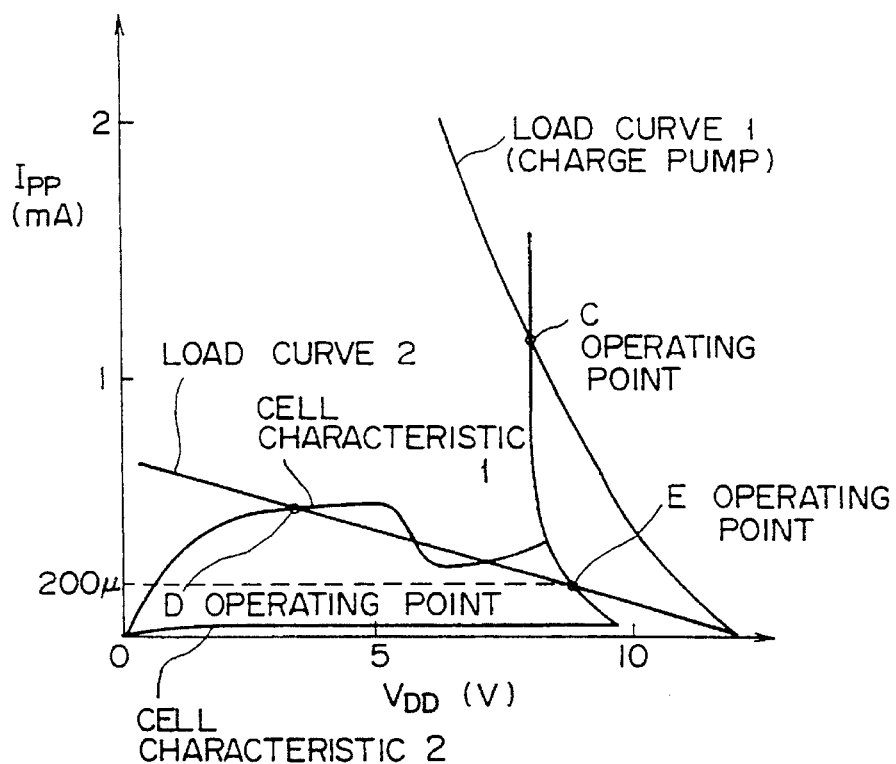
FIG. 15 is a graph showing the operation of a memory cell according to another embodiment of the present invention.
Figure 16:
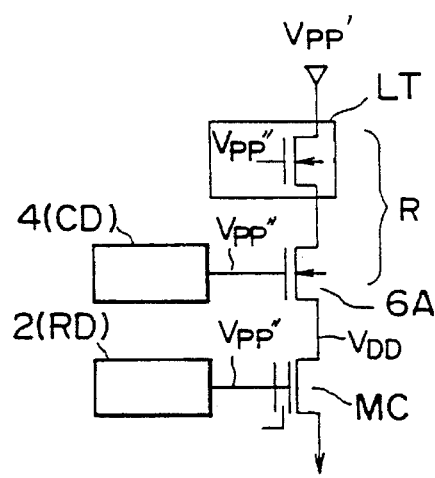
FIG. 16 is a circuit diagram of a memory cell of the embodiment.

Referring to FIG. 15, similar to the conventional memory system, a potential $V_{PP}''$ higher than the internally boosted potential $V_{PP}'$ (outputted from a charge pump circuit shown in FIG. 1B) is applied to the gates of the write load transistor LT and column gate transistor 6A and to the gate of the memory cell transistor MC. The load curve 1 shown indicates the same load characteristic as conventional. In this embodiment, the total resistance R of the write load transistor LT and column gate transistor 6A is set to a large value, providing the load curve 2. With such an arrangement, the operating point D is obtained reducing the write current. However, at this drain voltage, hot electrons near the drain will not generate and will not be injected to the floating gate, and so no data write operation occurs. In order to solve this problem, the timings of raising the potential of the word line and bit line are changed. Namely, raising the potential of the word line is delayed from raising the potential of the bit line, in order to set the cell characteristic to the characteristic 2. Specifically, the operating point E can be set if the load curve 2 does not intersect with the characteristic 2 until the cell breaks down. At this point, a write current of about 200 µA flows. Even if the data "O" for 8 bits are written at the same time, the write voltage can be maintained 12 V or higher similar to the above-described case, allowing the data write operation. At this operating point E, hot electrons generate near the drain of a memory cell and are injected to the floating gate, thereby allowing the data write operation. The overall system arrangement is shown in FIG. 1B.

As described above, by setting the operating point as shown in FIGS. 13 and 15, it is possible to write the data "O" for all selected bits (eight bits) without sequentially writing it for each I/O unit. In the above manner, it is possible to shorten the write time and provide a memory having an ample operating margin.

In the above cases, data is written at the same time for eight bits so that the write signals WEi with shifted timings are not necessary. Therefore, the signal NWE* is used for the circuit shown in FIG. 4, and the other circuits 32 to 35 are not needed.

The present invention is not limited only to the above embodiments using EEPROMs, but is applicable to other semiconductor memories such as EPROM. Also in the latter case, semiconductor integrated circuits of high reliability can be realized.

In the above embodiments, a memory cell MC having an erase gate has been used illustratively. The present invention is also applicable to a memory cell of a two-layer structure without an erase gate. An example of a two-layer structure memory cell (EEPROM) is shown in FIGS. 17 to 20.

Figure 17:
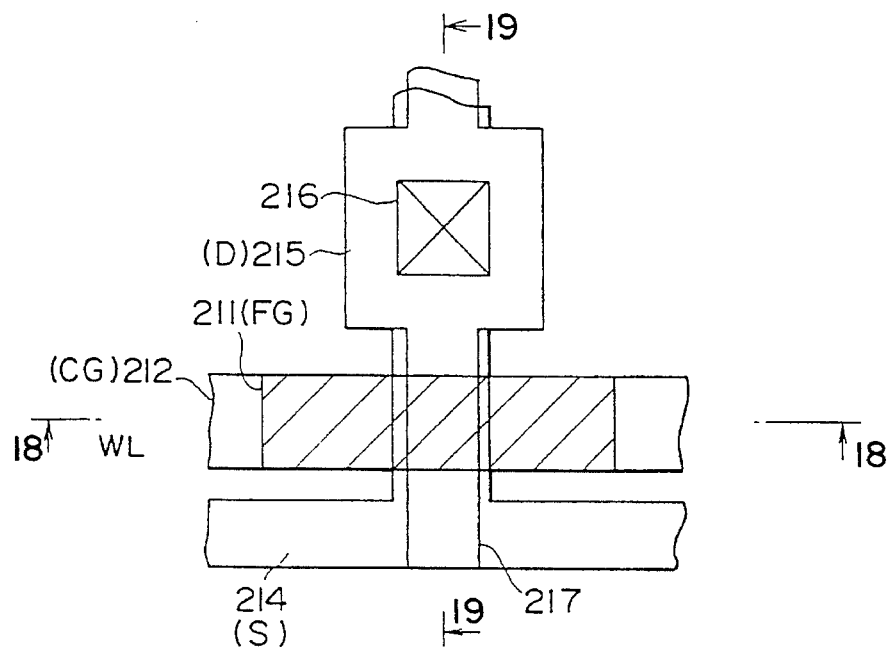
FIG. 17 a plan view of a pattern of another memory cell applied to the present invention, the memory cell having a two-layer structure.
Figure 18:
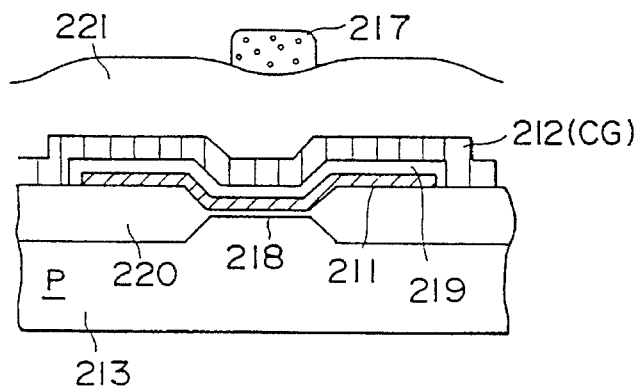
FIG. 18 is a cross sectional view of the two-layer memory cell taken along line 18—18.
Figure 19:
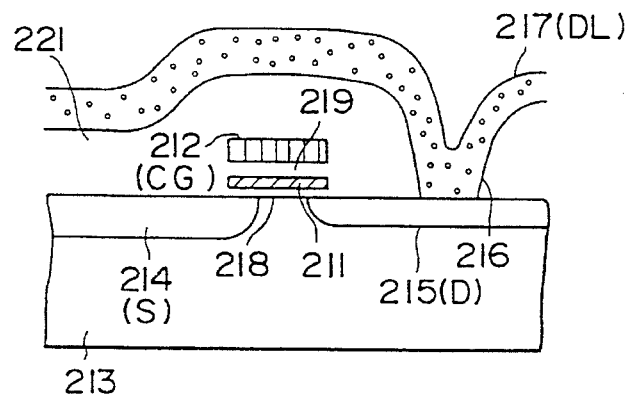
FIG. 19 is a cross sectional view of the two-layer memory cell taken along line 19—19.
Figure 20:
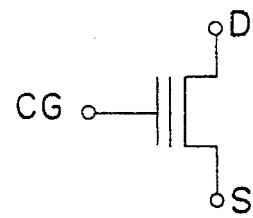
FIG. 20 is an equivalent circuit of the two-layer memory cell.

FIG. 17 is a plan view showing the pattern layout, FIG. 18 is a cross sectional view taken along line 18—18 of FIG. 17, FIG. 19 is a cross sectional view taken along line 19—19 of FIG. 17, and FIG. 20 is an equivalent circuit. In FIGS. 17 to 20, reference numeral 211 represents a floating gate (FG) of a first polysilicon layer, and reference numeral 212 represents a control gate (CG) of a second polysilicon layer, the second polysilicon layer being used as the word line of a memory cell.

Reference numeral 213 represents a P-type substrate, reference numerals 214 and 215 represent a source (S) and drain (D) of an N$^+$ type diffusion layer formed on the substrate 214, respectively, reference numeral 216 represents a contact hole, and reference numeral 217 represents a bit line (BL) of an aluminum layer connected to the drain 216 via the contact hole 217. Reference numeral 218 represents a gate insulating film of 100 angstroms thickness for a floating gate transistor area, and reference numeral 219 represents an insulating film formed between the floating gate 211 and control gate 212, the insulating film having a three layer O—N—O structure (oxide film—nitride film—oxide film) about 200 angstroms in terms of the thickness of an oxide film. Reference numeral 220 represents a field insulating film, and reference numeral 221 represents an interlayer insulating film.

The operation principle will then be described.

In erasing data of a memory cell, the source 214 is applied with an erase voltage 12 V, the drain 215 is set to a floating state, and the control gate 213 is applied with 0 V. With this setting, a high voltage is applied via the thin gate insulating film 18 between the floating gate 2111 and source 214. Electrons are emitted from the floating gate 211 to the source 214 through Fowler-Nordheim tunneling effect, to erase the data. In writing data to a memory cell, the drain 215 is set to about 6 V, the source 214 is set to 0 V, and the control gate 213 is set to 12 V. With this setting, impact ionization occurs near at the drain, and so electrons are injected to the floating gate 211, to write data.

In reading data from a memory cell, the drain 215 is set to 1 V, the source 214 is set to 0 V, and the control gate 213 is set to 5 V. With this setting, the data "0" or "1" is read depending upon a presence/absence of electrons in the floating gate 211.

FIGS. 21A to 25 illustrate the embodiments of how the charge storage capacitor is formed. In these embodiments, a capacitor having a sufficient current supply capability is formed at the output side of the charge pump circuit (booster circuit), and a write current is supplied from this capacitor.

The embodiments will be detailed below.

Figure 21A:
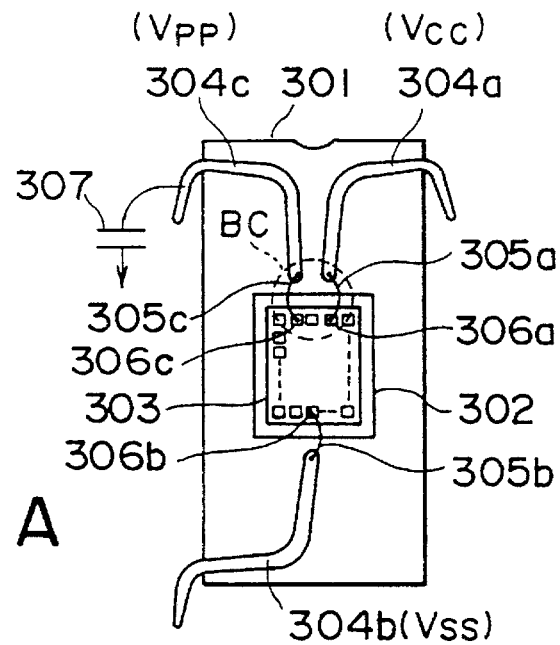
FIGS. 21A and 21B are a plan view and its partially enlarged view of another embodiment of the present invention.
Figure 21B:
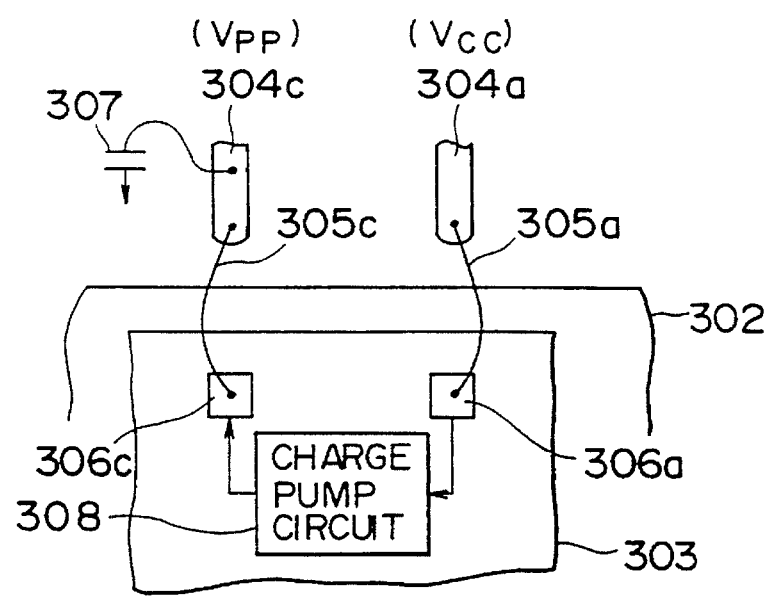

FIGS. 21A and 21B show an example wherein a capacitor is provided outside of a package, and a boosted voltage of the charge pump circuit is stored in the capacitor in the form of electric charges. FIG. 21A is a plan view showing briefly the structure of the entirety of a package 301 as viewed transparently. FIG. 21B is an enlarged view of the area surrounded by a broken line circle BC shown in FIG. 21A. As seen from FIG. 21A, the molded package 301 contains a semiconductor chip 303 fixedly mounted on a bed 302, and a plurality of lead terminals 304a, 304b, 304c, . . . (only 304a, 304b and 304c are shown) electrically connected to the chip 303. The lead terminals 304as to 304c are connected to pad electrodes 306a to 306c on the chip 303 by bonding wires 305a to 305c. The lead terminal 304a is used for the power source $V_{CC}$, the lead terminal 304b is used for the power source $V_{SS}$, and the lead terminal 304c is used for the high potential power source $V_{PP}$. Connected to this lead terminal 304c is a capacitor 307 provided externally of the package 301. As seen from FIG. 21B, a charge pump circuit 308 for boosting the power source potential Vcc to the boosted potential $V_{pp}$ is connected between the pads 306a and 306c. As shown in FIG. 21B, the power source potential $V_{CC}$ is boosted to a potential sufficient for the data write by the charge pump circuit 308. The boosted voltage is supplied via the bonding wire 305c and pin 304c to the external capacitor 307, and the corresponding electric charges are stored in the capacitor 307.

The capacitance value of the external capacitor 307 will then be described. The write current is larger than the erase current, so the following description is directed to the write current by way of example. The electric charge stored in a capacitor is given by Q=C*V, where Q is the stored electric charge, C is the capacitance of the capacitor, and V is a voltage applied across the capacitor. A current I flowing through the capacitor is given from Q=I*t, where t is a time. Therefore, Q=C*V=I*t For example, in the case of a memory cell formed using the 0.8 μm design criterion, a write current about 500 μA per one bit flows. Therefore, if the data "O" is written at the same time for eight bits, a write current 4 mA will flow. It is assumed here that the write time is 100 μs, the write voltage is boosted from 5 V to 13 V, and the data write can be reliably executed even if the voltage drops to 12 V. In such a case, the following equation is satisfied:

C*(13–12)=4 mA*100 μ

Therefore, C=0.4 μF. The write and erase performance quite the same as conventional can be ensured if the charge storage capacitor having a capacitance of about 0.4 μF is used.

Figure 22A:
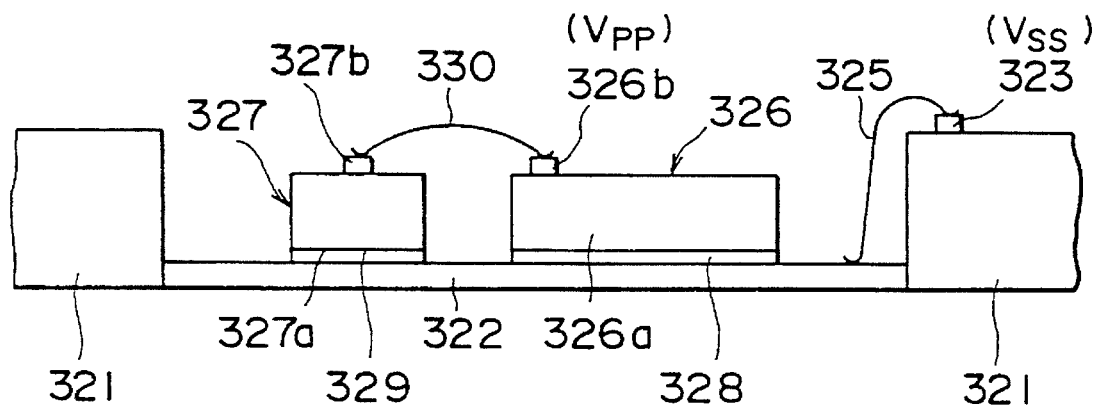
FIGS. 22A and 22B are a cross sectional view and its partially enlarged view of another embodiment of the present invention.
Figure 22B:
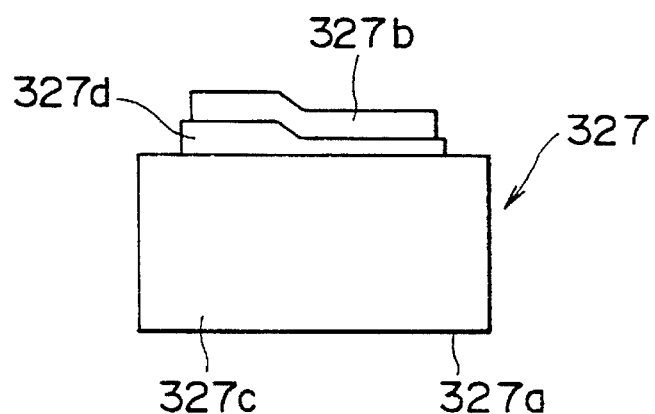

FIGS. 22A and 22B show an example where capacitor is formed on a semiconductor device itself.

In FIG. 22A, reference numeral 321 represents a vessel made of ceramics or the like, and reference numeral 322 represents a conductive bed. A $V_{SS}$ pad 323 on the vessel 321 is connected by a bonding wire 325 to the conductive bed 322. The potential of the bed 322 is fixed to the $V_{SS}$ potential. On the bed 322 there are mounted a semiconductor chip 326 and a capacitor chip 327, with the substrate 326a of the semiconductor chip 326 and one electrode 327a of the capacitor chip 327 being adhesively fixed on conductive mount members 328 and 329. On the upper surface of the semiconductor chip 326 there is provided a pad electrode 326b for the external write power source $V_{PP}$. On the upper surface of the capacitor chip 327 there is mounted the other electrode 327b. The electrodes 326a and 327b are connected by a bonding wire 330. The pad electrode 326b for $V_{PP}$ is applied with a write voltage $V_{PP}$ raised from the power source $V_{CC}$ and obtained by the charge pump circuit formed within the semiconductor chip 326. In this manner, electric charges corresponding to an output voltage of the charge pump circuit are supplied to the capacitor chip 327.

FIG. 22B is an enlarged side view of the capacitor chip 327. As seen from FIG. 22B, the capacitor chip 327 has a silicon substrate 327c. On the upper surface of the substrate 327c there is formed an insulating film. 327d made of $SiO_2$ film or ONO film. The electrode 327b is formed on the film 327d. Part of the insulating film 327d is made thick, the upper surface of which portion is used as the bonding pad.

With the above-described structure, it is not necessary to connect the capacitor to the output side of the write terminal, so that the memory system can be designed without an increase of the device area.

Instead of the semiconductor chip, a commercially available capacitor may be used.

Figure 23:
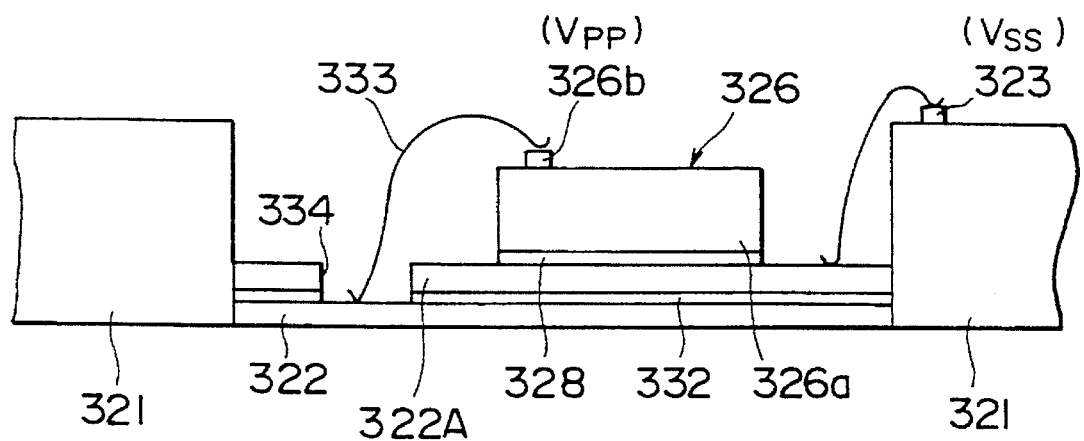
FIG. 23 is a cross sectional view of another embodiment of the present invention.

FIG. 23 shows another embodiment of a capacitor formed on a semiconductor device. In FIG. 23, like elements to those shown in FIG. 22 are represented by using identical reference numerals. Formed on a conductive bed 322 is another conductive bed 322A with a dielectric film 332 made of mica or paraffin interposed between the two beds. Mounted on this bed 322A is a semiconductor chip 326 with a conductive mount member 328 interposed between the bed and chip. A write electrode 326b is connected to the bed 322 by a bonding wire 333. This connection is effected by forming a recess 334 by etching part of the bed 322A and dielectric film 332 and by exposing part of the underlayer bed 322.

Figure 24:
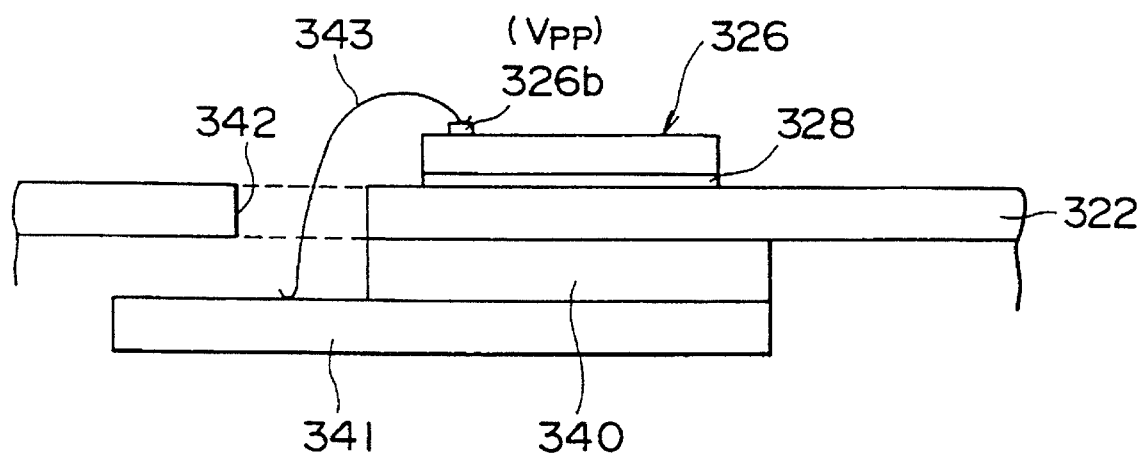
FIG. 24 is a cross sectional view of a further embodiment of the present invention.

FIGS. 24 and 25 show examples using plastic packages.

In FIG. 24, a dielectric layer 340 is formed under a bed 322, a conductive layer 341 being buried under the dielectric layer. A recess is formed in the bed 322 and dielectric layer 340 to expose part of the conductive layer 341. Via this recess 342, a $V_{PP}$ electrode pad 326b on the chip 326 and the part of the conductive layer 341 are connected together by a bonding wire 343 to form a capacitor.

In FIG. 25A, an insulating film 340 is formed on the bottom surface of a bed 322 by means of evaporation. A conductive layer 341 is formed under the film 340. A $V_{PP}$ pad electrode 326b on a chip 326 is connected to a lead terminal 304 by a bonding wire 343A, the lead terminal 304 is connected to the conductive layer 341 by a bonding wire 343B. FIG. 25B is a plan view of FIG. 25A. A cross sectional view taken along line 25—25 in FIG. 25B corresponds to FIG. 25A. The width L of a suspension pin shown in FIG. 25B may be made wider.

Figure 26:
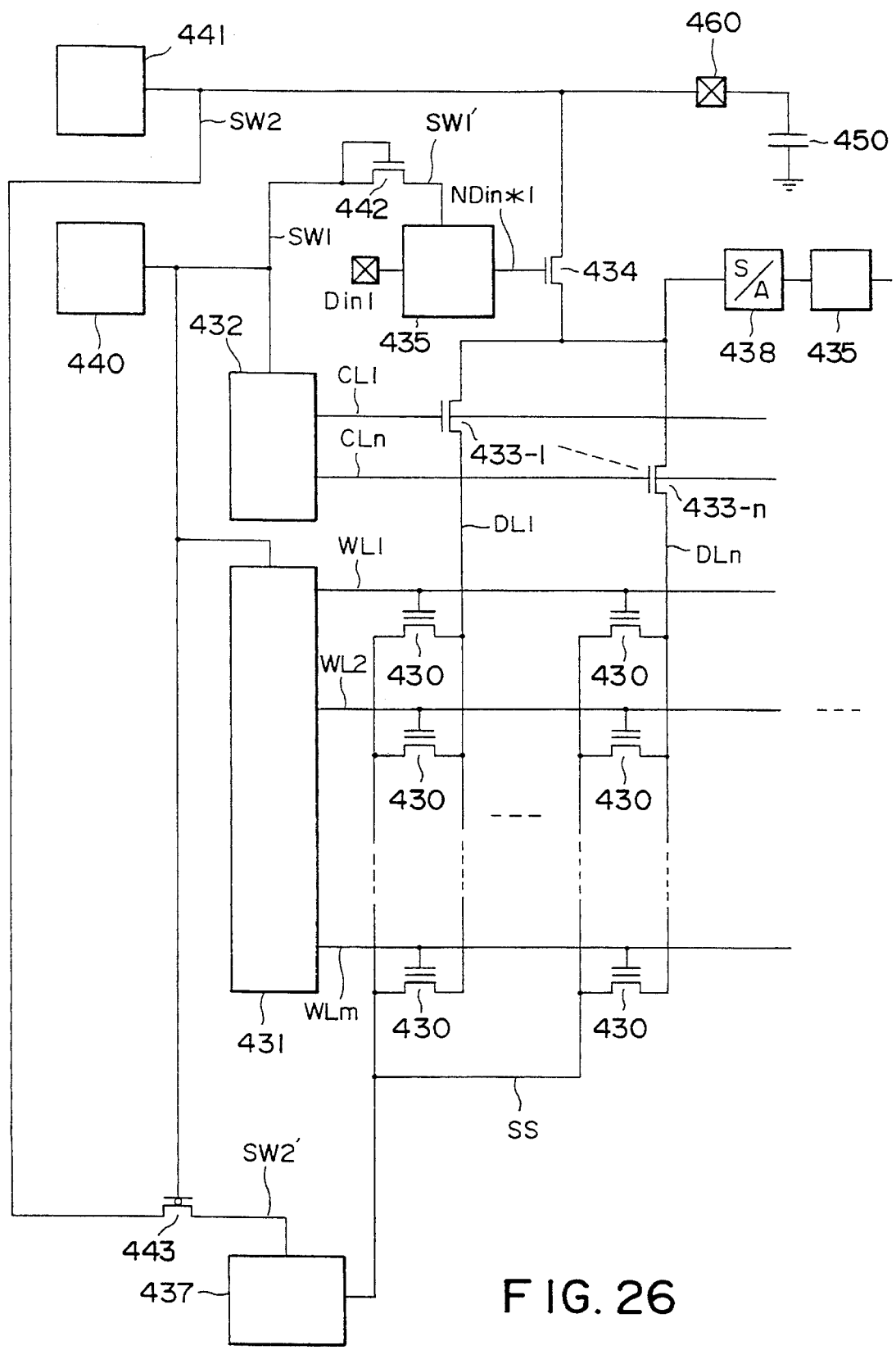
FIG. 26 is a circuit diagram of an embodiment of the present invention.
Figure 52:
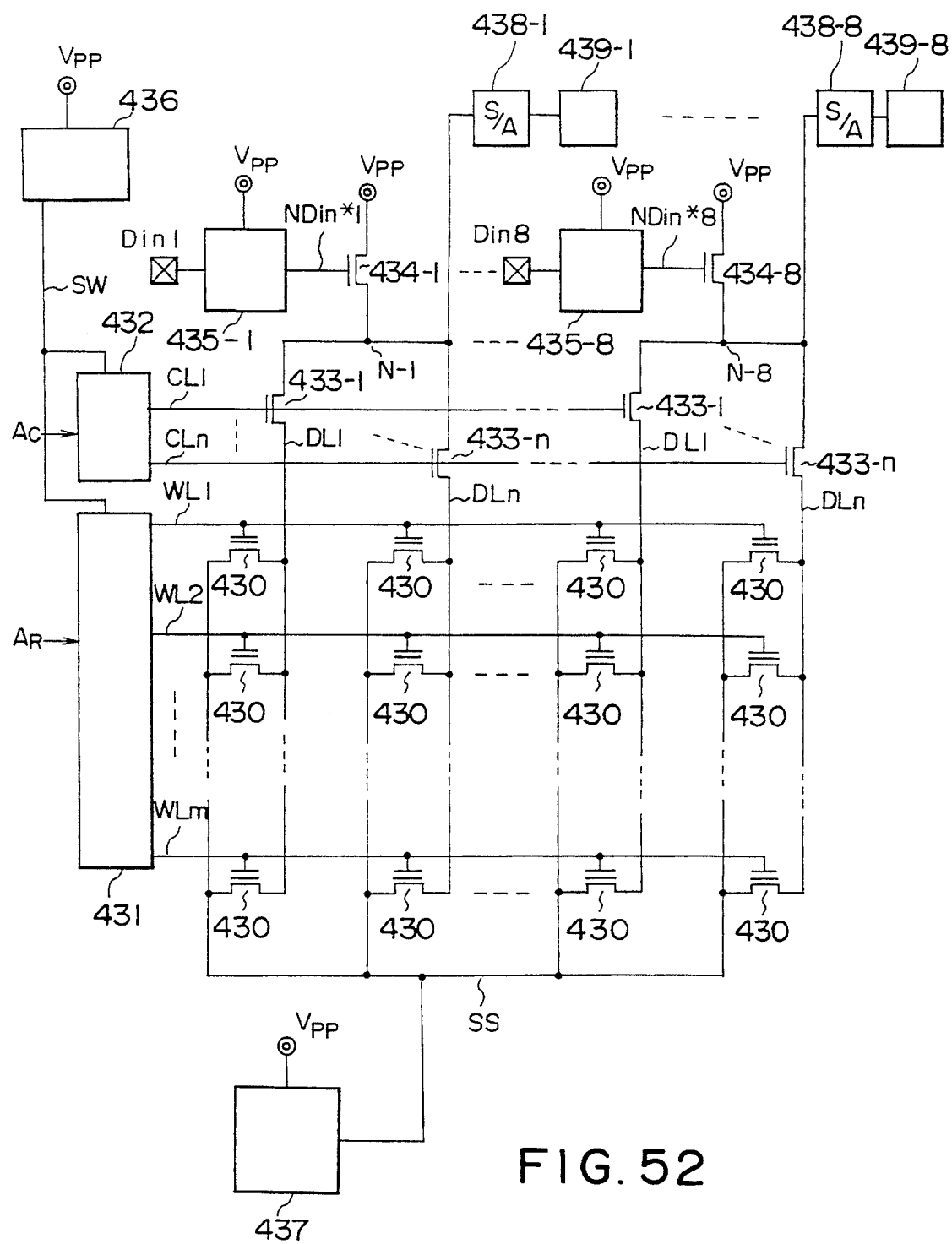
FIG. 52 is a circuit diagram showing the structure of a conventional EEPROM.
Figure 53:
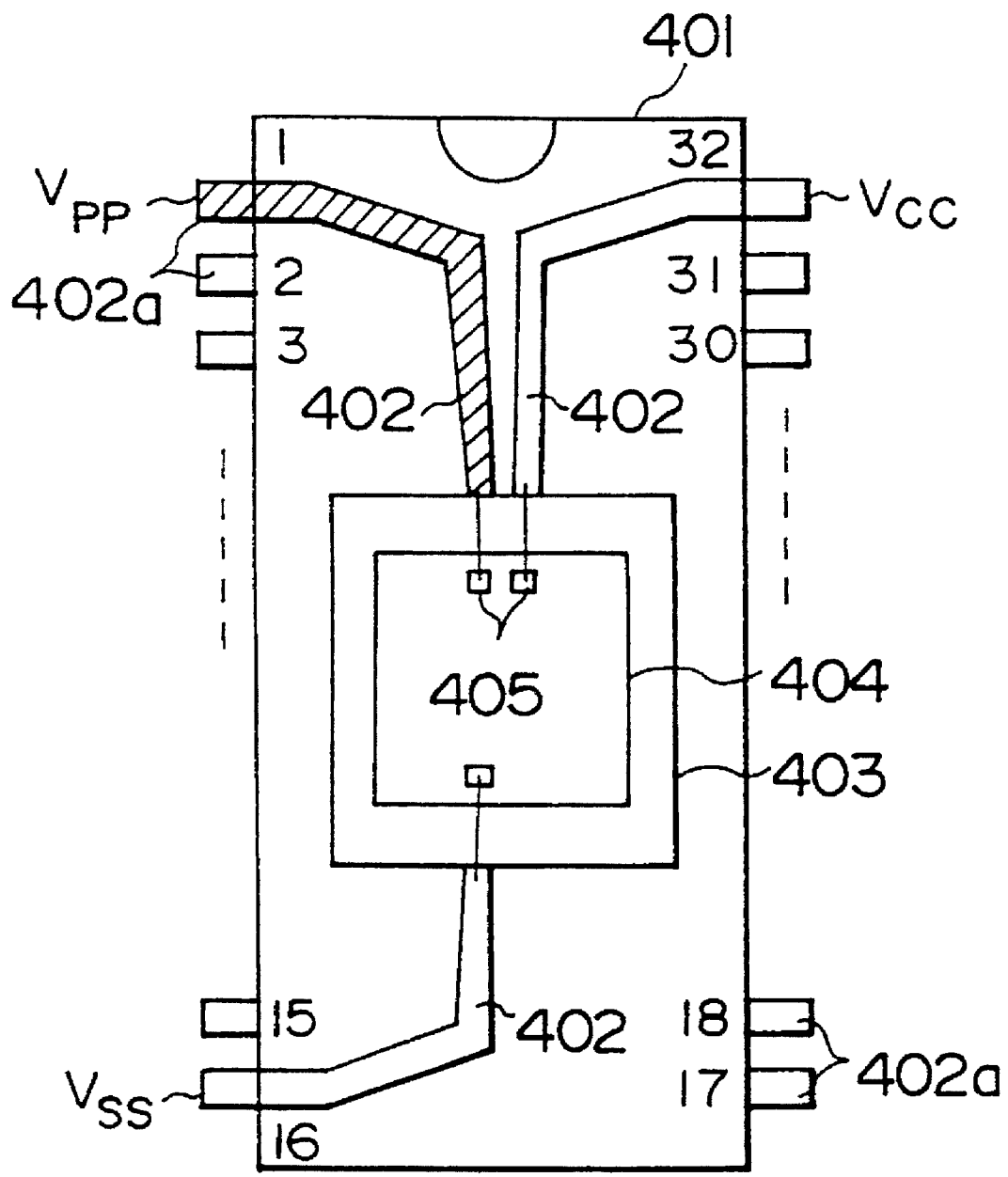
FIG. 53 is a plan view showing a conventional EEPROM requiring a supply of a program voltage.

FIG. 26 shows the structure of an embodiment of a non-volatile semiconductor memory device according to the present invention. In order to make the embodiment easy to understand, the circuit portion for one bit output is shown, although the circuit for eight bits is generally used as shown in FIG. 52. In FIG. 26, like elements to those shown in FIG. 52 are represented by using identical reference numerals and the detailed description thereof is omitted. The different points from FIG. 52 are as follows. A first and second charge pump circuits 440 and 441 are provided for obtaining a high voltage from 5 V $V_{CC}$. An output SW1 of the first charge pump circuit 440 is supplied to a row decoder 431, a column decoder 432, and a write data control circuit 435 via an enhancement type transistor 442. An output SW2 of the second charge pump circuit 441 is supplied to the drains of a memory cell via a write load transistor 434, and a common source of memory cells via an intrinsic type transistor 443 and source voltage control circuit 347. The output SW2 of the second charge pump circuit 441 is also applied to an external capacitor 450 via an external output terminal 460. The enhancement type transistor 442 and intrinsic type transistor 443 are voltage controlling elements.

Figure 27:
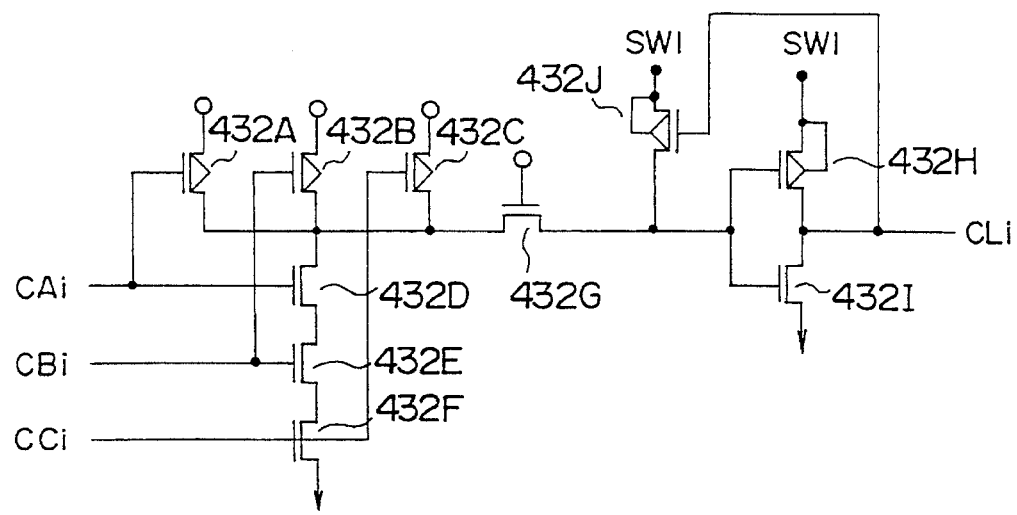
FIG. 27 is a circuit diagram showing the structure of the column decoder shown in FIG. 26.

FIG. 27 is a circuit diagram showing the details of the column decoder 432.

The decoder unit is constructed of an NAND circuit having p-channel transistors 432A to 432C connected in parallel and N-channel transistors 432D to 432F connected in series, the gates of the P-channel transistors 432A to 432C being connected in common to the corresponding gates of the N-channel transistors 432D to 432F. The common gate connection points are supplied with outputs CAi, CBi, and CCi of a pre-decoder (not shown) which receives an output of an address buffer circuit (not shown). An output of the decoder is applied via an enhancement type transistor 432G to a pull-up P-channel transistor 432J where it is pulled up and outputted as a column decoder output CL1 via a buffer constructed of a P-channel transistor 432H and N-channel transistor 432I. The sources connected to the gates of the transistors 432J and 432H are supplied with the output SW1 of the first charge pump circuit 440. During the write operation, the output SW1 is about 12 V, and so the output CLi of the row decoder becomes 12 V for the selected row. The output CLi of the row decoder becomes 0 V for non-selected rows. During the read operation, SW1 becomes 5 V, and so the outputs CLi for selected/non-selected rows become 5 V/0 V.

Figure 28:
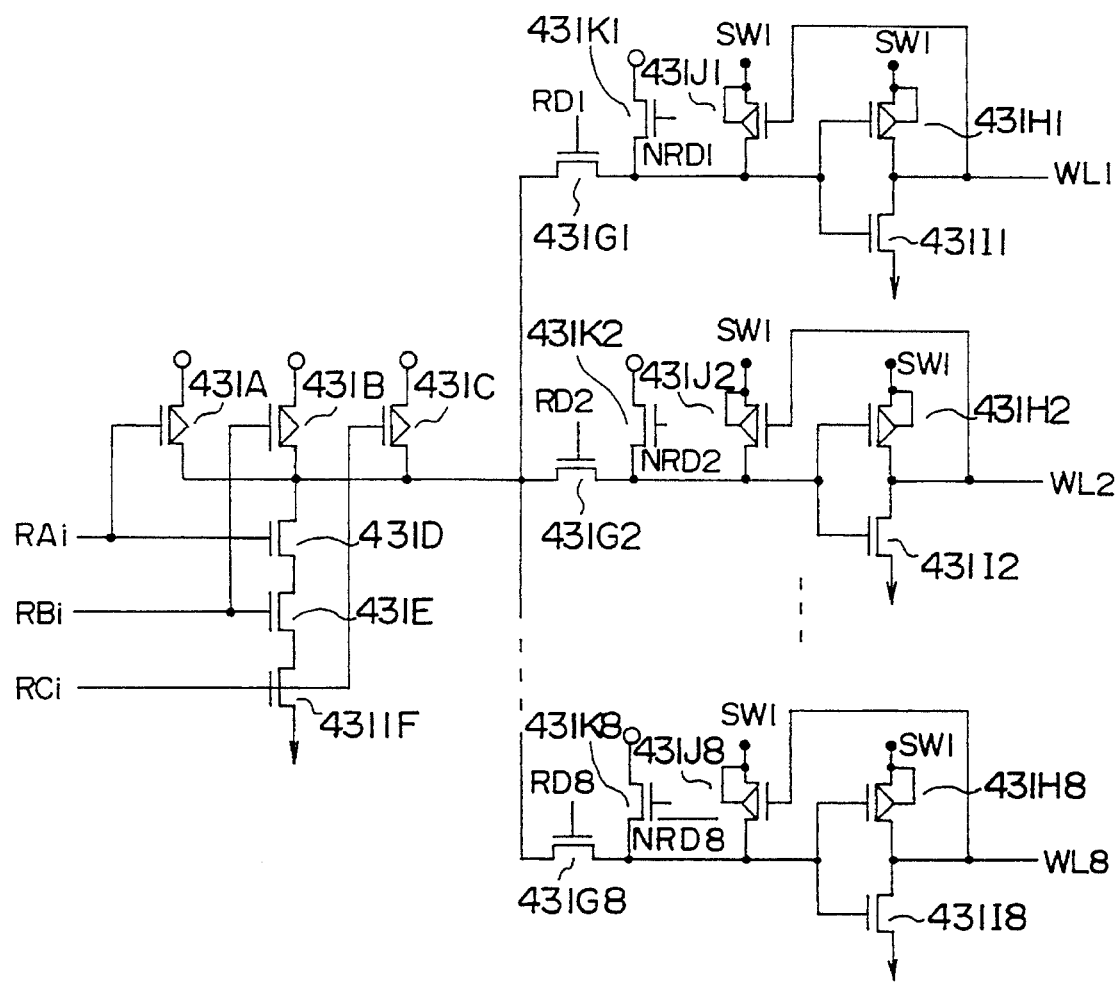
FIG. 28 is a circuit diagram showing the row decoder shown in FIG. 26.

FIG. 28 is a circuit diagram showing the details of the row decoder 431.

The decoder unit is constructed of an NAND circuit having p-channel transistors 431A to 431C connected in parallel and N-channel transistor 431D to 431F connected tin series, the gates of the P-channel transistors 431A to 431C being connected in common to the corresponding gates of the N-channel transistors 431D to 4321F. The common gate connection points are supplied with address signals ARi to RDi to deliver a decode output.

This decode output is selected by select transistor 431G1 to 431G8 to which address signals RD1 to RD8 are applied. The select transistors 431G1 to 431G8 also function as level shift transistors. Connected to the output side of the select transistors are N-channel transistors 431K1 to 431K8 to which address signals NRD1 to NRD8 (inverted signals RD1 to RD8) are applied. A circuit having transistors 431H to 431J like the circuit having the transistors 432H to 432J shown in FIG. 27 is provided to each word line.

Figure 29:
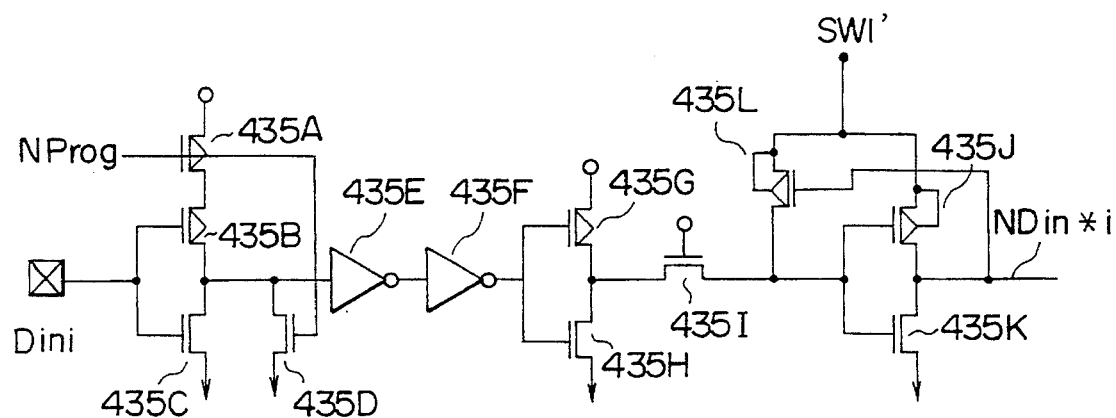
FIG. 29 is a circuit diagram showing the structure of the write data control circuit shown in FIG. 1.

FIG. 29 shows the details of the write data control circuit 435. A NAND circuit is provided at the first stage. This NAND circuit is constructed of P-channel transistors 435A and 435B and N-channel transistors 435C and 325D. An input signal Nprog takes "0" level in the write operation mode, and "1" level in the other operation modes. In the other operation modes, the circuit is inactivated irrespective of an input signal Dini at an external terminal, to set an output NDin*1 to "0" level. An output of the NAND circuit is sent to inverters 435E and 435F, an inverter constructed of a P-channel transistor 435G and an N-channel transistor 435H, a level shift transistor 435I, and to a circuit having transistor 435J to 435L like the circuit having the transistors 432H to 432J shown in FIG. 27. The sources of the P-channel transistors 435J and 435L are supplied with a signal SW1' from the first charge pump circuit 440. During the write operation, the signal SW1' is about 9 V, and so for the input data Dini "0", the output NDin*i becomes 9 V.

Figure 30:
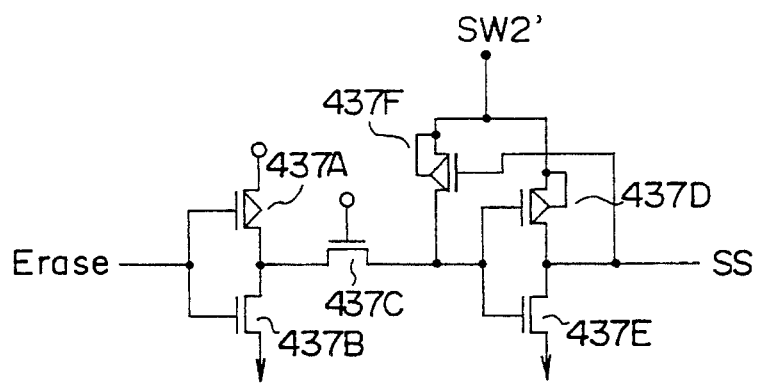
FIG. 30 is a circuit diagram showing the structure of the source voltage control circuit shown in FIG. 26.

FIG. 30 shows a source voltage control circuit.

A signal Erase takes "1" in the erase mode, and "0" in the other modes. The circuit has an inverter constructed of a P-channel transistor 437A and N-channel transistor 437LB to the gates of which the signal Erase is supplied, a level shift transistor 437C, and transistors 437D to 437F like the transistors 432H to 432J shown in FIG. 27, the circuit delivering an output SS. The sources of the transistors 737F and 437D are supplied with a signal SW2' of the second charge pump circuit 441. Therefore, in the erase mode, the output 1SS becomes about 12 V.

Figure 31:
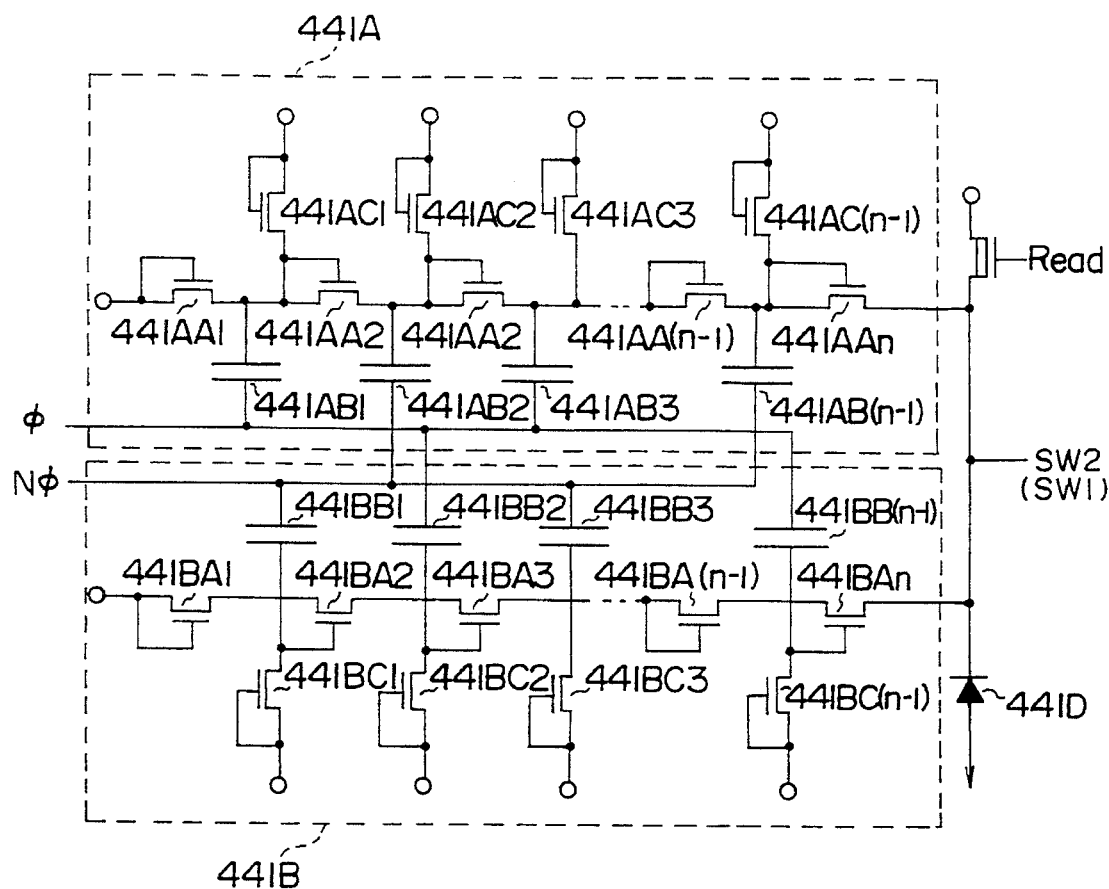
FIG. 31 is a circuit diagram showing the structure of the charge pump circuit shown in FIG. 26.

FIG. 31 is a circuit diagram showing an example of the second charge pump circuit 441. This circuit has two charge pump circuits 441A and 441B. The charge pump circuit 441A will be described. Connected to the connection nodes of serially connected n-stage transistors 441AA1 to 441AAn are capacitors 441AB1 to 441AB(n-1). Applied to the other ends of the capacitors are outputs ∅ and N∅ of an oscillator (not shown) which are in opposite phase. Between each connection node of the transistors 441AA1 to 441AAn and the next stage transistor, a transistor is provided whose gate is connected to the voltage source $V_{CC}$, whose source and gate are connected together, and whose drain is connected to the connection node and gate of the next stage transistor. Although the charge pump circuits 441A and 441B have the same structure, the input order of ∅ and N∅ is different and their phase is opposite. Therefore, the current supply capability of each charge pump circuit can be doubled. The last stages of the charge pump circuits 441A and 441B are connected in common to provide an output WS2 which is coupled to a depletion type transistor 440C whose gate is supplied with a signal Read. This signal Read becomes 5 V in the read mode, and 0 V in the write and erase modes. The output WS2 is also coupled to the cathode of a diode 441D whose junction breakdown voltage is set to 15 V for example to prevent an excessively high potential.

The second charge pump circuit 441 has been described above. The first charge pump circuit 440 has the same structure, and the junction breakdown voltage of the diode 441D is also set to 12 V.

Figure 32:
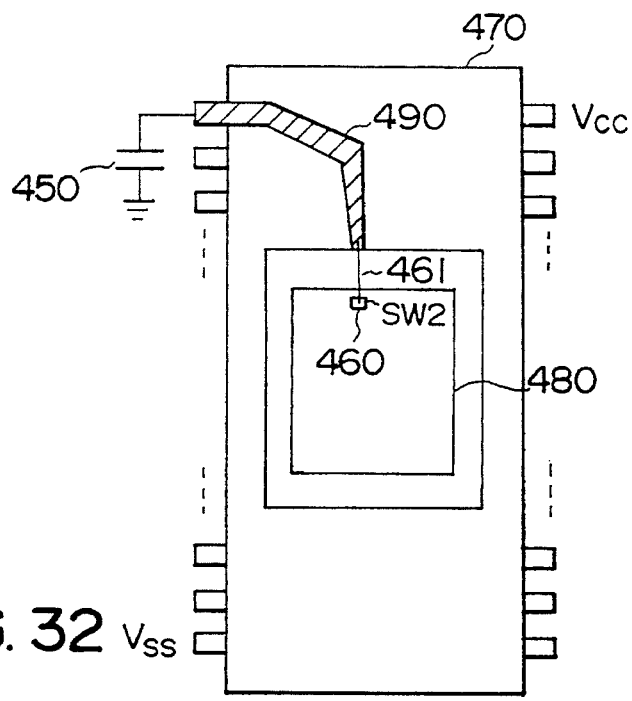
FIG. 32 is a plan view showing the connection between a chip and a capacitor.

FIG. 32 shows a package 470 with a non-volatile semiconductor memory 480 being fabricated therein. An external terminal 460 on the chip from which SW2 is outputted and a lead frame 490 of the package are connected by a bonding wire 461. A capacitor 450 in the form of a discrete component is mounted on a printed circuit board or the like on which the chip 480 is mounted, the capacitor 450 being electrically connected to the chip 480.

Figure 33:
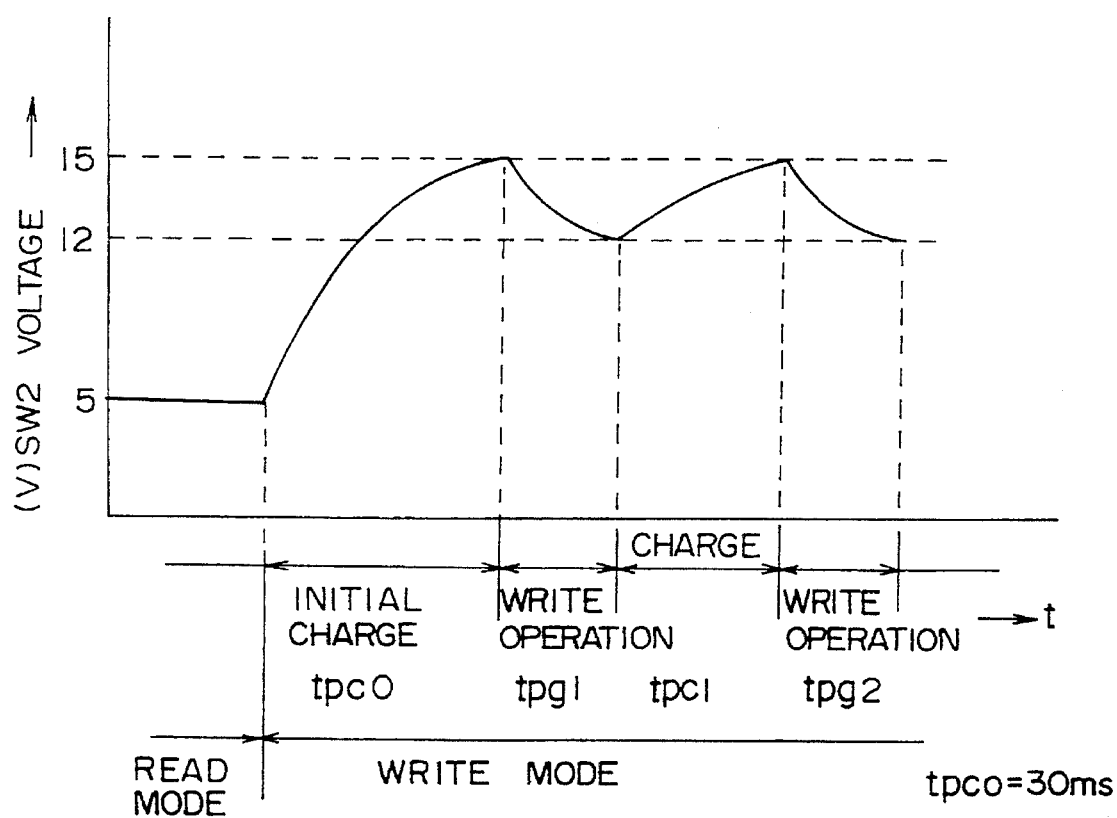
FIG. 33 is a graph showing a voltage change during the operation of the embodiment shown in FIG. 26.

Next, the operation of the non-volatile semiconductor memory of the present invention will be described with reference to FIG. 33 showing a waveform of a voltage SW2 boosted during the write operation.

In the read mode, the signal Read is 5 V, and so the output SW2 of the second charge pump circuit 441 is charged to 5 V.

When the write mode enters, electric charges are stored as the initial charge in the capacitor 450 during a time period $t_{pco}$. As SW2 is charged to 15 V, the write operation starts and data is sequentially written in memory cells. After a time period $t_{pg1}$, electric charges in the capacitor 450 are discharged. When the voltage SW2 becomes 12 V or lower, the write operation stops and the charge operation again starts. After a time period $t_{pc1}$, the charge is completed and SW2 reaches 15 V. Then, the next write operation starts, and during a time period $t_{pg2}$ data is sequentially written in memory cells until SW2 lowers to 12 V. The above operations are repeated to write data to all memory cells. Specifically, if memory data is written to memory cells for eight bits at the same time during the write operation, a current of about 5 mA for eight bits will flow through the memory cells. In the charge pump circuit shown in FIG. 31, assuming that the capacitance of each capacitor for charge pumping is set to 10 pF, the oscillation period of ∅ is set to 200 ms, and the capacitance of the capacitor 450 is set to 0.5 µF, it takes about 30 ms in order to charge SW2 from 5 V to 15 V, thus $t_{pco}$=30 ms.

A write time required to write data to one memory cell is about 10 µs assuming that the threshold of the memory cell becomes 8 V. If the memory cell current of 5 mA is required, during the period $t_{pg1}$ of about 300 µs while SW2 drops from 15 V to 12 V, data can be written in 30 times*8 cells=240 cells. The period $t_{pc1}$ while SW2 rises from 12 V to 15 V is about 5 ms. During one cycle of $t_{pg1}+t_{pc1}$=5.3 ms, data can be written in memory cells of 30 bytes (30*8 cells). Therefore, an average write time is about 177 µs/byte which is a sufficient value in practical use, considering that the ordinary operation of an EEPROM is 100 µs to 1 ms per one byte.

In erasing data, a high voltage is applied to the source to emit electrons from the floating gate to the source through the Fowler-Nordheim tunneling effect. In this case, since the gate oxide film is as thin as 100 angstroms, a high electric field is applied to the edge portion of the gate side of the source n+ diffusion layer. Therefore, a so-called band-to-band tunnel current flows. For example, if data in all memory cells of 4M bits is erased in a flash manner, a current about several mA will flow at its peak. As the erasing operation advances, the electric field becomes weak and the band-to-band current ceases, flowing only a Fowler-Nordheim tunnel current which is a very small current. Also in this case, similar to the write operation, the erase operation is performed by repeating the charge and discharge operations with respect to the level of SW2. The level of SW2 reciprocally changes between 15 V and 12 V. However, since SW2' is made a constant voltage by the transistor 443, the erase characteristic is made uniform.

Figure 34:
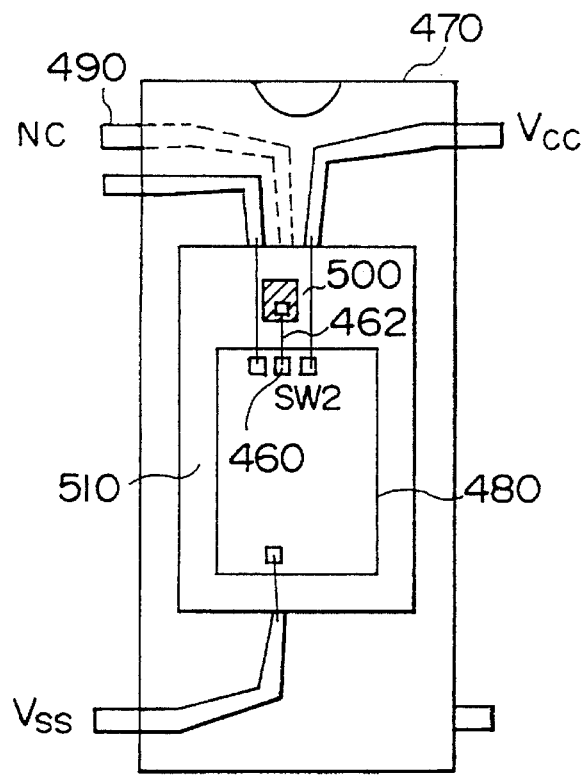
FIG. 34 is a plan view showing an embodiment of a capacitor built in a package as a dedicated chip.

FIG. 34 shows another embodiment of the present invention.

In this embodiment, instead of using the external capacitor 450, a specific capacitor chip 500 as well as a main chip 480 is mounted on a lead frame bed (island) 510, the capacitor chip being connected to an external terminal 460 for SW2 by a bonding wire 462. With such an arrangement, one of leads 490 becomes a non-connect terminal, increasing the degree of freedom in use.

Figure 35:
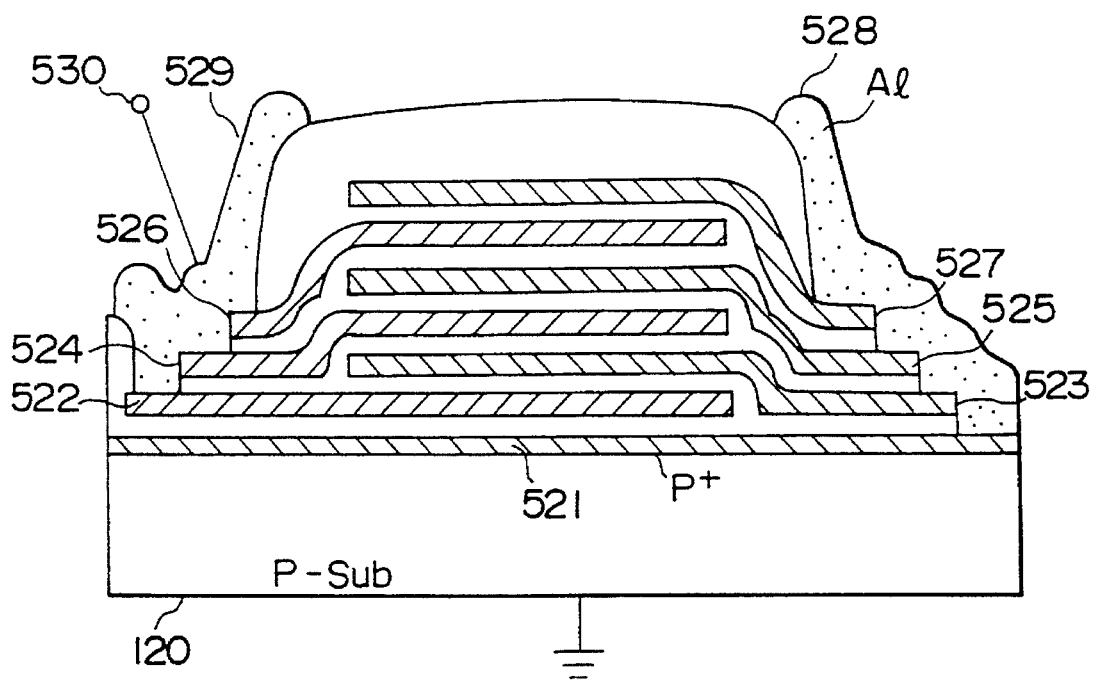
FIG. 35 is a cross sectional view showing the structure of a chip with a capacitor.

A capacitor is formed in the specific capacitor chip in the following manner. As shown in FIG. 35, a $P^+$ layer 521 is formed on a p-type substrate 520, Polysilicon layers 522 to 527 are laminated one upon another while sandwiching an insulating film O—N—O (Oxide-Nitride-Oxide) for example to insulate each polysilicon layer 522 to 527. The $P^+$ layer 121 and polysilicon layers 523, 525 and 527 are connected together by an Al wiring layer 528, and the polysilicon layers 522, 524, and 526 are connected together by an Al wiring layer 529. A capacitor is therefore formed between the substrate 520 and a terminal 530 connected to the Al wiring layer 529. For example, assuming that the thickness of the insulating film O—N—O is 100 angstroms in terms of an oxide film thickness, and the number of capacitor electrodes is 10, then a chip area necessary for a capacitance of 0.1 µF is about 2.9 mm² or a 1.7 mm*1.7 mm square. Therefore, this specific capacitor ship can be mounted on the bed together with the main chip.

In order to mount the capacitor chip, the substrate 520 is fixedly and directly mounted on the lead frame bed by using a conductive adhesive agent. The bed is usually grounded so that no particular wiring is needed.

Figure 36:
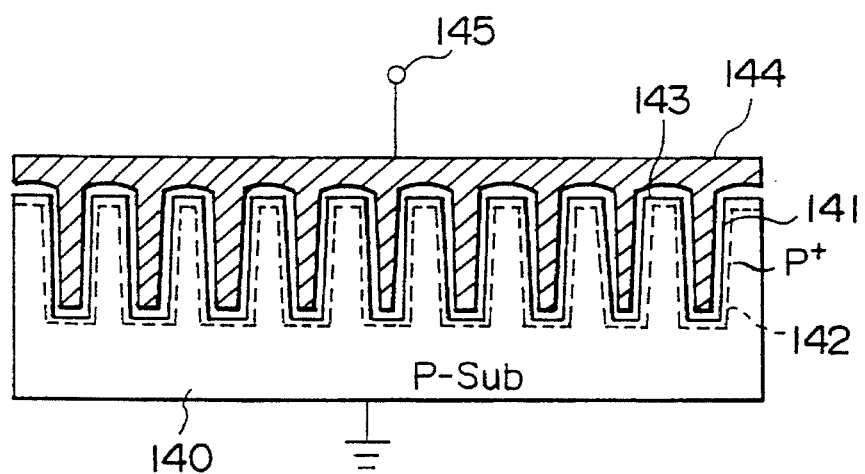
FIG. 36 is a cross sectional view showing a capacitor formed in a trench structure.

FIG. 36 shows another example of the capacitor chip. A plurality of trenches 141 are formed on a substrate 140. A P⁺ layer 142 is formed on the surface of the trenches. Then an insulating film (O—N—O) 143 is formed on the layer 142. Thereafter, a polysilicon electrode layer 144 is formed on the insulating film within and over the trenches. A capacitor is therefore formed between the substrate and a terminal 145 connected to the polysilicon electrode layer 144.

For example, assuming that the width and interval of the trenches are 1 µm, the depth is 6 µm, and the thickness of the insulating film 143 is 100 angstroms, a chip area necessary for a 0.1 µF capacitance is about 4 mm² or a 2.0 mm*2.0 mm square. This size satisfies that the main chip and capacitor chip both can be mounted on a bed.

Since this capacitor can be formed by simple processes, it may be formed on a main chip. In order to form the capacitor on the main chip, only the process of forming trenches and a process of forming an insulating film are additionally used. In the case of a EEPROM of 4 M bits using the 0.7 µm, design criterion, a chip area becomes about 80 mm². However, a capacitor area of 4 mm² is about 5% that it hardly influences the main chip area.

Figure 37:
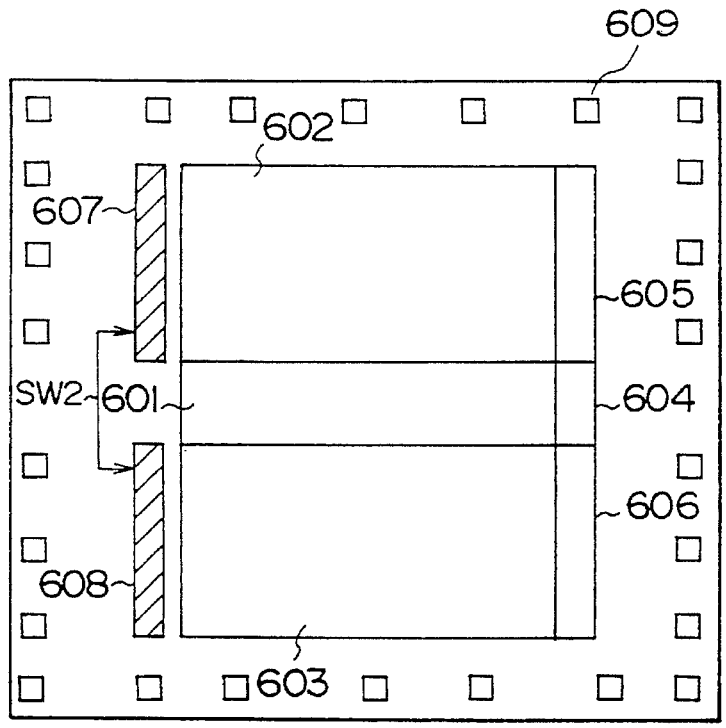
FIGS. 37 and 38 are diagrams showing the layout of a chip with a capacitor.

FIG. 37 shows an example of a chip layout having a capacitor formed on the chip. In this chip 600, cell array areas 602 and 603 are formed above and under a row decoder area 601. On the right of the cell array areas, there are formed a column decoder 604 and column select gates 605 and 606. A capacitor area may be set at an area 607 or 608 at the side of the cell array areas 602 and 603 which area does not obstruct the layout of peripheral circuits. The capacitor area may be set distributively to dead spaces such as between wirings or at the side of a pad 609.

Figure 38:
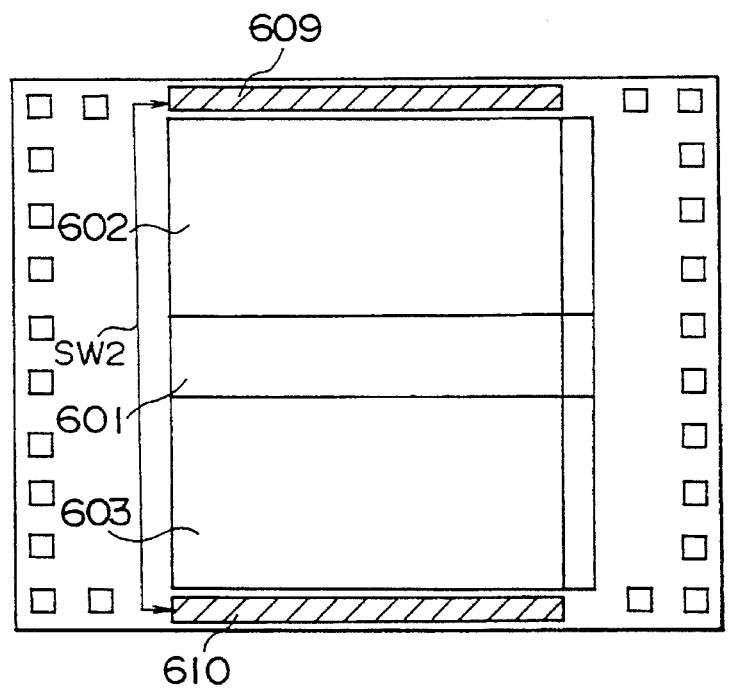

FIG. 38 shows another example of the capacitor layout practiced from the above-described viewpoint. Similar to the layout shown in FIG. 37, cell arrays 602 and 603 are disposed above and under a row decoder 601. Pads 609 are concentrated to the right and left areas of the chip 600, and a capacitor area is disposed under power/signal wiring areas 609 and 610 above and below the cell arrays 602 and 603. Since the side area of the cell is occupied only by power/signal wirings, under this aluminum wiring area a capacitor such as shown in FIG. 36 can be buried. It is therefore possible to form a capacitor without scarcely increasing a chip area while using the chip space effectively.

Figure 39:
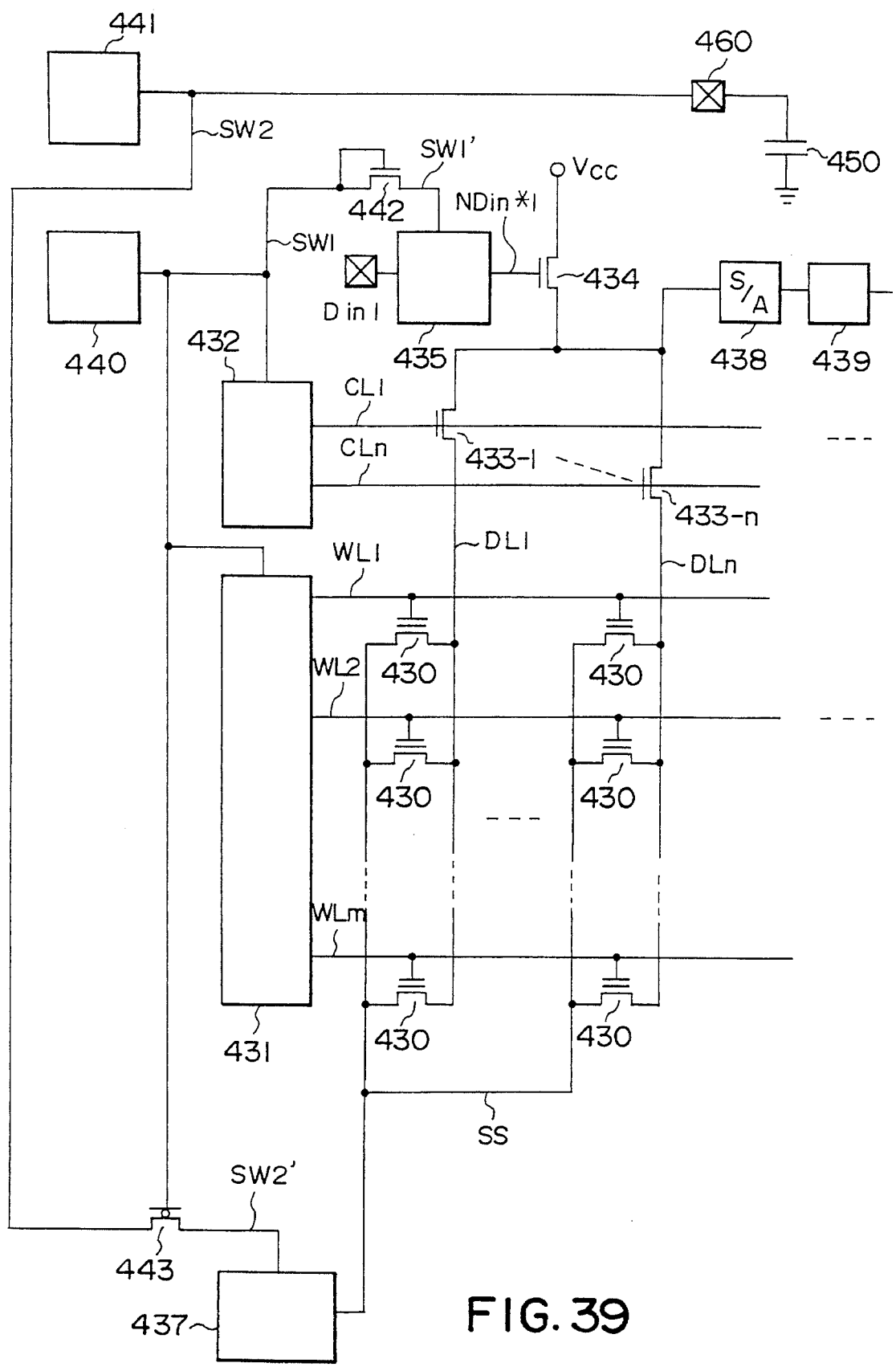
FIG. 39 is a circuit diagram showing another embodiment of the present invention.

FIG. 39 is a circuit diagram showing another embodiment of the present invention. This embodiment is almost the same as that shown in FIG. 26, so that like elements are represented by using identical reference numerals and the detailed description thereof is omitted. In the embodiment shown in FIG. 26, SW 2 is applied to the drain of the enhancement type write transistor 434. A high voltage is applied to the gate, and a voltage 6 to 7 V is applied to the drain of a memory cell to perform the write operation. If integration becomes fine more and more, a drain voltage of about 5 V can suffice to execute the write operation. For this reason, in the embodiment shown in FIG. 37, the drain of the transistor 434 is connected to $V_{CC}$ power source (5 V). As a result, the charge pump circuit 441 operates only during the erase mode to supply SW2 to the source voltage control circuit 437.

Figure 40:
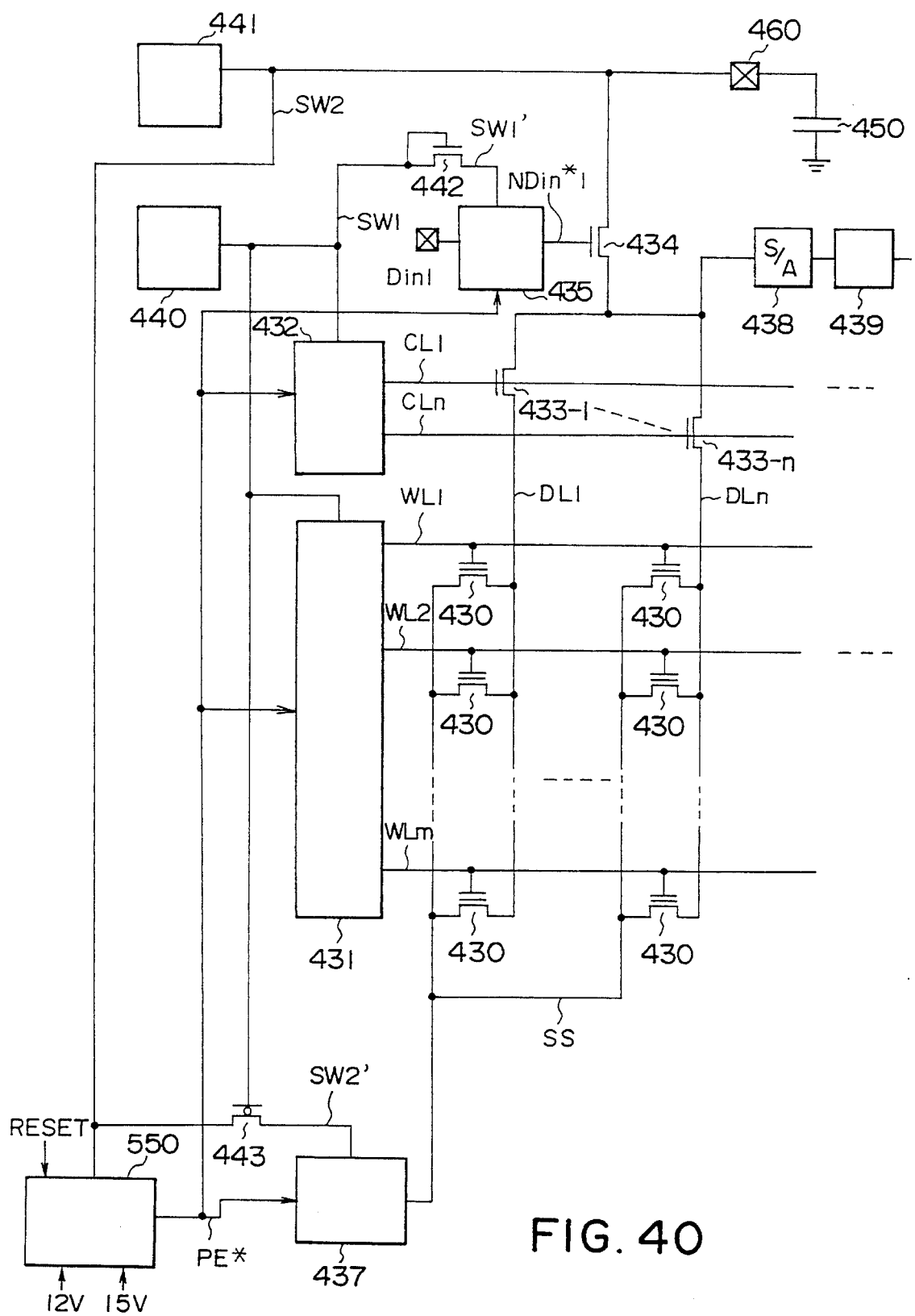
FIG. 40 is a circuit diagram of another embodiment of the present invention, wherein a boosted voltage is detected.

FIG. 40 is a circuit diagram showing another embodiment of the present invention.

In this embodiment the voltage WS2 is detected to judge whether the write or erase operation is possible or inhibited, to thereby control the write and erase operations.

To this end, there is provided a boosted voltage detector circuit 550. In this circuit 550, the internally generated reference voltages 12 V and 15 V are compared with SW2 to judge whether SW2 is between the range of 12 V to 15 V. Specifically, the boosted voltage detector circuit 550 outputs a write/erase enable signal PE* of "1" when the boosted voltage SW2 becomes 15 V or higher, and PE* of "O" when it lowers to 12 V or less. This signal PE* is supplied to the data control circuit 435, row decoder 432, column decoder 431, and source voltage control circuit 437 for the control thereof.

A signal RESET inputted to the boosted voltage detector circuit 550 resets the signal PE* to "0" at the start of the write or erase operation. If this PE* signal is outputted to the external circuit of the chip to inform the control unit such as a CPU of the enable or disable state of the write and erase operations, the system control becomes easy.

Figure 41:
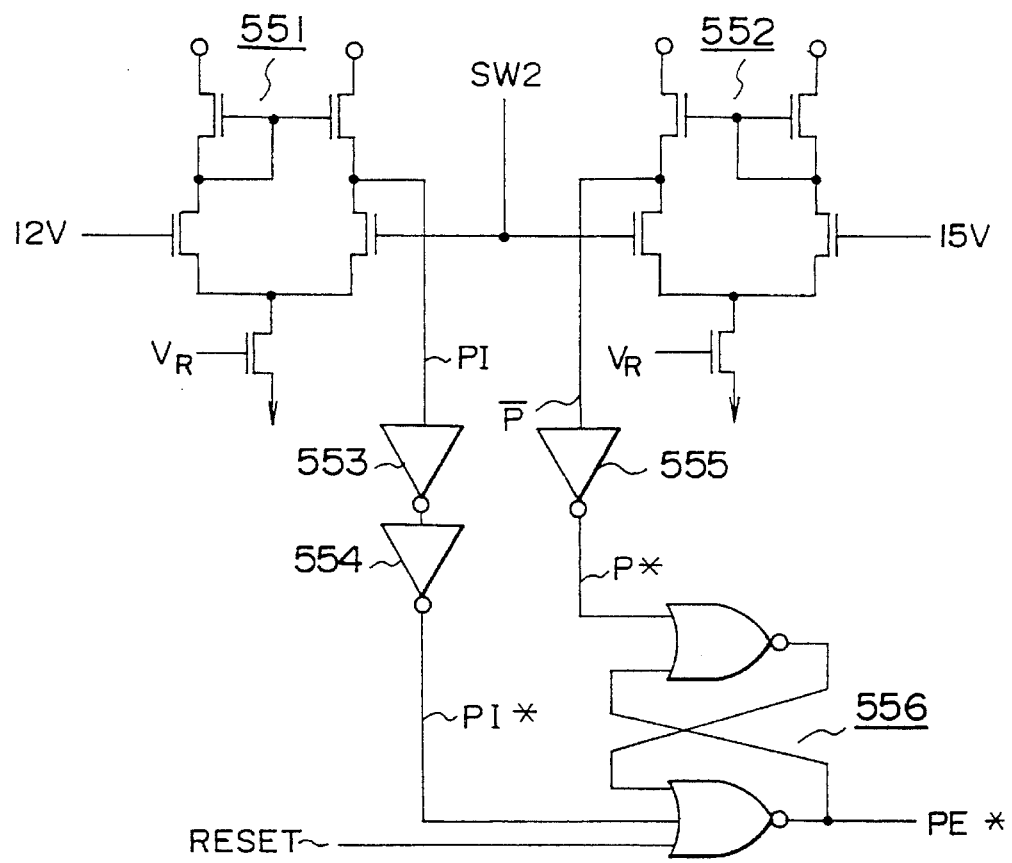
FIG. 41 is a circuit diagram showing the structure of a boosted voltage detector circuit.

FIG. 41 is a circuit diagram showing an example of the boosted voltage detector circuit 550 shown in FIG. 40.

This circuit has first and second differential amplifiers 551 and 552. The first differential amplifier 551 compares the voltage SW2 with the reference voltage 12 V, and output a program disabled signal PI which takes "1" if SW2 is lower than 12 V and "0" if SW2 is higher than 12 V. The second differential amplifier 552 compares the voltage SW2 with the reference voltage 15 V, and outputs a signal P which takes "1" if SW2 is lower than 15 V and "O" if SW2 is higher than 15 V. A signal PI* obtained by amplifying the signal PI by two stage inverters 553 and 554 and a signal P* obtained by amplifying the signal P by an inverter 555 are inputted to a flip-flop 556 to obtain a write/erase enable signal PE*.

Figure 42:
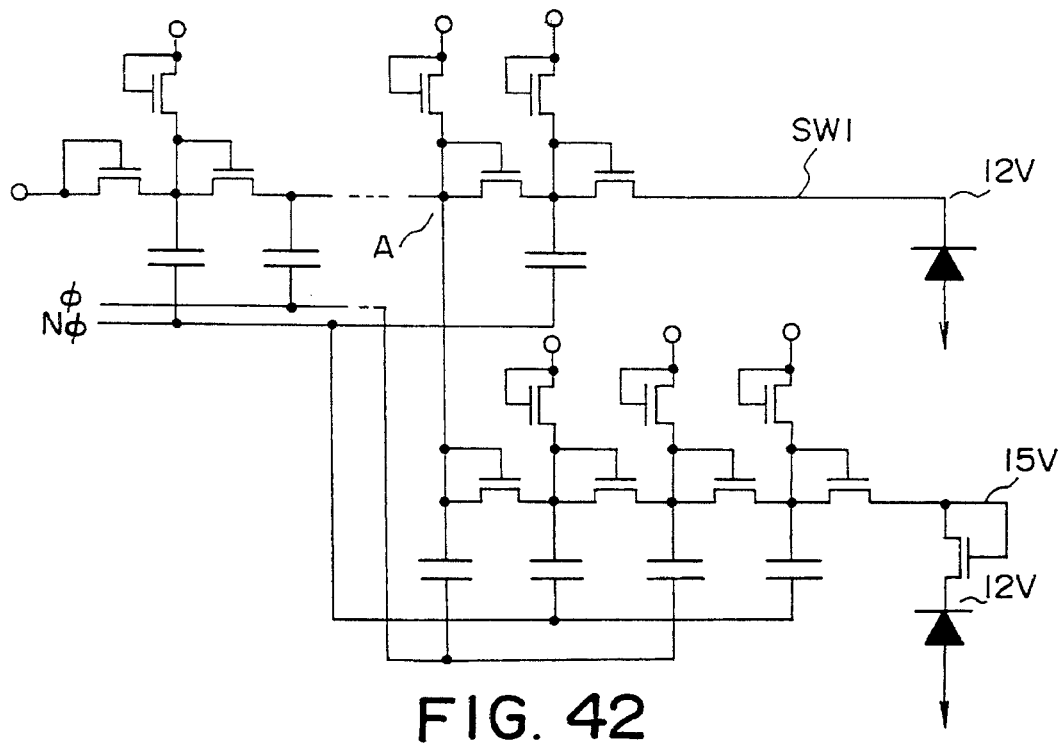
FIG. 42 is a circuit diagram showing the structure of the circuit for generating a reference voltage shown in FIG. 40.

FIG. 42 is a diagram of a circuit for obtaining the reference voltages 12 V and 15 V to be applied to the boosted voltage detector circuit 150.

This circuit is fundamentally the same as that shown in FIG. 31. As the reference voltage 12 V, the stabilized 12 V of SW1 is used. The charge pump circuit for obtaining SW1 is branched, and a four stage charge pump circuit is provided which is connected to a node A one node before the last stage of the SW1 charge pump circuit. A limiter circuit is connected to the output side of the four stage charge pump circuit to obtain the reference voltage 15 V, the limiter circuit being constructed for example of a serially connected diode and transistor.

In this limiter circuit the diode is a 12 V zener diode. This voltage 12 V added to the threshold drop of 3 V of an enhancement type transistor, generates the reference voltage 15 V. Although a 15 V zener diode may be used, additional processes are required to form such a diode, resulting in a complicated manufacturing processes. For this reason, a 12 V zener diode is used.

Figure 43:
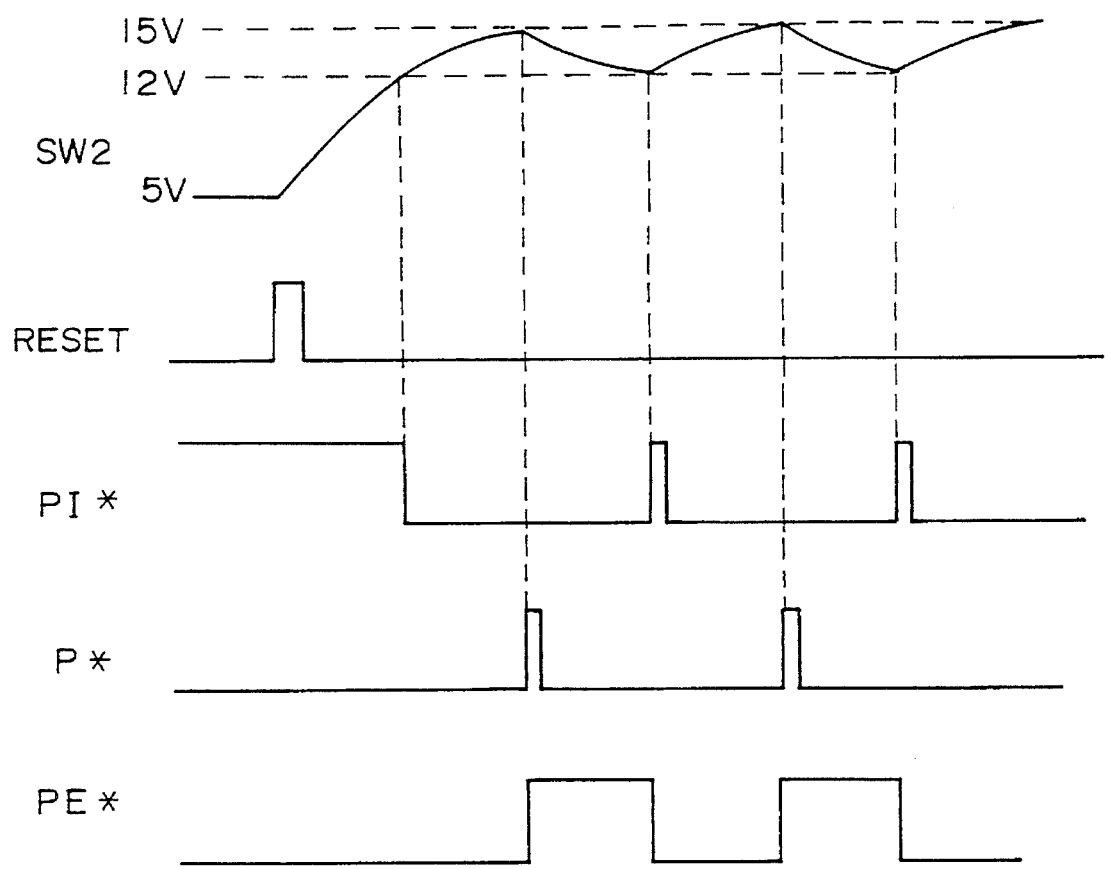
FIG. 43 is a diagram showing a voltage change during the operation of the embodiment shown in FIG. 40.

The operation of the circuit shown in FIG. 40 will be described with reference to the timing chart of FIG. 43.

At the start of the write or erase operation, the signal RESET takes "1" so that the signal PE* is reset to "0". At this time, SW2 is 5 V. As SW2 rises and reaches 12 V, the signals PI and PI* of the first differential amplifier 551 change from "1" to "0". As SW2 further rises to 15 V, an output of the second differential amplifier is inverted so that the signal P* takes "1" and the flip-flop is inverted to make the signal PE* take "1". This signal PE* is supplied to the write data control circuit 435, row decoder 432, column decoder 431, and source voltage control circuit 437 to thereby set them to the write/erase enable state. Therefore, the write/erase operation starts and the voltage SW2 lowers. It is to be noted that the time period while the voltage SW2 becomes in excess of 15 V is a very short duration and so that signal P* returns back to "0" at once. As the discharge of SW2 continues and when becomes lower than 12 V, the differential amplifier 551 inverts and the signal PI* takes "1" to enter the write/erase disable state. The PE* signal is supplied to the write data control circuit 435, row decoder 432, column decoder 431d, source voltage control circuit 437 to set them to the write/erase disable state. During this period, SW2 is again charged, and the signal PI* takes again "0" in the manner described above. These operations are repeated so that the control of the write/erase enable or disable state can be automatically conducted.

In this embodiment, the time periods $t_{pco}$, $t_{pg1}$, $t_{pc1}$, $t_{pg2}$, . . . are automatically set by detecting the voltages 15 V and 12 V. The time periods may be set to constant values by using internal timers.

Figure 44:
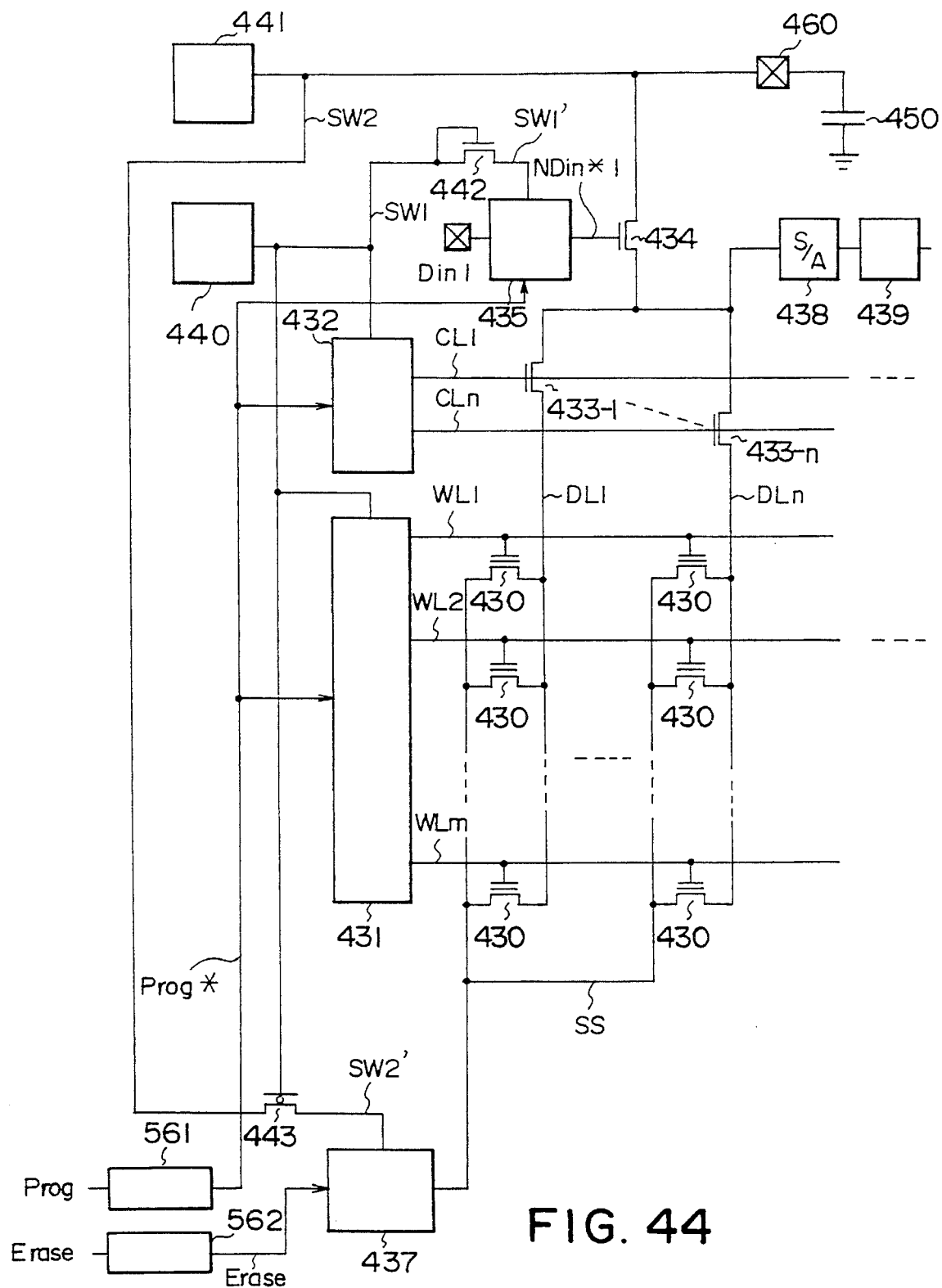
FIG. 44 is a circuit diagram of another embodiment of the present invention, wherein the write and erase operations are controlled with respect to time.

FIG. 44 is a circuit diagram of an embodiment wherein the write and erase times are controlled by internal timers. In this embodiment, there are provided a write timer 561 which receives the write signal Prog and an erase timer 562 which receives the erase signal Erase. An output Prog* of the write timer 561 is supplied to the write data control circuit 435, row decoder 432 and column decoder 431, and an output Erase* of the erase timer 562 is supplied to the source voltage control circuit 437.

The operation of the circuit of this embodiment will be described below. When the write signal Prog becomes "1", the output Prog* of the write timer becames "1" which sets the write data control circuit, row decoder and column decoder to a write enable state and starts the write operation. This timer then starts counting, and after the set time, e.g., 10 μs, the count operation stops and the signal Prog* takes "0", entering the write disable state. In the erase operation, the erase timer 562 operates in a similar manner.

If such time information is to be informed to an external CPU or the like, the signals Prog* and Erase* are outputted to the external circuit of the chip.

In this embodiment, the internal timers are provided within the chip circuit. Such times may be set under the control of an external system. In this case, however, the set times are required to have some margin because the charge/discharge time of the capacitor 450 changes with a variation of the memory cell write current, charge pump circuit performance and the like.

In the above-described embodiments, the charge pump circuits 440 and 441 are separately provided. Instead, they may be combined to reduce the chip area.

Also in the above embodiments, EEPROMs capable of electrically altering data have been described. The present invention may be applied to EPROMs capable of writing data in the similar manner and erasing data through ultraviolet may radiation.

Still further, in the above embodiments the erase operation is carried out in a flash manner by using the common source (SS) of all memory cells. Instead, memory cells may be divided into a plurality of groups each having a common source (SS1, SS2, . . . ) to erase data in units of a block.

We claim:

1. A semiconductor memory device having a memory cell array which includes a plurality of memory cells arranged into a matrix pattern on a main chip, data being written in, read from, and erased from at least one selected memory cell formed of a transistor, data respectively being written in and erased from the at least one memory cell on the basis of a write voltage and an erase voltage obtained by boosting an internal supply voltage, the semiconductor memory device comprising:

a plurality of write circuits each for applying a write voltage to the at least one selected memory cell to write data therein;

an erase circuit for applying an erase voltage to the at least one selected memory cell to erase data therefrom;

a boost circuit for boosting the internal supply voltage to generate the write voltage and the erase voltage and outputting the generated write and erase voltage through a boosted voltage output terminal;

an on-chip pad terminal for outputting an output of said boost circuit;

an outer terminal electrically connected to the on-chip pad terminal, and configured to connect an external circuit element thereto; and a capacitor externally connected to said outer terminal, and configured to receive an electric charge from said boost circuit, data being written in and erased from the at least one selected memory cell by discharging the electric charge of said capacitor.

2. The semiconductor memory device of claim 1, wherein said external terminal is an external lead terminal projecting from a package, and said capacitor being connected externally to the package.

3. The semiconductor memory device of claim 1, wherein said capacitor is formed on or in a capacitor chip different from the main chip, the capacitor chip and the main chip being both assembled together within the package.

4. The semiconductor memory device of claim 3, wherein said on-chip pad terminal formed on the main chip is connected to said capacitor formed on the capacitor chip through a bonding wire.

5. The semiconductor memory device of claim 3, wherein said capacitor is formed by stacking a plurality of insulating films and a plurality of poly silicon layers alternately.

6. The semiconductor memory device of claim 3, wherein said capacitor includes a plurality of trenches formed in a semiconductor substrate and filled with an insulating substance.

7. The semiconductor memory device of claim 1, further comprising a write-enable and erase-enable status discriminate circuit for discriminating whether data can be written in or erased from the at least one selected memory cell and outputting a discriminate signal indicative thereof, data being written in or erased from the at least one selected memory cell on the basis of the discriminate signal.

8. The semiconductor memory device of claim 2, further comprising a write-enable and erase-enable status discriminate circuit for discriminating whether data can be written in or erased from the at least one selected memory cell and outputting a discriminate signal indicative thereof, data being written in or erased from the at least one selected memory cell on the basis of the discriminate signal.

9. The semiconductor memory device of claim 3, further comprising a write-enable and erase-enable status discriminate circuit for discriminating whether data can be written in or erased from the at least one selected memory cell and outputting a discriminate signal indicative thereof, data being written in or erased from the at least one selected memory cell on the basis of the discriminate signal.

10. The semiconductor memory device of claim 1, further comprising:

a write timer responsive to a write start signal, for setting the semiconductor memory device to a write operation status for a first constant time; and an erase timer responsive to an erase start signal, for setting the semiconductor memory device to an erase operation status for a second constant time.

11. The semiconductor memory device of claim 2, further comprising:
   a write timer responsive to a write start signal, for setting the semiconductor device to a write operation status for a first constant time; and
   an erase timer responsive to an erase start signal, for setting the semiconductor device to an erase operation status for a second constant time.

12. The semiconductor memory device of claim 3, further comprising:
   a write timer responsive to a write start signal, for setting the semiconductor device to a write operation status for a first constant time; and
   an erase timer responsive to an erase start signal, for setting the semiconductor device to an erase operation status for a second constant time.

13. The semiconductor memory device of claim 1, wherein:
   the memory cell array has a plurality of memory cell units each including a plurality of memory cells;
   each of said write circuits is provided for a corresponding one of said memory cell units;
   and wherein said semiconductor memory device further comprises a write control circuit for activating one of said write circuits in sequence, to enable a write operation through said boost circuit having a small driving capability.

14. The semiconductor memory device of claim 2, wherein:
   the memory cell array has a plurality of memory cell units each including a plurality of memory cells;
   each of said write circuits is provided for a corresponding one of said memory cell units;
   and wherein said semiconductor memory device further comprises a write control circuit for activating one of said write circuits in sequence, to enable a write operation through said boost circuit having a small driving capability.

15. The semiconductor memory device of claim 3, wherein:
   the memory cell array has a plurality of memory cell units each including a plurality of memory cells;
   each of said write circuits is provided for a corresponding one of said memory cell units;
   and wherein said semiconductor memory device further comprises a write control circuit for activating one of said write circuits in sequence, to enable a write operation through said boost circuit having a small driving capability.

16. The semiconductor memory device of claim 1, further comprising operating point control means for setting an operating point of the respective transistor in each of said memory cells so as to minimize write current flowing therethrough in a writing operation, for reduction of current consumption.

17. The semiconductor memory device of claim 2, further comprising operating point control means for setting an operating point of the respective transistor in each of said memory cells so to minimize write current flowing therethrough in a writing operation, for reduction of current consumption.

18. The semiconductor memory device of claim 3, further comprising operating point control means for setting an operating point of the respective transistor in each of said memory cells so as to minimize write current flowing therethrough in a writing operation, for reduction of current consumption.

19. A semiconductor memory device having a memory cell array which includes a plurality of memory cells arranged into a matrix pattern on a main chip, data being written in, read from, and erased from at least one selected memory cell formed of a transistor, data being respectively written in and erased from the at least one memory cell on the basis of a write voltage and an erase voltage obtained by boosting an internal supply voltage, said semiconductor memory device comprising:
   a plurality of write circuits each for applying a write voltage to a selected memory cell to write data therein;
   a boost circuit for boosting the internal supply voltage to generate the write voltage and outputting the generated write voltage through a boosted voltage output terminal;
   an on-chip pad terminal for outputting an output of said boost circuit;
   an outer terminal electrically connected to the on-chip pad terminal and configured to connect an external circuit element thereto; and
   a capacitor externally connected to said outer terminal and configured to receive an electric charge from said boost circuit, data being written in the at least one selected memory cell by discharging the electric charge of said capacitor.

20. The semiconductor memory device of claim 19, wherein said external terminal is an external lead terminal projecting from a package, and said capacitor being connected externally to the package.

21. The semiconductor memory device of claim 19, wherein said capacitor is formed on or in a capacitor chip different from the main chip, the capacitor chip and the main chip being both assembled together within the package.

22. The semiconductor memory device of claim 21, wherein said on-chip pad terminal formed on the main chip is connected to said capacitor formed on the capacitor chip through a bonding wire.

23. The semiconductor memory device of claim 21, wherein said capacitor is formed by stacking a plurality of insulating films and a plurality of poly silicon layers alternately.

24. The semiconductor memory device of claim 21, wherein said capacitor includes a plurality of trenches formed in a semiconductor substrate and filled with an insulating substance.

25. The semiconductor memory device of claim 19, further comprising a write-enable status discriminate circuit for discriminating whether data can be written in each memory cell and outputting a discriminate signal indicative thereof, data being written in each memory cell on the basis of the discriminate signal.

26. The semiconductor memory device of claim 20, further comprising a write-enable status discriminate circuit for discriminating whether data can be written in each memory cell and outputting a discriminate signal indicative thereof, data being written in each memory cell on the basis of the discriminate signal.

27. The semiconductor memory device of claim 21, further comprising a write-enable status discriminate circuit for discriminating whether data can be written each memory cell and outputting a discriminate signal indicative thereof, data being written in each memory cell on the basis of the discriminate signal.

28. The semiconductor memory device of claim 19, further comprising a write timer responsive to a write start signal, for setting the semiconductor memory device to a write operation status for a constant time.

29. The semiconductor memory device of claim 20, further comprising a write timer responsive to a write start signal, for setting the semiconductor memory device to a write operation status for a constant time.

30. The semiconductor memory device of claim 21, further comprising a write timer responsive to a write start signal, for setting the semiconductor memory device to a write operation status for a constant time.

31. The semiconductor memory device of claim 19, wherein:

the memory cell array includes a plurality of memory cell units each composed of a plurality of memory cells;

each of said write circuits is provided for a corresponding one of said memory cell units; and said write circuits further comprise a write control circuit for activating one of said write circuits in sequence, to enable a write operation through said boost circuit having a small driving capability.

32. The semiconductor memory device of claim 20, wherein:

the memory cell array includes a plurality of memory cell units each composed of a plurality of memory cells;

each of said write circuits is provided for a corresponding one of said memory cell units; and said write circuits further comprise a write control circuit for activating one of said write circuits in sequence, to enable a write operation through said boost circuit having a small driving capability.

33. The semiconductor memory device of claim 21, wherein:

the memory cell array includes a plurality of memory cell units each composed of a plurality of memory cells;

each of said write circuits is provided for a corresponding one of said memory cell units; and said write circuits further comprise a write control circuit for activating one of said write circuits in sequence, to enable a write operation through said boost circuit having a small driving capability.

34. The semiconductor memory device of claim 19, further comprising operating point control means for setting an operating point of the respective transistor in each of said memory cells so as to minimize write current flowing therethrough in a writing operation, for reduction of current consumption.

35. The semiconductor memory device of claim 20, further comprising operating point control means for setting an operating point of the respective transistor in each of said memory cells so as to minimize write current flowing therethrough in a writing operation, for reduction of current consumption.

36. The semiconductor memory device of claim 21, further comprising operating point control means for setting an operating point of the respective transistor in each of said memory cells so as to minimize write current flowing therethrough in a writing operation, for reduction of current consumption.

37. A semiconductor memory device having a memory cell array which includes a plurality of memory cells arranged into a matrix pattern on a main chip, data being written in, read from, and erased from at least one selected memory cell formed of a transistor, data being respectively written in and erased from the at least one selected memory cell on the basis of a write voltage and an erased voltage obtained by boosting an internal supply voltage, said semiconductor memory device comprising:

an erase circuit for applying an erase voltage to the at least one selected memory cell to erase data therefrom;

a boost circuit for boosting the internal supply voltage to generate the erase voltage and outputting the generated erase voltage through a boosted voltage output terminal;

an on-chip pad terminal for outputting an output of said boost circuit;

an outer terminal electrically connected to the on-chip pad terminal and configured to connect an external circuit element thereto; and a capacitor externally connected to said outer terminal and configured to receive an electric charge of said boost circuit, data being erased from the at least one selected memory cell by discharging the electric charge of said capacitor.

38. The semiconductor memory device of claim 37, wherein said outer terminal is an external lead terminal projecting from a package, and said capacitor being connected externally to the package.

39. The semiconductor memory device of claim 37, wherein said capacitor is formed on or in a capacitor chip different from the main chip, the capacitor chip and the main chip being both assembled together within the package.

40. The semiconductor memory device of claim 39, wherein said on-chip pad terminal formed on the main chip is connected to said capacitor formed on the capacitor chip through a bonding wire.

41. The semiconductor memory device of claim 39, wherein said capacitor is formed by stacking a plurality of insulating films and a plurality of poly silicon layers alternately.

42. The semiconductor memory device of claim 39, wherein said capacitor includes a plurality of trenches formed in a semiconductor substrate and filled with an insulating substance.

43. The semiconductor memory device of claim 37, further comprising an erase-enable status discriminate circuit for discriminating whether data can be erased from each memory cell and outputting a discriminate signal indicative thereof, data being erased from each memory call on the basis of the discriminate signal.

44. The semiconductor memory device of claim 38, further comprising an erase-enable status discriminate circuit for discriminating whether data can be erased from each memory cell and outputting a discriminate signal indicative thereof, data being erased from each memory cell on the basis of the discriminate signal.

45. The semiconductor memory device of claim 39, further comprising an erase-enable status discriminate circuit for discriminating whether data can be erased from each memory cell and outputting a discriminate signal indicative thereof, data being from each memory cell on the basis of the discriminate signal.

46. The semiconductor memory device of claim 37, further comprising an erase timer responsive to an erase start signal, for setting the semiconductor memory device to an erase operation status for a constant time.

47. The semiconductor memory device of claim 38, further comprising an erase timer responsive to an erase start signal, for setting the semiconductor memory device to an erase operation status for a constant time.

48. The semiconductor memory device of claim 39, further comprising an erase timer responsive to an erase start signal, for setting the semiconductor memory device to an erase operation status for a constant time.

* * * * *